US012628476B2

(12) United States Patent
Shigitani et al.

(10) Patent No.: US 12,628,476 B2
(45) Date of Patent: May 12, 2026

(54) LIGHT EMITTING DEVICE AND ELECTRONIC APPARATUS USING SAME

(71) Applicant: Panasonic Intellectual Property Management Co., Ltd., Osaka (JP)

(72) Inventors: Ryosuke Shigitani, Osaka (JP); Mitsuru Nitta, Kyoto (JP); Shozo Oshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 377 days.

(21) Appl. No.: 18/276,025

(22) PCT Filed: Feb. 14, 2022

(86) PCT No.: PCT/JP2022/005618
§ 371 (c)(1),
(2) Date: Aug. 5, 2023

(87) PCT Pub. No.: WO2022/181372
PCT Pub. Date: Sep. 1, 2022

(65) Prior Publication Data
US 2024/0304765 A1 Sep. 12, 2024

(30) Foreign Application Priority Data
Feb. 24, 2021 (JP) ................................. 2021-027328

(51) Int. Cl.
*H10H 20/851* (2025.01)
(52) U.S. Cl.
CPC .... *H10H 20/8513* (2025.01); *H10H 20/8515* (2025.01)
(58) Field of Classification Search
None
See application file for complete search history.

(56) References Cited

U.S. PATENT DOCUMENTS

2013/0229513 A1 9/2013 Ichitani et al.
2018/0358514 A1 12/2018 Tragl et al.
(Continued)

FOREIGN PATENT DOCUMENTS

CN 108630794 A 10/2018
CN 109545941 A 3/2019
(Continued)

OTHER PUBLICATIONS

International Search Report for corresponding Application No. PCT/JP2022/005618, mailed Apr. 26, 2022.
(Continued)

*Primary Examiner* — Sarah K Salerno
(74) *Attorney, Agent, or Firm* — Renner, Otto, Boisselle & Sklar, LLP

(57) ABSTRACT

Provided is a light emitting device that is characterized by at least combining a solid-state light emitting element, a first wavelength converter, and a second wavelength converter, and emits output light. The solid-state light emitting element emits primary light. The first wavelength converter absorbs at least part of the primary light and converts this part of the primary light to first wavelength-converted light. The second wavelength converter absorbs at least part of first mixed light including first transmitted primary light, which is the primary light that has passed through the first wavelength converter, and the first wavelength-converted light, and converts the light to second wavelength-converted light. The output light includes at least transmitted first wavelength-converted light, which is a light component obtained by the first wavelength-converted light having passed through the second wavelength converter, and a light component of the second wavelength-converted light.

17 Claims, 11 Drawing Sheets

(56)            References Cited

U.S. PATENT DOCUMENTS

| | | |
|---|---|---|
| 2020/0212265 A1 | 7/2020 | Bae et al. |
| 2020/0220053 A1 | 7/2020 | Schmidt et al. |
| 2020/0309348 A1 | 10/2020 | Shibata et al. |
| 2021/0249569 A1 | 8/2021 | Fukuda et al. |
| 2022/0175250 A1 | 6/2022 | Abe et al. |
| 2022/0192477 A1 | 6/2022 | Abe et al. |
| 2022/0218191 A1 | 7/2022 | Abe et al. |

FOREIGN PATENT DOCUMENTS

| | | |
|---|---|---|
| EP | 3923353 A1 | 12/2021 |
| JP | 2005-049719 A | 2/2005 |
| JP | 2016-170968 A | 9/2016 |
| JP | 2018-050164 A | 3/2018 |
| JP | 6570653 B2 | 9/2019 |
| JP | 2020-524392 A | 8/2020 |
| JP | 2020-166012 A | 10/2020 |
| JP | 2020-188044 A | 11/2020 |
| KR | 10-2020-0132059 A | 11/2020 |
| WO | 2012/067028 A1 | 5/2012 |
| WO | 2019/240150 A1 | 12/2019 |
| WO | 2020/107425 A1 | 6/2020 |
| WO | 2020/162243 A1 | 8/2020 |
| WO | 2020/217669 A1 | 10/2020 |
| WO | 2020/217670 A1 | 10/2020 |
| WO | 2020/217671 A1 | 10/2020 |

OTHER PUBLICATIONS

Written Opinion for corresponding Application No. PCT/JP2022/005618, mailed Apr. 26, 2022.
Extended European Search Report for corresponding EP Application No. 22759411.6 issued Sep. 11, 2024.

200F(200)

10

200G(200)

10

200H(200)

10

200I(200)

10

200J(200)

(a)

(b)

(c)

(a)

(b)

(c)

(a)

(b)

(c)

LIGHT EMITTING DEVICE AND ELECTRONIC APPARATUS USING SAME

TECHNICAL FIELD

The present invention relates to a light emitting device and an electronic apparatus using the light emitting device.

BACKGROUND ART

Conventionally, light emitting devices have been known which are characterized by at least combining a solid-state light emitting element and a phosphor, and emit output light having a near-infrared light component.

Patent Literature 1 discloses a light emitting device with a simple structure including a wavelength converter having a phosphor which takes $Cr^{3+}$ and/or $Ni^{2+}$ as a light emission center, and a semiconductor chip that emits excitation light. Near-infrared light is generated by subjecting blue or red light emitted by the semiconductor chip of the light emitting device to wavelength conversion by means of a wavelength converter.

The light emitting device disclosed in Patent Literature 1 is mainly related to an optoelectronic element to replace conventional light sources for applications in compact and portable analyzers and spectrometers, sensor applications in industrial machinery, smartphones, endoscopes, and the like. As conventional light sources, halogen lamps, infrared lasers, infrared LEDs, and the like are known. In the example of Patent Literature 1, it is disclosed that the near-infrared light output of the light emitting device (the optoelectronic element) is less than 50 mW.

Patent Literature 2 discloses a light emitting device for industrial equipment used as an alternative to halogen lamps and the like, for example. This light emitting device is characterized by combining a light emitting element that emits light with a maximum intensity in an ultraviolet to blue wavelength region of 480 nm or less with a phosphor that at least includes a phosphor that converts light to near-infrared light, and accordingly light having a near-infrared light component with a wide fluorescence spectrum half width is obtained. The example in Patent Literature 2 discloses that the near-infrared light output of the light emitting device using an LED chip that emits 600-mW ultraviolet light exceeds 10 mW.

CITATION LIST

Patent Literature

Patent Literature 1: Japanese Patent No. 6570653
Patent Literature 2: International Publication No. WO 2019/240150

SUMMARY OF INVENTION

Conventional light emitting devices that are characterized by at least combining a solid-state light emitting element and a phosphor and emit both near-infrared and visible light components simultaneously have a problem in that it is difficult to achieve both high output and a large area. This is because the primary light emitted by the solid-state light emitting element is used to directly irradiate a wavelength converter that emits a near-infrared light-emitting component, making it particularly difficult to achieve an increase in the area and output of the near-infrared light component.

Specifically, the primary light emitted by the solid-state light emitting element usually has directivity, and therefore, in the conventional light emitting devices described above, the primary light having directivity is used exclusively to irradiate the irradiated surface of the wavelength converter locally. Therefore, the area of the irradiated surface irradiated with the strong primary light becomes smaller, and in-plane variation is likely to occur in the intensity of the primary light with which the irradiated surface is irradiated. The portion irradiated with the strong light tends to generate heat due to Stokes loss associated with the wavelength conversion of the phosphor included in the wavelength converter. Since this heat generation induces thermal quenching of the phosphor, if the primary light has high directivity, this leads to a local decrease in the wavelength conversion efficiency of the wavelength converter, and the average wavelength conversion efficiency thereof is likely to decrease. In addition, Stokes loss increases as the wavelength difference between the wavelength at which light absorption is performed by the wavelength converter and the wavelength at which fluorescence emission is performed by the wavelength converter increases. Therefore, under the condition that the primary light is the same, a phosphor which converts primary light to near-infrared light generates more heat than a phosphor which converts primary light to visible light, and the decrease in efficiency due to thermal quenching is easily induced.

In addition, primary light having high directivity enters the wavelength converter obliquely as the distance increases from the irradiation center of the irradiated surface of the wavelength converter. Therefore, if primary light having high directivity is used, the penetration depth of the primary light into the wavelength converter or the optical path length of light that passes through the wavelength converter becomes longer, resulting in a distribution angle dependence in which the color tone of the output light becomes inhomogeneous.

The present invention has been devised to solve such problems. An object of the present invention is to provide a light emitting device that emits both near-infrared and visible light components, is suitable for industrial applications where consideration can be given to visibility according to the human eye, and achieves both the high output of near-infrared light components and a large area of a light output surface, and to also provide an electronic apparatus using the light emitting device.

Specifically, an object of the present invention is to provide a light emitting device that achieves both the homogeneous high output of near-infrared light components and an increase in the area of a light output surface, emits both near-infrared and visible light components, and is suitable for industrial applications. Further, an object of the present invention is to provide various electronic apparatus using this light emitting device, such as an inspection device, a detection device, a monitoring device, a sorting device, an analysis device, a measurement device, and an evaluation device.

In order to solve the above problems, a light emitting device according to an aspect of the present invention is a light emitting device that is characterized by at least combining a solid-state light emitting element, a first wavelength converter including a first phosphor, and a second wavelength converter including a second phosphor, and that emits output light, in which the solid-state light emitting element emits primary light, the first wavelength converter absorbs at least part of the primary light and converts this part of the primary light to first wavelength-converted light having a fluorescence peak in a visible wavelength range of 380 nm or more and less than 780 nm, the second wavelength converter absorbs at least part of first mixed light including first transmitted primary light, which is the primary light that has passed through the first wavelength converter, and the first wavelength-converted light, and converts the first mixed light to second wavelength-converted light having a fluorescence peak in a wavelength range of more than 700 nm and having a near-infrared component in a wavelength range of 780 nm or more and less than 2500 nm, the first mixed light is light of a light color with a correlated color temperature of 2500 K or more and less than 40,000 K, and the output light includes at least transmitted first wavelength-converted light, which is a light component obtained by the first wavelength-converted light having passed through the second wavelength converter, and a light component of the second wavelength-converted light.

The electronic apparatus according to an aspect of the present invention includes the above-described light emitting device.

DESCRIPTION OF EMBODIMENTS

Figures 1, 2:
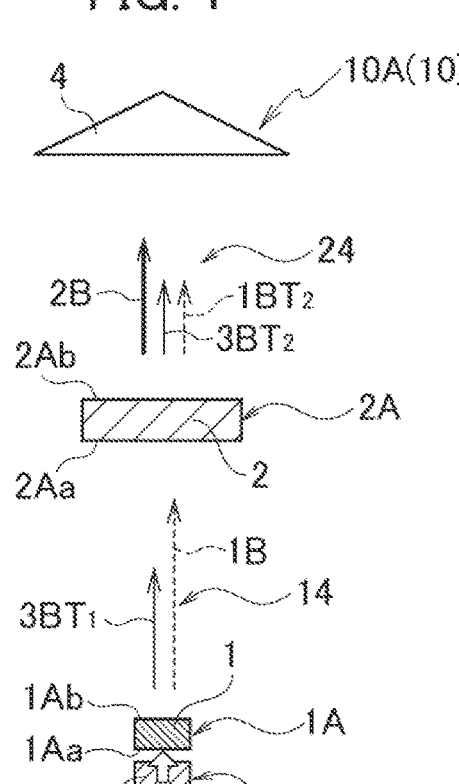
FIG. 1 is a schematic diagram showing a configuration of a light emitting device according to a first embodiment.
FIG. 2 is a schematic diagram showing a configuration of a light emitting device according to a second embodiment.

Referring to the drawings, a description will be given below of a light emitting device according to embodiments herein and an electronic apparatus using the light emitting device. Specifically, the electronic apparatus in the case where the electronic apparatus is an inspection device, a medical device, or the like will be described. Note that dimensional ratios in the drawings are exaggerated for convenience of the explanation, and are sometimes different from actual ratios.

<Light Emitting Device>
(Summary of Configuration of Light Emitting Device)

Figures 3, 4:
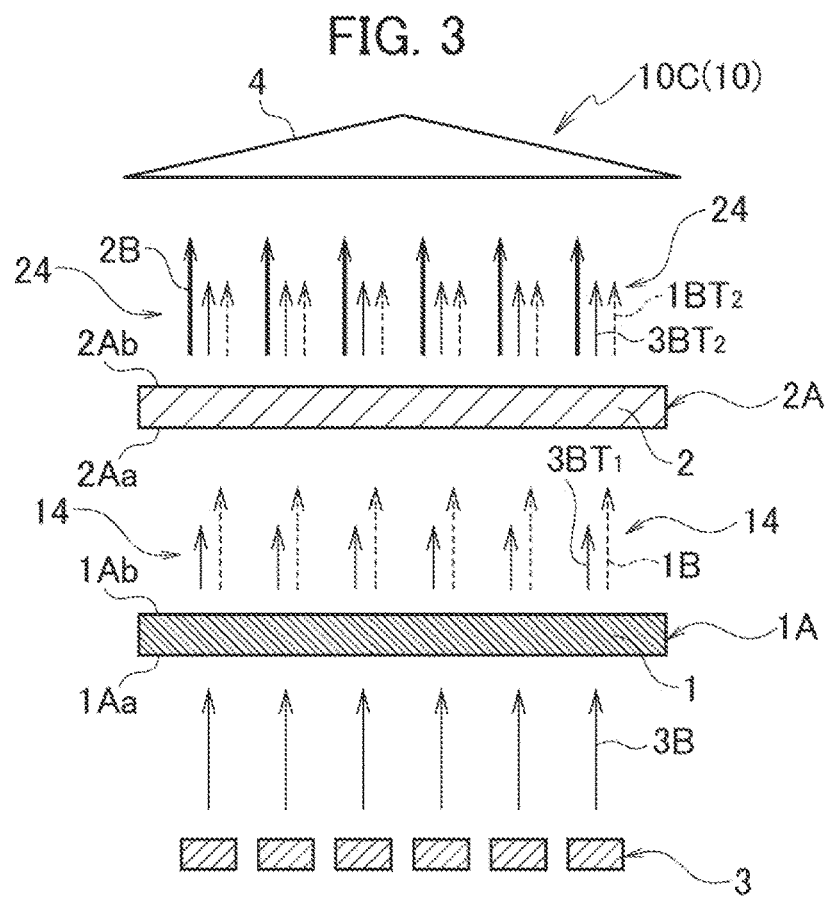
FIG. 3 is a schematic diagram showing a configuration of a light emitting device according to a third embodiment.
FIG. 4 is an example of a spectral distribution of output light emitted by a light emitting device according to a present embodiment.

First, a light emitting device will be described. FIGS. 1 to 3 are schematic diagrams showing configurations of light emitting devices according to first to third embodiments. In the schematic diagrams of FIGS. 1 to 3, the illustration of power sources used for the light emitting devices is omitted.

FIG. 1 is a schematic diagram showing the configuration of a light emitting device according to the first embodiment. A light emitting device 10A (10) according to the first embodiment shown in FIG. 1 includes a solid-state light emitting element 3, a first wavelength converter 1A, and a second wavelength converter 2A. More specifically, the light emitting device 10A according to the first embodiment has a simple configuration in which one solid-state light emitting element 3, one first wavelength converter 1A, and one second wavelength converter 2A are used. The combined structure of the solid-state light emitting element 3 and the first wavelength converter 1A is also referred to as a "light emission-wavelength conversion unit". In the light emitting device 10A, there is one light emission-wavelength conversion unit.

FIG. 2 is a schematic diagram showing the configuration of a light emitting device according to the second embodiment. A light emitting device 10B (10) according to the second embodiment shown in FIG. 2 includes solid-state light emitting elements 3, first wavelength converters 1A, and a second wavelength converter 2A. Specifically, the light emitting device 10B according to the second embodiment has a plurality of light emission-wavelength conversion units that are combined structures of the solid-state light emitting elements 3 and the first wavelength converters 1A.

FIG. 3 is a schematic diagram showing the configuration of a light emitting device according to the third embodiment. A light emitting device 10C (10) according to the third embodiment shown in FIG. 3 includes solid-state light emitting elements 3, a first wavelength converter 1A, and a second wavelength converter 2A. Specifically, the light emitting device 10C according to the third embodiment is an example of a light emitting device having a configuration in which only solid-state light emitting elements 3 are used in plurality. In the light emitting device 10C, the plurality of solid-state light emitting elements 3 are arranged in alignment such that the distance between each solid-state light emitting element 3 and the first wavelength converter 1A is constant. Further, in the light emitting device 10C, the plurality of solid-state light emitting elements 3 are separated from the first wavelength converter 1A.

First Embodiment

The light emitting device 10A according to the first embodiment will be described below.

The light emitting device 10A is characterized by at least combining the solid-state light emitting element 3, the first wavelength converter 1A including a first phosphor 1, and the second wavelength converter 2A including a second phosphor 2, and emits output light 4.

In the light emitting device 10A, the first wavelength converter 1A is interposed between the solid-state light emitting element 3 and the second wavelength converter 2A. Therefore, in the light emitting device 10A, primary light 3B emitted by the solid-state light emitting element 3 first passes through the first wavelength converter 1A, and thereafter is used to irradiate the second wavelength converter 2A. That is, in the light emitting device 10A, the primary light 3B emitted by the solid-state light emitting element 3 is not used to irradiate the second wavelength converter 2A without passing through the first wavelength converter 1A.

Hereinafter, "light in which the primary light 3B emitted by the solid-state light emitting element 3 has passed through the first wavelength converter 1A" is also referred to as "first transmitted primary light $3BT_1$". Here, "light that has passed through the first wavelength converter 1A" means "light in which the primary light 3B that has been introduced from one end of the first wavelength converter 1A is output from the other end of the first wavelength converter 1A regardless of reflection or the like in the first wavelength converter 1A". For example, "light in which the primary light 3B introduced from one end of the first wavelength converter 1A is not reflected by the first phosphor 1 in the first wavelength converter 1A but passes therethrough, and is output from the other end of the first wavelength converter 1A" is the first transmitted primary light $3BT_1$. Further, "light in which the primary light 3B introduced from one end of the first wavelength converter 1A is reflected by the first phosphor 1 in the first wavelength converter 1A and then output from the other end of the first wavelength converter 1A" is also the first transmitted primary light $3BT_1$. The first transmitted primary light $3BT_1$ has a spectral distribution derived from the primary light 3B and a lower light intensity than the primary light 3B.

The solid-state light emitting element 3 emits the primary light 3B. Further, the first wavelength converter 1A absorbs at least part of the primary light 3B and converts the light into first wavelength-converted light 1B with a fluorescence peak within the visible wavelength range of 380 nm or more and less than 780 nm.

The second wavelength converter 2A absorbs at least part of first mixed light 14 including the first transmitted primary light $3BT_1$ and the first wavelength-converted light 1B and converts the light into second wavelength-converted light 2B. The first mixed light 14 includes the first transmitted primary light $3BT_1$ which is the primary light 3B that has passed through the first wavelength converter 1A and the first wavelength-converted light 1B.

The first mixed light 14 is light of a light color with a correlated color temperature of 2500 K or more and less than 40,000 K, and preferably 3800 K or more and less than 20,000 K. The specific numerical values of the upper and lower limits of the correlated color temperature of the first mixed light 14 are not particularly limited as long as the values are within the above numerical value range, and the upper limit temperature can be appropriately selected from 5000 K, 7000 K, 10,000 K, 15000 K, and the like, for example.

The second wavelength-converted light 2B has a fluorescence peak in the wavelength region exceeding 700 nm and a near-infrared component within the wavelength region of 780 nm or more and less than 2500 nm. The second wavelength-converted light 2B preferably has a fluorescence peak in the wavelength region exceeding 750 nm. The second wavelength-converted light 2B preferably has a near-infrared component within the wavelength region of 780 nm or more and less than 1000 nm.

The output light 4 has at least light components of the first wavelength-converted light 1B and the second wavelength-converted light 2B.

Due to the light emitting device 10A having this kind of configuration, the second wavelength converter 2A is not directly irradiated with the primary light 3B emitted by the solid-state light emitting element 3.

The first mixed light 14 with which the second wavelength converter 2A is irradiated includes the first transmitted primary light $3BT_1$ and the first wavelength-converted light 1B. The first wavelength-converted light 1B has a lower energy than the primary light 3B, which is converted to light of a longer wavelength by the first wavelength converter 1A. In addition, the first transmitted primary light $3BT_1$ has an intensity which is weakened due to reduction of the number of photons by the wavelength conversion performed by the first wavelength converter 1A, and has a lower intensity than the primary light 3B, which is optically diffused by the first wavelength converter 1A. The spectral distribution of the first transmitted primary light $3BT_1$ is derived from the spectral distribution of the primary light 3B.

The second wavelength converter 2A is irradiated with the first mixed light 14, which is composed of scattered photons and has a relatively reduced intensity. The first mixed light 14 usually has a larger irradiation area than the primary light 3B emitted by the solid-state light emitting element 3. This can suppress the local heat generation (due to Stokes loss) caused by the wavelength conversion of the input light in the second wavelength converter 2A.

In the second wavelength converter 2A, the second phosphor 2 is not directly excited by the primary light 3B, which causes a relatively large Stokes loss, or by the primary light 3B, which has a high light energy density. In addition, in the second wavelength converter 2A, excitation of only part of the second phosphor 2 in the second wavelength converter 2A is suppressed, as in the case of excitation of the phosphor by the primary light 3B having directivity. Therefore, in the light emitting device 10A, photons are equally and homogeneously irradiated and absorbed across the whole of the second wavelength converter 2A, and the light output surface tends to become large. This makes it easy to enlarge an irradiated surface to be irradiated with the output light 4.

In the light emitting device 10A, the photons are easily irradiated and absorbed equally and homogeneously across the whole of the second wavelength converter 2A, and therefore it is possible to suppress the local temperature rise caused by the heat generated by the wavelength conversion of the second wavelength converter 2A. In addition, since the photons are easily irradiated and absorbed equally and homogeneously across the whole of the second wavelength converter 2A, it is possible to increase the light output surface and also increase the area of the irradiated surface. Therefore, the light emitting device 10A suppresses the thermal quenching of the second phosphor 2 included in the second wavelength converter 2A, and can output visible light and near-infrared light suitable for increasing the output of the light component of the near-infrared light and increasing the area of the light output surface thereof.

In the light emitting device 10A, the solid-state light emitting element 3 and the first wavelength converter 1A are separated. However, as a modification of the light emitting device 10A, an integrated wavelength-conversion light emitting element formed by combining the solid-state light emitting element 3 and the first wavelength converter 1A can be used instead of the solid-state light emitting element 3 and the first wavelength converter 1A. That is, the solid-state light emitting element 3 and the first wavelength converter 1A can be combined to form the wavelength-conversion light emitting element.

A wavelength-conversion light emitting element can be easily manufactured using white LED technology. In addition, it is also possible to easily manufacture a wavelength-conversion light emitting element that emits light of a light color with a correlated color temperature of 2500 K or more and less than 40,000 K by using white LED technology. In the case of a wavelength-conversion light emitting element that emits light of a light color with a correlated color temperature of 2600 K or more and less than 12000 K, as a white LED, there are many products on the market with various specifications and forms, and these are easily available, for example. For this reason, if a light emitting device using a wavelength-conversion light emitting element is used, it is possible to speedily respond to customer requests with the process from design to product development and industrial production being performed with a small number of man-hours.

Each configuration of the light emitting device 10A will be described in detail below.

(Solid-State Light Emitting Element 3)

The solid-state light emitting element 3 is a member that emits the primary light 3B. As the solid-state light emitting element 3, a solid-state light emitting element such as a light emitting diode or a laser diode can be used, for example. However, the solid-state light emitting element 3 is not limited to the above, and any solid-state light emitting element can be used as long as the element can emit the primary light 3B.

If an LED module that emits light with a high watt energy of 1 W or more or a laser diode is used as the solid-state light emitting element 3, it is possible to obtain a light emitting device 10A that can be expected to have a light output including a near-infrared light component of a several hundred mW class, for example. If an LED module that emits light with a high watt energy of 3 W or more or 10 W or more is used as the solid-state light emitting element 3, it is possible to obtain a light emitting device 10A that can be expected to have a light output of a several W class, for example. If an LED module that emits light with a high watt energy of 30 W or more is used, it is possible to obtain a light emitting device 10A that can be expected to have a light output of more than 10 W. If an LED module that emits light with a high watt energy of 100 W or more is used, it is possible to obtain a light emitting device 10A that can be expected to have a light output of more than 30 W.

If a laser diode is used as the solid-state light emitting element 3, the primary light 3B is laser light, and this results in a specification in which the first wavelength converter 1A is irradiated with high-density spot light. Therefore, the light emitting device 10A, which uses a laser diode as the solid-state light emitting element 3, can be used as a high-output point light source, and it therefore becomes possible to expand the range of industrial uses of solid-state lighting.

Further, as a modification of the light emitting device 10A, a light guide member such as an optical fiber can be interposed between the solid-state light emitting element 3 and the first wavelength converter 1A. According to this modification, it is possible to obtain a light emitting device 10 in which the solid-state light emitting element 3 and the first wavelength converter 1A are spatially separated, a light emitting part of the light emitting device is light-weight and can be moved freely, and an irradiated location can be easily changed freely.

As this kind of laser diode, for example, it is possible to use an edge emitting laser (EEL), a vertical cavity surface emitting laser (VCSEL), or the like.

The light energy density of the primary light 3B radiated by the solid-state light emitting element 3 is preferably more than 0.3 W/mm$^2$ and more preferably more than 1.0 W/mm$^2$. If the light energy density of the primary light 3B is within the above range, the light emitting device can be made to emit relatively strong output light 4 even if a diffusion plate or the like (not shown) is interposed between the solid-state light emitting element 3 and the first wavelength converter 1A as a modification of the light emitting device 10A, for example.

The upper limit of the light energy density of the primary light 3B emitted by the solid-state light emitting element 3 is not particularly limited but can be 30 W/mm$^2$, for example.

The number of solid-state light emitting elements 3 forming the light emitting device 10A is preferably more than one. If the light emitting device 10A has a plurality of solid-state light emitting elements 3, it is easy to increase the output of the primary light 3B, and therefore a light emitting device suitable for increasing the output can be obtained. The number of solid-state light emitting elements 3 is not particularly limited. In accordance with the application, the number of elements can be selected appropriately from 2×2, 3×3, 5×5, 8×8, and 10×10 which have the same number on the vertical and horizontal sides, or 2×3, 3×5, and 3×10 which have different numbers on the vertical and horizontal sides.

In the light emitting device 10A, the solid-state light emitting element 3 is preferably a surface emitting type of surface emitting light source because variations in intensity distribution and unevenness in color tone of the primary light 3B with which the first wavelength converter 1A is irradiated are suppressed and uneven intensity distribution of the output light can be suppressed.

The solid-state light emitting element 3 can be used by combining a plurality of types of solid-state light emitting elements. In addition, the solid-state light emitting element 3 can be used by combining a plurality of types of solid-state light emitting elements that emit the primary light 3B with different color tones. When a plurality of types of solid-state light emitting elements that emit the primary light 3B with different color tones are used in combination, the first wavelength converter 1A can absorb at least part of the primary light 3B emitted by at least one type of solid-state light emitting element 3 and convert the light to the first wavelength-converted light 1B.

(Primary Light)

The primary light 3B is emitted by the solid-state light emitting element 3. The primary light 3B may be light of a wavelength in which the first wavelength converter 1A can absorb part of the primary light and convert the light into the first wavelength-converted light 1B having a fluorescence peak within the visible wavelength range of 380 nm or more and less than 780 nm. The primary light 3B may have a maximum intensity within the wavelength range of ultraviolet or visible light. Examples of the wavelength range of ultraviolet or visible light include a wavelength of 350 nm or more and less than 750 nm.

As the primary light 3B, long-wavelength ultraviolet light of 315 nm or more and less than 400 nm (UV-A) is used, for example. As the primary light 3B, purple or blue light of 380 nm or more and less than 495 nm is used, for example. As the primary light 3B, green or yellow light of 495 nm or more and less than 590 nm is used, for example. As the primary light 3B, orange or red light of 590 nm or more and less than 750 nm is used, for example.

The primary light 3B has a maximum intensity within a wavelength range of preferably 435 nm or more and less than 560 nm and more preferably 440 nm or more and less than 480 nm. When this light is used as the primary light 3B, an orthodox blue LED or a white LED with blue LED specifications can be used, which facilitates speedy commercial development and industrial production of the light emitting device 10A.

The primary light 3B is preferable because if photons forming the primary light are supplied from a plurality of solid-state light emitting elements, a larger number of photons can be supplied to the first wavelength converter 1A in proportion to the number of solid-state light emitting elements 3, and the output of the output light 4 can be increased.

(First Wavelength Converter 1A)

The first wavelength converter 1A is a member having the first phosphor 1.

As the first wavelength converter 1A, the following can be used, for example: a wavelength converter in which the first phosphor 1 is sealed with a resin such as silicone, an all-inorganic wavelength converter in which the first phosphor 1 is sealed with a low-melting-point glass or the like, and an all-inorganic wavelength converter in which the first phosphor 1 is bound with a binder. In addition, as the first wavelength converter 1A, a wavelength converter formed of a sintered body of an inorganic material obtained by sintering the first phosphor 1 is used, for example. As the wavelength converter formed of the sintered body of the inorganic material, a wavelength converter formed from a fluorescent ceramic is used.

The first wavelength converter 1A can be a wavelength converter of a composite form as appropriate, and can be used as a wavelength converter having a structure in which the above wavelength converters are stacked, for example.

A resin-sealed wavelength converter can be relatively easily manufactured using a powder phosphor, and is therefore advantageous in terms of providing a relatively inexpensive light emitting device. Meanwhile, an all-inorganic wavelength converter has excellent thermal conductivity and facilitates heat dissipation design, and therefore a temperature rise of the wavelength converter is suppressed and high wattage output can be achieved by suppressing the thermal quenching of the phosphor.

The thickness or the like of the first wavelength converter 1A is not particularly limited, but as an example, the maximum thickness is 100 μm or more and less than 5 mm and preferably 200 μm or more and less than 1 mm.

The first wavelength converter 1A is preferably arranged to cover the entire light output surface of the solid-state light emitting element 3, and more preferably is arranged to cover the entire light output surface of the surface emitting light source. When the first wavelength converter 1A is arranged in this way, the first wavelength converter 1A is efficiently irradiated with the primary light 3B, and therefore it is possible to obtain a high-efficiency light emitting device 10A with high conversion efficiency of the primary light 3B to the first wavelength-converted light 1B.

The first wavelength converter 1A can be made translucent. When the first wavelength converter 1A is translucent, a light component generated by means of wavelength conversion inside the wavelength converter can pass through the first wavelength converter 1A and be emitted. Therefore, when the first wavelength converter 1A is translucent, it is possible to obtain a light emitting device 10A suitable for outputting the light component.

(First Phosphor 1)

The first phosphor 1 is included in the first wavelength converter 1A. The first phosphor 1 absorbs at least part of the primary light 3B emitted by the solid-state light emitting element 3 and converts the light into the first wavelength-converted light 1B. As the first phosphor 1, it is possible to use various inorganic phosphors (hereinafter, an "inorganic phosphor" is simply referred to as a "phosphor") known as being for solid-state illumination light sources.

According to the light emitting device 10A using, as the first phosphor 1, a phosphor that emits blue wavelength-converted light showing the maximum fluorescence intensity within a wavelength range of 435 nm or more and less than 500 nm, output light 4 having a blue light component can be obtained. According to the light emitting device 10A using, as the first phosphor 1, a phosphor that emits blue-green or green wavelength-converted light showing the maximum fluorescence intensity within a wavelength range of 470 nm or more and less than 530 nm, output light 4 having a blue-green light component can be obtained.

According to the light emitting device 10A using, as the first phosphor 1, a phosphor that emits green or yellow-green wavelength-converted light showing the maximum fluorescence intensity within a wavelength range of 500 nm or more and less than 560 nm, output light 4 having a green light component can be obtained. According to the light emitting device 10A using, as the first phosphor 1, a phosphor that emits yellow or orange wavelength-converted light showing the maximum fluorescence intensity within a wavelength range of 560 nm or more and less than 600 nm, output light 4 having a yellow light component can be obtained.

According to the light emitting device 10A using, as the first phosphor 1, a phosphor that emits wavelength-converted light showing the maximum fluorescence intensity within a red or deep red wavelength range of 600 nm or more and less than 700 nm, and preferably 610 nm or more and less than 660 nm, output light 4 having a red light component is obtained.

These light emitting devices 10A can be characterized by using the solid-state light emitting element 3 that emits the primary light 3B showing the maximum intensity within a wavelength range that is less than the wavelength where the first phosphor 1 shows the maximum fluorescence intensity.

According to the light emitting device 10A using a phosphor that emits wavelength-converted light having a blue-green light component with high visual sensitivity in scotopic vision, it is possible to obtain a light emitting device 10A that emits output light 4 that is easily visible in darkness or dim conditions. According to the light emitting device 10A using a phosphor that emits wavelength-converted light having a green light component with high visual sensitivity in photopic vision, it is possible to obtain a light emitting device 10A that emits output light 4 that is easily visible in bright places.

If a phosphor that emits wavelength-converted light having a yellow light component is used as the first phosphor 1, it is possible to obtain a light emitting device 10A that is suitable for enhancing the efficiency of the output light of a light emitting device used in a work environment that uses a resin that is easily exposed to ultraviolet or blue light, for example. If a phosphor that emits wavelength-converted light having a red light component is used as the first phosphor 1, it is possible to obtain a light emitting device 10A that is suitable for lighting design that enhances the appearance of foods such as red meat, tuna, and apples, and human skin with a skin color.

As the first phosphor 1, it is possible to use a phosphor which is activated by rare earth ions, transition metal ions, or the like and emits visible fluorescence. As the first phosphor 1, specifically, it is possible to use oxides, sulfides, nitrides, halides, oxysulfides, oxynitrides, acid halides, or the like including rare earth ions, transition metal ions, or the like as fluorescent ions (light emission center). As the rare earth ions, at least one of $Ce^{3+}$ or $Eu^{2+}$ is used, for example. As the transition metal ions, $Mn^{4+}$ is used, for example.

More specifically, as the first phosphor 1, the following are used: halophosphates, phosphates, halosilicates, silicates, aluminates, aluminosilicates, borates, germanates, silicate nitrides, aluminosilicate nitrides, silicate oxynitrides, and aluminosilicate oxynitrides. As the first phosphor 1, one suitable for lighting design may be selected from the above substances as appropriate.

From the viewpoint of suppressing the Stokes loss of absorbed light caused by the wavelength conversion by the second wavelength converter 2A, the first wavelength converter 1A preferably includes the first phosphor 1 that emits wavelength-converted light exhibiting the maximum fluorescence intensity within a range of wavelengths that are as long as possible. In this case, the first wavelength converter preferably includes a red phosphor that emits light with a fluorescence peak in the red wavelength range of 600 nm or more and less than 660 nm.

With such a configuration, the second phosphor 2 included in the second wavelength converter 2A can be excited using red light of which the wavelength is close to the near-infrared wavelength range emitted by the first wavelength converter 1A. According to the light emitting device 10A in which the first wavelength converter includes the red phosphor described above, the Stokes loss caused by the wavelength conversion of the second wavelength converter 2A can be further reduced, the heat generation caused by the wavelength conversion can be suppressed, and the thermal quenching of the second phosphor 2 can be suppressed. Therefore, according to the light emitting device 10A in which the first wavelength converter includes the red phosphor described above, it is possible to increase the near-infrared light output.

The red phosphor is preferably a complex nitride phosphor or complex oxynitride phosphor activated with $Eu^{2+}$ (hereinafter referred to as an "$Eu^{2+}$ activated nitride-based phosphor"). As the $Eu^{2+}$ activated nitride-based phosphor, the following are used: phosphors of alkaline earth metal silicate nitride, alkaline earth metal aluminosilicate nitride, alkaline earth metal silicate oxynitride, and alkaline earth metal aluminosilicate oxynitride. Specifically, as the $Eu^{2+}$ activated nitride-based phosphor, a red phosphor consisting mainly of $MAlSiN_3:Eu^{2+}$, $MAlSi_4N_7:Eu^{2+}$, and $M_2Si_5N_7$: $Eu^{2+}$ (in which M is at least one element selected from Ca, Sr, and Ba) is used. Further, as the $Eu^{2+}$ activated nitride-based phosphor, an $Eu^{2+}$ activated nitride-based phosphor with a modified composition in which a part of the combination of $Si^{4+}$—$N^{3+}$ of $MAlSiN_3:Eu^{2+}$, $MAlSH_4N_7:Eu^{2+}$, and $M_2Si_5N_8:Eu^{2+}$ is replaced with $Al^{3+}$—$O^{2-}$.

Many of the $Eu^{2+}$ activated nitride-based phosphors have the property of absorbing light components across a wide wavelength range from blue to green to yellow to orange and converting them into red light, and therefore, a solid-state light emitting element that emits not only blue light but also green and yellow light can be used as the solid-state light emitting element 3. According to the light emitting device 10A using such a solid-state light emitting element, it is easy to adopt a form that reduces the Stokes loss in the final wavelength conversion to near-infrared light, and it is possible to increase the efficiency of the output light 4.

If a solid-state light emitting element that emits blue light is used as the solid-state light emitting element, it is possible to obtain a light emitting device 10A that is suitable for obtaining output light 4 with high color rendering properties having at least two types of light components, which are blue and red components, making up the three primary colors of light (blue, green, and red).

From the viewpoint of suppressing the fluorescence output saturation of the first wavelength converter 1A and supplying more photons to the second wavelength converter 2A, it is preferable that the first wavelength converter 1A include the first phosphor 1 with as short an afterglow as possible.

When the first phosphor 1 with a short afterglow is used, it is preferable that only the phosphor activated with $Ce^{3+}$ be used as the first phosphor 1.

$Ce^{3+}$ causes instantaneous light absorption and fluorescence emission due to exhibiting the light absorption and fluorescence emission based on the parity-allowed spin-allowed electron energy transition. Therefore, it is difficult to saturate the fluorescence output even under the irradiation conditions of high-density excitation light such as laser light. The fluorescence output saturation refers to the phenomenon where the fluorescence output is saturated with the increase in the intensity of the excitation light energy. Therefore, when only the phosphor activated by $Ce^{3+}$ is used as the first phosphor 1, the intensity can be increased by increasing the number of photons of the primary light 3B with which the first wavelength converter 1A is directly irradiated, and it becomes easy to increase the number of photons supplied from the solid-state light emitting element 3. Therefore, according to the light emitting device 10A using only the phosphor activated by $Ce^{3+}$ as the first phosphor 1, it becomes easy to increase the number of photons to be output, and it becomes possible to increase the output of near-infrared light and visible light.

As the phosphor activated by $Ce^{3+}$, a composite oxide phosphor (hereinafter the phosphor is referred to as a "$Ce^{3+}$ activated garnet phosphor") which is activated by $Ce^{3+}$ and has a garnet-type crystal structure is used, for example. Specifically, a rare earth aluminum garnet phosphor is used as the phosphor activated by $Ce^{3+}$. As the rare earth aluminum garnet phosphor, the following are used, for example: $Lu_3Al_2(AlO_4)_3:Ce^{3+}$, $Y_3Al_2(AlO_4)_3:Ce^{3+}$, $Lu_3Ga_2(AlO_4)_3$: $Ce^{3+}$, $Y_3Ga_2(AlO_4)_3:Ce^{3+}$, and a garnet compound or the like as a solid solution using these compounds as an end member.

The $Ce^{3+}$ activated garnet phosphor often absorbs blue light and converts the light to green light. For this reason, when $Ce^{3+}$ activated garnet phosphor is used, it is easy to use a solid-state light emitting element 3 that emits blue light as the solid-state light emitting element 3 that emits the primary light 3B. If the solid-state light emitting element 3 that emits blue light and the $Ce^{3+}$ activated garnet phosphor are used, it becomes easy to obtain output light 4 with high color rendering properties having at least two types of light components, which are blue and green components, making up the three primary colors of light (blue, green, and red).

In addition, along with the development of in-vehicle headlamp technology and high output projector technology, in recent years, there has been development in technology for ceramic conversion of a $Ce^{3+}$ activated garnet phosphor, which is suitable for increasing output and ensuring reliability. Therefore, when using a $Ce^{3+}$ activated garnet phosphor, it is relatively easy to provide the light emitting device 10A having the first wavelength converter 1A made from a fluorescent ceramic of a $Ce^{3+}$ activated garnet phosphor, which is suitable for increasing output and ensuring reliability.

Recently, a wide variety of white LED light sources are on the market, which use the combination of an LED that emits blue light and a $Ce^{3+}$ activated garnet phosphor that emits yellow-green light, and many companies are manufacturing and selling them. For this reason, it is easy to obtain a white LED light source and related technologies, and it is possible to quickly develop a light emitting device 10A using a white LED light source as a light emission-wavelength conversion unit with little effort.

(First Wavelength-Converted Light 1B)

In the light emitting device 10A, the first wavelength converter 1A absorbs at least part of the primary light 3B and converts the light to the first wavelength-converted light 1B with a fluorescence peak within the visible wavelength range of 380 nm or more and less than 780 nm.

The first wavelength-converted light 1B becomes a visible light component with a maximum intensity within the wavelength range of 435 nm or more and less than 700 nm, for example. Further, the first wavelength-converted light 1B becomes a light component with a maximum intensity within the wavelength range of 500 nm or more and less than 600 nm, and preferably 510 nm or more and less than 560 nm, for example. Still further, the first wavelength-converted light 1B becomes a light component with a maximum intensity within the wavelength range of 600 nm or more and less than 660 nm, and preferably 610 nm or more and less than 650 nm, for example. In the light emitting device 10A, the first wavelength-converted light 1B can be at least one of the above light components.

(Second Wavelength Converter 2A)

The second wavelength converter 2A is a member having the second phosphor 2.

The second wavelength converter 2A is a member that absorbs at least part of the first mixed light 14 and converts the light to the second wavelength-converted light 2B that has a fluorescence peak in the wavelength region exceeding 700 nm and a near-infrared component in the wavelength region of 780 nm or more and less than 2500 nm. The first mixed light 14 has the first transmitted primary light $3BT_1$ which is the primary light 3B that has passed through the first wavelength converter 1A and the first wavelength-converted light 1B.

As the second wavelength converter 2A, the following are used, for example: a wavelength converter in which the second phosphor 2 is sealed with a resin such as silicone, an all-inorganic wavelength converter in which the second phosphor 2 is sealed with a low-melting-point glass or the like, and an all-inorganic wavelength converter in which the second phosphor 2 is bound with a binder. In addition, as the second wavelength converter 2A, a wavelength converter formed of a sintered body of an inorganic material formed by sintering the second phosphor 2 is used, for example. As the wavelength converter formed of the sintered body of the inorganic material, a wavelength converter made from a fluorescent ceramic is used, for example.

The second wavelength converter 2A is similar to the first wavelength converter 1A except that the second phosphor 2 is used instead of the first phosphor 1. The form of the second wavelength converter 2A is similar to that of the first wavelength converter 1A, for example. For this reason, the description of the form of the second wavelength converter 2A is omitted or simplified.

The second wavelength converter 2A is preferably arranged to cover the entire first wavelength converter 1A. If the second wavelength converter 2A is arranged in this way, the second wavelength converter 2A is efficiently irradiated with the first transmitted primary light 3BT: which is the primary light 3B that has passed through the first wavelength converter 1A, and the first wavelength-converted light 1B emitted from the first wavelength converter 1A. Therefore, if the second wavelength converter 2A is arranged in this way, it is possible to obtain a high-efficiency light emitting device 10A with high conversion efficiency of the first transmitted primary light $3BT_1$ and the first wavelength-converted light 1B to the second wavelength-converted light 2B.

The second wavelength converter 2A can be made translucent. If the second wavelength converter 2A is translucent, not only the first transmitted primary light $3BT_1$ and the first wavelength-converted light 1B but also the light components generated by performing the wavelength conversion inside the wavelength converter can pass through the second wavelength converter 2A and be emitted. Therefore, if the second wavelength converter 2A is translucent, it is possible to obtain a light emitting device 10A suitable for the output of these light components.

The second wavelength converter 2A can be made to have the property of allowing at least the second wavelength-converted light 2B to pass therethrough. With such a configuration, since the second wavelength converter 2A allows the near-infrared light component of the second wavelength-converted light 2B to pass therethrough, the near-infrared light component suppresses photons from being absorbed and lost inside the wavelength converter itself. Therefore, if the second wavelength converter 2A has the property of allowing at least the second wavelength-converted light 2B to pass therethrough, it is possible to obtain a light emitting device 10A suitable for increasing the output of near-infrared light.

(Second Phosphor 2)

The second phosphor 2 is included in the second wavelength converter 2A. The second phosphor 2 absorbs at least part of the first mixed light 14, including the first transmitted primary light $3BT_1$, which is the primary light 3B that has passed through the first wavelength converter 1A, and the first wavelength-converted light 1B, and converts the light to the second wavelength-converted light 2B.

In addition, the first transmitted primary light $3BT_1$ has an intensity which is weakened due to the reduction of the number of photons by the wavelength conversion performed by the first wavelength converter 1A and has a lower intensity than the primary light 3B which is optically diffused by the first wavelength converter 1A. The spectral distribution of the first transmitted primary light $3BT_1$ is derived from the spectral distribution of the primary light 3B.

Therefore, even if the first transmitted primary light $3BT_1$ included in the first mixed light 14 is replaced with the primary light 3B, the second phosphor 2 absorbs at least part of the mixed light including the primary light 3B and the first wavelength-converted light 1B, and converts the light to the second wavelength-converted light 2B. As the second phosphor 2, various inorganic phosphors known as being for near-infrared light sources (hereinafter referred to as a "near-infrared phosphor") can be used, for example.

According to the light emitting device 10A using, as the second phosphor 2, a phosphor that emits near-infrared wavelength-converted light on the relatively short wavelength side showing the maximum fluorescence intensity within the wavelength range of 700 nm or more and less than 1700 nm, it is possible to obtain output light 4 having light components of the absorption wavelengths of various gas molecules. The absorption wavelengths of various gas molecules are, $O_2$: 760 nm, $NO_2$: 830 nm, $H_2O$: 1365 nm, $NH_3$: 1530 nm, $C_2H_2$: 1530 nm, CO: 1567 nm, $CO_2$: 1573 nm, and $CH_4$: 1651 nm, for example.

The above output light 4 can be obtained by means of the light emitting device 10A in which the first transmitted primary light $3BT_1$, the primary light 3B, or the first wavelength-converted light 1B exhibits a maximum intensity within a visible wavelength range of 380 nm or more and less than 700 nm, for example. The above output light 4 can be obtained by means of the light emitting device 10A in which the first transmitted primary light $3BT_1$, the primary light 3B, or the first wavelength-converted light 1B is blue to blue-green light that preferably exhibits a maximum intensity within a wavelength range of 440 nm or more and less than 500 nm. The above output light 4 is obtained by means of the light emitting device 10A in which the first transmitted primary light $3BT_1$, the primary light 3B, or the first wavelength-converted light 1B is green to yellow light that preferably exhibits a maximum intensity within a wavelength range of 500 nm or more and less than 580 nm. The above output light 4 is obtained by means of the light emitting device 10A in which the first transmitted primary light $3BT_1$, the primary light 3B, or the first wavelength-converted light 1B is red light that preferably exhibits a maximum intensity within a wavelength range of 600 nm or more and less than 680 nm.

If the second phosphor 2 is a phosphor that emits wavelength-converted light exhibiting a maximum fluorescence intensity within a wavelength range of less than 800 nm±100 nm, this is desirable for applications to obtain information on an irradiated object containing oxygen ($O_2$), nitrogen dioxide ($NO_2$), and components thereof by means of near-infrared spectroscopy. If the second phosphor 2 is preferably a phosphor that emits wavelength-converted light exhibiting a maximum fluorescence intensity within a wavelength range of less than 800 nm±50 nm, this is more desirable for the same reason.

If the second phosphor 2 is a phosphor that emits wavelength-converted light exhibiting a maximum fluorescence intensity within a wavelength range of less than 1350 nm±150 nm, and preferably less than 1350 nm±75 nm, this is more desirable for applications to obtain information on water ($H_2O$) and an irradiated object containing water.

The second phosphor 2 is preferably a phosphor that emits wavelength-converted light exhibiting a maximum fluorescence intensity within a wavelength range of less than 1600 nm±200 nm. Such a second phosphor 2 is desirable for applications to obtain information on an irradiated object containing ammonia ($NH_3$), hydrocarbons ($C_2H_2$, $CH_4$, and the like), carbon oxides (CO, $CO_2$, and the like), and components thereof. If the second phosphor 2 is a phosphor that preferably emits wavelength-converted light showing a maximum fluorescence intensity within a wavelength range of less than 1600 nm±100 nm, this is more desirable for the same reason.

Conversely, another preferable form different from the above is if the second phosphor 2 is a phosphor in which the maximum intensity of the light component in the wavelength range of less than 800 nm±50 nm is less than 10% of the maximum intensity in the wavelength range of 700 nm or more and less than 1700 nm in the spectral distribution. In this form, a phosphor having no light components in the wavelength range of less than 800 nm±50 nm is particularly preferable. The reason why this second phosphor 2 is preferable is because it is possible to avoid the adverse effects of light absorption by oxygen ($O_2$) or nitrogen dioxide ($NO_2$) on the irradiated object, the system, or the like.

In addition, if the second phosphor 2 is a phosphor in which the maximum intensity of the light component in the wavelength range of less than 800 nm±100 nm is less than 10% of the maximum intensity in the wavelength range of 700 nm or more and less than 1700 nm of the spectral distribution, this is more preferable for the same reason.

The second phosphor 2 is also preferably a phosphor in which the maximum intensity of the light component in the wavelength range of less than 1350 nm±75 nm is less than 10% of the maximum intensity in the wavelength range of 700 nm or more and less than 1700 nm of the spectral distribution. In this form, a phosphor having no light components in the above wavelength range, such as the wavelength range of less than 1350 nm±75 nm, is particularly preferable. The reason why this second phosphor 2 is preferable is because it is possible to avoid the adverse effects of light absorption by water ($H_2O$) on the irradiated object, the system, or the like.

In addition, if the second phosphor 2 is a phosphor in which the maximum intensity of the light component in the wavelength range of less than 1350 nm±150 nm is less than 10% of the maximum intensity in the wavelength range of 700 nm or more and less than 1700 nm of the spectral distribution, this is more preferred for the same reason.

The second phosphor 2 is also preferably a phosphor in which the maximum intensity of the light component in the wavelength range of less than 1600 nm±100 nm is less than 10% of the maximum intensity in the wavelength range of 700 nm or more and less than 1700 nm of the spectral distribution. In this form, a phosphor having no light components in the above wavelength range, such as the wavelength range of less than 1600 nm±100 nm, is particularly preferred. The reason why such a second phosphor 2 is preferred is because it is possible to avoid the adverse effects of light absorption by ammonia ($NH_3$), hydrocarbons ($C_2H_2$, $CH_4$, and the like), or carbon oxide (CO, $CO_2$, and the like) on the irradiated object, the system, or the like.

In addition, if the second phosphor 2 is a phosphor in which the maximum intensity of the light component in the wavelength range of less than 1600 nm±200 nm is less than 10% of the maximum intensity in the wavelength range of 700 nm or more and less than 1700 nm of the spectral distribution, this is more preferred for the same reason.

The light emitting device 10A using a phosphor that emits near-infrared wavelength-converted light on the relatively short wavelength side above outputs a light component with high spectral sensitivity of a photodiode exclusively used for a sensors for detector. Therefore, the light emitting device 10A using the phosphor that emits near-infrared wavelength-converted light on the relatively short wavelength side is desirable for an inspection device using a photodiode.

If the second phosphor 2 is a phosphor that emits wavelength-converted light exhibiting a maximum fluorescence intensity in a wavelength range of 700 nm or more and less than 1100 nm, this is desirable for an application to provide a light emitting device for an inspection device using an Si photodiode or an Si—PIN photodiode. If the second phosphor 2 is a phosphor that emits wavelength-converted light exhibiting a maximum fluorescence intensity within a wavelength range of preferably 780 nm or more and less than 1050 nm, and more preferably 800 nm or more and less than 1000 nm, this is more desirable for the same reason.

If the second phosphor 2 is a phosphor that emits wavelength-converted light exhibiting a maximum fluorescence intensity in a wavelength range of 700 nm or more and less than 1600 nm, this is desirable for an application to provide a light emitting device for an inspection device using a Ge photodiode. If the second phosphor 2 is a phosphor that emits wavelength-converted light exhibiting a maximum fluorescence intensity within a wavelength range of preferably 1100 nm or more and less than 1550 nm, and more preferably 1300 nm or more and less than 1500 nm, this is more desirable for the same reason.

If the second phosphor 2 is a phosphor that emits wavelength-converted light exhibiting a maximum fluorescence intensity in a wavelength range of 900 nm or more and less than 1650 nm, this is desirable for an application to provide a light emitting device for inspection device using an InGaAs photodiode. If the second phosphor 2 is a phosphor that emits wavelength-converted light exhibiting a maximum fluorescence intensity within a wavelength range of preferably 1000 nm or more and less than 1600 nm, and more preferably 1100 nm or more and less than 1600 nm, this is more desirable for the same reason.

If the light emitting device 10A using the phosphor that emits near-infrared wavelength-converted light on the relatively short wavelength side above is used, the risk of outputting a light component of 4000 nm or more that becomes a heat ray is reduced. For this reason, if these light emitting device 10A do not output the above light components, these are desirable for the inspection of an irradiated object that is likely to be altered by heat.

If, as the second phosphor 2, a phosphor that emits near-infrared wavelength-converted light on a relatively long wavelength side that exhibits the maximum fluorescence intensity in the wavelength range of 780 nm or more and less than 2500 nm is used, it is possible to obtain a light emitting device 10A that radiates output light 4 having an infrared light component that is invisible to the human eye. If, as the second phosphor 2, a phosphor that emits near-infrared wavelength-converted light on the relatively long wavelength side that exhibits the maximum fluorescence intensity in the wavelength range of preferably 800 nm or more and less than 2500 nm is used, it is possible to obtain a light emitting device 10A that radiates output light 4 having an infrared light component that is invisible to the human eye.

These light emitting devices 10A are obtained if the first transmitted primary light $3BT_1$, the primary light 3B, or the first wavelength-converted light 1B is light exhibiting the maximum intensity within a visible wavelength range of 380 nm or more and less than 700 nm, for example.

If this kind of light emitting device 10A using a phosphor that emits near-infrared wavelength-converted light on the relatively long wavelength side is used, the risk of outputting a visible light component with a shorter wavelength than a wavelength of 780 nm which is visible to the human eye is reduced. Therefore, if these light emitting devices 10A do not output the above visible light components, they are desirable for monitoring applications or the like where it is inconvenient if the presence of the output light is perceived by a person.

As the second phosphor 2, a phosphor that is activated by rare earth ions, transition metal ions, or the like and emits fluorescence having a near-infrared light component can be used, for example. As the rare earth ion, at least one selected from $Nd^{3+}$, $Eu^{2+}$, $Ho^{3+}$, $Er^{3+}$, $Tm^{3+}$ and $Yb^{3+}$ is used, for example. As the transition metal ion, at least one selected from $Ti^{3+}$, $V^{4+}$, $Cr^{4+}$, $V^{3+}$, $Cr^{3+}$, $V^{2+}$, $Mn^{4+}$, $Fe^{3+}$, $Co^{3+}$, $Co^{2+}$ and $Ni^{2+}$ is used, for example.

As the second phosphor 2, similar to the first phosphor 1, oxides, sulfides, nitrides, halides, oxysulfides, oxynitrides, acid halides, or the like containing rare earth ions, transition metal ions, or the like as fluorescent ions can be used.

An ion forming the second phosphor 2 and functioning as a fluorescent ion of an inorganic compound can be at least one ion selectable from the above rare earth ions and transition metal ions. As an ion functioning as the fluorescent ion, an ion is used which functions as a fluorescent ion of a phosphor having the property of absorbing at least one of the first transmitted primary light $3BT_1$, the primary light 3B, or the first wavelength-converted light 1B, and converting the light to a near-infrared light component. The ion functioning as the fluorescent ion is preferably $Cr^{3+}$. That is, the second phosphor 2 preferably contains $Cr^{3+}$ as the fluorescent ion.

If the second phosphor 2 includes $Cr^{3+}$, this is preferable because the second phosphor 2 tends to have the property of absorbing visible light, especially blue light or red light, and converting the light to a near-infrared light component. If the second phosphor 2 includes $Cr^{3+}$, this is preferable because it is easy to change the light absorption peak wavelength or fluorescence peak wavelength depending on the type of the inorganic compound that is the matrix of the phosphor, and it is easy to change the shape of the excitation spectrum, fluorescence spectrum, or the like.

Further, if the second phosphor 2 includes $Cr^{3+}$, it becomes easy to use, as the excitation light, a blue light component emitted by a wavelength-conversion light emitting element of a blue LED specification that is suitable for acquisition. As a wavelength-conversion light emitting element of a blue LED specification that is suitable for acquisition, a light emitting element is used which is made by combining a solid-state light emitting element and a phosphor, for example. Therefore, if the second phosphor 2 contains $Cr^{3+}$, it is possible to obtain a light emitting device 10A that is suitable for rapid manufacture and sale.

Furthermore, if the second phosphor 2 contains $Cr^{3+}$, it becomes easy to use a red light component suitable for reducing the Stokes loss as excitation light when using a wavelength-conversion light emitting element with a specification including a red phosphor.

Therefore, if the second phosphor 2 contains $Cr^{3+}$, it is possible to obtain a light emitting device 10A suitable for controlling the spectral distribution of the near-infrared light component to be output.

The type of phosphor in which the fluorescent ion becomes $Cr^{3+}$ is not particularly limited if it absorbs at least one of the first transmitted primary light $3BT_1$, the primary light 3B, or the first wavelength-converted light 1B and converts the light to an infrared fluorescent component. Therefore, as the second phosphor 2 in which the fluorescent ion becomes $Cr^{3+}$, it is sufficient for it to be appropriately selected from known $Cr^{3+}$ activated phosphors. Examples of the second phosphor 2 in which the fluorescent ion becomes $Cr^{3+}$ include a composite metal oxide that is easy to manufacture.

As the second phosphor 2 in which the fluorescent ion becomes $Cr^{3+}$, specifically, a composite oxide phosphor (hereinafter referred to as a "$Cr^{3+}$ activated garnet phosphor") which is activated by $Cr^{3+}$ and has a garnet-type crystal structure which has been used in many practical applications is used. As the $Cr^{3+}$ activated garnet phosphor, a rare earth aluminum garnet phosphor is preferably used. More specifically, as the $Cr^{3+}$ activated garnet phosphor, the following are used: $Y_3Al_2(AlO_4)_3:Cr^{3+}$, $La_3Al_2(AlO_4)_3:Cr^{3+}$, $Gd_3Al_2(AlO_4):Cr^{3+}$, $Y_3Ga_2(AlO_4)_3:Cr^{3+}$, $La_3Ga_2(AlO_1):Cr^{3+}$, $Gd_3Ga_2(AlO_4)_3:Cr^{3+}$, $Y_3Sc_2(AlO_4)_3:Cr^{3+}$, $La_3Sc_2(AlO_4)_3:Cr_3$, $Gd_3Sc_2(AlO_4)_3:Cr^{3+}$ $Y_3Ga_2(GaO_4)_3:Cr^{3+}$, $La_3Ga_2(GaO_4)_3:Cr_3$, $Gd$ $Ga_2(GaO_4)_3:Cr_3$, $Y_3Sc_2(GaO_4)_3:Cr_3$, $La_3Sc_2(GaO_4)_3:Cr^{3+}$, $Gd_3Sc_2(GaO_4):Cr^{3+}$, and a garnet compound composed of a solid solution obtained with these substances as an end member.

Many $Cr^{3+}$ activated garnet phosphors have the property of absorbing blue to red light components, especially blue or red light components, and converting them to deep-red light to near-infrared light. For this reason, as the solid-state light emitting element 3 that emits the primary light 3B and/or the first wavelength converter 1A that emits the first wavelength-converted light 1B, a solid-state light emitting element that emits blue and/or red light components and a phosphor that emits blue and/or red light components can be used. If the $Cr^{3+}$ activated garnet phosphor is used, it is possible to obtain a light emitting device 10A that can easily obtain output light 4 including at least one (blue or red) light component forming the three primary colors of light (blue, green, and red) and a near-infrared light component.

As a light emitting device 10A that can obtain output light 4 with high color rendering properties that includes a light component forming the three primary colors of light (blue, green, and red) and a near-infrared light component, for example, a light emitting device including the solid-state light emitting element 3, the first wavelength converter 1A, and the second wavelength converter 2A is used. In this light emitting device 10A, first, the solid-state light emitting element 3 that emits blue light as the primary light 3B is used as the solid-state light emitting element 3. Secondly, in the light emitting device 10A, the first wavelength converter 1A is used which includes, as the first phosphor 1, the $Ce^{3+}$ activated garnet phosphor that converts blue light to green light and/or at least an $Eu^{2+}$ activated nitride-based phosphor that converts blue light to red light. Thirdly, in the light emitting device 10A, the second wavelength converter 2A is used which includes, as the second phosphor 2, the $Cr^{3+}$ activated garnet phosphor that converts at least one of the first transmitted primary light $3BT_1$, primary light 3B, or first wavelength-converted light 1B to near-infrared light.

In recent years, materials technology of $Ce^{3+}$ activated garnet phosphors, including ceramic conversion technology, has advanced, and this makes it easy to apply the technology fostered with $Ce^{3+}$ activated garnet phosphors to $Cr^{3+}$ activated garnet phosphors. For this reason, if a fluorescent ceramic composed mainly of a $Cr^{3+}$ activated garnet phosphor is used, it is relatively easy to provide a light emitting device 10A that is suitable in terms of increasing the output of a near-infrared light component and reliability.

Further, as in the case of a white LED light source, for a $Ce^{3+}$ activated garnet phosphor also, a wide variety of such phosphors are on the market, and many companies are manufacturing and selling them, and therefore it is easy to obtain these related technologies. Therefore, by using a $Cr^{3+}$ activated garnet phosphor having potential for horizontal development of the technology fostered with $Ce^{3+}$ activated garnet phosphors, it is possible to obtain a light emitting device 10A suitable for rapid commercial development with little effort.

(Second Wavelength-Converted Light 2B)

In the light emitting device 10A, the second wavelength converter 2A absorbs at least part of the first mixed light 14 including the first transmitted primary light $3BT_1$, which is the primary light 3B that has passed through the first wavelength converter 1A, and the first wavelength-converted light 1B. Then, the second wavelength converter 2A converts the light to the second wavelength-converted light 2B having a fluorescence peak in the wavelength region exceeding 700 nm and a near-infrared component in the wavelength region of 780 nm or more and less than 2500 nm.

The second wavelength-converted light 2B becomes a near-infrared light component with a maximum intensity in a wavelength range of 700 nm or more and less than 2500 nm, for example. Further, the second wavelength-converted light 2B becomes a light component with a maximum intensity in a wavelength range of 750 nm or more and less than 1800 nm, and preferably 780 nm or more and less than 1500 nm, for example.

(Output Light 4)

The output light 4 includes at least transmitted first wavelength-converted light $1BT_2$, which is a light component obtained by the first wavelength-converted light 1B having passed through the second wavelength converter 2A, and the light component of the second wavelength-converted light 2B. The transmitted first wavelength-converted light $1BT_2$ has a lower intensity than the first wavelength-converted light 1B. The spectral distribution of the transmitted first wavelength-converted light $1BT_2$ is derived from the spectral distribution of the first wavelength-converted light 1B.

The output light 4 may further include second transmitted primary light $3BT_2$ which is the first transmitted primary light 3BT: that has passed through the second wavelength-converted light 2B. FIG. 1 shows an aspect in which the output light 4 is second mixed light 24 having the transmitted first wavelength-converted light $1BT_2$, second wavelength-converted light 2B, and second transmitted primary light $3BT_2$. The output light 4 and the second mixed light 24 are the same light, but for convenience, the output light 4 is also referred to as the second mixed light 24.

FIG. 4 shows an example of the spectral distribution of the output light 4 emitted by the light emitting device according to the present embodiment.

As shown in FIG. 4, the output light 4 emitted by the light emitting device according to the present embodiment can include at least a first light component 5, a second light component 6, and a third light component 7 with different color tones, for example.

The first light component 5 is derived from the primary light 3B emitted by the solid-state light emitting element 3. The first light component 5 shown in FIG. 4 is identical to the second transmitted primary light $3BT_2$ shown in FIG. 1. The first light component 5 and the second transmitted primary light $3BT_2$ are identical light components but different expressions are used for convenience of the explanation.

The first light component 5 is a visible light component having a maximum intensity in a wavelength range of 300 nm or more and less than 660 nm, preferably 380 nm or more and less than 670 nm, and even more preferably 435 nm or more and less than 470 nm, for example. The first light component 5 shown in FIG. 4 has a maximum intensity at a wavelength of 455 nm.

The second light component 6 is derived from the first wavelength-converted light 1B emitted by the first phosphor 1. The second light component 6 shown in FIG. 4 is identical to the transmitted first wavelength-converted light 1BT$_2$ shown in FIG. 1. The second light component 6 and the transmitted first wavelength-converted light 1BT$_2$ are identical light components but different expressions are used for convenience of the explanation.

The second light component 6 is a visible light component with a maximum intensity in a wavelength range of 380 nm or more and less than 700 nm, and preferably 500 nm or more and less than 660 nm, for example. The second light component 6 shown in FIG. 4 has a maximum intensity at a wavelength of 540 nm.

Further, the third light component 7 is derived from the second wavelength-converted light 2B emitted by the second phosphor 2. The third light component 7 shown in FIG. 4 is identical to the second wavelength-converted light 2B shown in FIG. 1. The third light component 7 and the second wavelength-converted light 2B are identical light components but different expressions are used for convenience of the explanation.

The third light component 7 is near-infrared light with a maximum intensity in a wavelength range of 700 nm or more and less than 2500 nm, and preferably 750 nm or more and less than 1800 nm, for example. The longest wavelength of the wavelength range can be 800 nm, 900 nm, 1000 nm, 1200 nm, 1500 nm, or the like as appropriate. The third light component 7 shown in FIG. 4 has a maximum intensity at a wavelength of 730 nm.

According to the light emitting device 10A that emits the output light 4 having the first light component 5, the second light component 6, and the third light component 7, the output light 4 includes a visible light component visible to the human eye and a near-infrared light component that is difficult to be seen with the human eye. The visible light component is the first light component 5 and the second light component 6, and the near-infrared light component is the third light component 7. According to the light emitting device 10A described above, the non-destructive inspection of the inside of an irradiated object is possible by means of near-infrared spectroscopy or the like while confirming the irradiated object with the human eye.

Further, according to the light emitting device 10A described above, it is possible to obtain output light 4 having a color tone in which additive color mixing of the primary light 3B (the first light component 5) and the first wavelength-converted light 1B and/or the second wavelength-converted light 2B (the second light component 6 and/or the third light component 7) is performed.

According to the light emitting device 10A described above, the total number of photons of the output light 4 can be controlled by controlling the power supplied to the solid-state light emitting element 3. Further, according to the light emitting device 10A described above, the ratio of photons constituting the first light component 5, the second light component 6, and the third light component 7 can be controlled by changing the thickness and optical transmittance of the first wavelength converter 1A and the second wavelength converter 2A. Still further, according to the light emitting device 10A described above, the color tones of the second light component 6 and the third light component 7 can be controlled by changing the types of the first phosphor 1 and the second phosphor 2.

Therefore, according to the light emitting device 10A described above, it becomes easy to respond to customer requests related to both the visibility and the non-destructive inspection of an irradiated object. In addition, the light emitting device 10A described above radiates output light with which the appearance of the irradiated object is natural, and which is suitable for both the human eye and a detector.

The spectral distribution of the output light 4 preferably has a valley within the wavelength range of 650 nm or more and less than 800 nm, and preferably 700 nm±50 nm. The spectral distribution of the output light 4 preferably has a minimum intensity in the above wavelength range having a valley which is less than 50% of the maximum intensity of the spectral distribution in the wavelength range of 380 nm or more and 2500 nm or less, and preferably 380 nm or more and 960 nm or less.

With such a configuration, as for the output light 4, less interference is caused between the first mixed light 14 of the first light component 5 and the second light component 6 mainly composed of a visible light component and the third light component 7 having a near-infrared light component. Specifically, the spectral distribution of the output light 4 becomes a spectral distribution in which the visible light component and the near-infrared light component are separated to some extent or more with a wavelength around 700 nm as a boundary. Therefore, according to the light emitting device 10A that radiates such output light 4, it is easy to enhance the S/N of a detector that detects a near-infrared light component that passes through an irradiated object or is reflected by the irradiated object.

In applications where the near-infrared light component emitted by the light source is detected by a detector and a detection signal of the detector is subjected to a Fourier transform and used (for example, optical coherence tomography), the spectral distribution of the third light component 7 is preferably unimodal. Further, in the above applications, it is more preferable that the components have normal distributions or spectral distributions close to the normal distributions.

In this case, it is preferable that the spectral distribution of the third light component 7 not be accompanied by a sudden change in the wavelength dependence of the intensity in the wavelength region exceeding 700 nm, and it is more preferable that the spectral distribution not change exceeding ±8%/nm, especially ±3%/nm.

The degree of the preferred spectral distribution that is close to the normal distribution is indicated numerically. The wavelength at which the third light component 7 exhibits the maximum intensity is denoted as $\lambda_P$, and the wavelengths on the shorter and longer wavelength sides at which the intensity of the third light component 7 is half of the maximum intensity are denoted as $\lambda_S$ and $\lambda_L$, respectively. In this case, the spectral distribution is such that the values of $\lambda_P$, $\lambda_S$, and $\lambda_L$ satisfy $1<(\lambda_L-\lambda_P)/(\lambda_P-\lambda_S)<2.0$, and preferably $1<(\lambda_L-\lambda_P)/(\lambda_P-\lambda_S)<1.8$.

If the spectral distribution of the third light component 7 satisfies this condition, the occurrence of a false signal after Fourier transformation can be suppressed, and it is possible to obtain a light emitting device suitable for allowing a detector to detect a detection signal with excellent signal quality.

At least one of the first light component 5 or the second light component 6 preferably has a blue-green to green to yellow to orange light component with a wavelength of 510 nm or more and less than 600 nm, and preferably a green to yellow light component with a wavelength of 530 nm or more and less than 580 nm. At least one of the first light component 5 or the second light component 6 more preferably has a green light component with a wavelength of 545 nm or more and less than 565 nm.

With such a configuration, the intensity with which the human eye perceives light is large and a light component with a wavelength that feels bright to a person is output, and therefore it is possible to obtain a light emitting device 10A that emits output light 4 that makes it easy to see an irradiated object with the human eye.

In the light emitting device 10A, at least one of the first light component 5 or the second light component 6 has a blue to blue-green to green light component with a wavelength of 460 nm or more and less than 550 nm, and preferably a blue-green to green light component with a wavelength of 480 nm or more and less than 530 nm. At least one of the first light component 5 or the second light component 6 also preferably has a blue-green to green light component with a wavelength of 490 nm or more and less than 520 nm.

With such a configuration, it is possible to obtain a light emitting device 10A which outputs a light component with a wavelength that makes the human eye perceive light more intensely and more brightly in a scotopic vision situation in which the amount of light is low. That is, it is possible to obtain a light emitting device 10A that emits output light 4 that makes it easy to see an object that is irradiated in darkness.

In the light emitting device 10A, at least one of the first light component 5 or the second light component 6 preferably has a red light component with a wavelength of 610 nm or more and less than 670 nm, and preferably 630 nm or more and less than 660 nm.

With such a configuration, it is possible to obtain a light emitting device 10A which outputs a light component that makes skin color or a red color of an irradiated object appear beautiful or vivid. That is, it is possible to obtain a light emitting device 10A which emits output light 4 that enhances the appearance of the face or skin of an illuminated person or the appearance of red meat or fruit.

It is preferable that the intensity of the third light component 7 start at 850 nm and decrease as the wavelength becomes longer, and the fluorescence intensity at 1000 nm can be less than 10% of the fluorescence intensity at 850 nm. Further, the wavelength of the above starting point is preferably shorter than 850 nm, and can be 800 nm, for example. Still further, in this case, the fluorescence intensity at 1000 nm can be less than 10% of the fluorescence intensity at 800 nm, and the fluorescence intensity at 950 nm can be less than 10% of the fluorescence intensity at 800 nm.

With such a configuration, it is possible to obtain a light emitting device 10A that emits output light 4 with a small percentage of near-infrared or mid-infrared light in the long-wavelength region, which can easily function as a heat ray. That is, it is possible to obtain a light emitting device 10A that is suitable for the application of inspecting an irradiated object that is easily adversely affected by heat emitted by a light emitting device, such as food, for example.

The spectral distribution of the output light 4 has a minimum value between the second light component 6 and the third light component 7, and this minimum value is preferably less than 50% of the maximum intensity of the third light component 7. In addition, in the spectral distribution of the output light 4, it is desirable that the wavelength difference between the wavelength on the longer wavelength side and the wavelength on the lower wavelength side, where the intensity of the third light component is 50% of the maximum intensity, be more than 70 nm, and preferably more than 100 nm.

With such a configuration, the visible and near-infrared light components are well separated, and it is possible to obtain a light emitting device 10A that emits output light 4 having near-infrared light components with different wavelengths across a wide wavelength region. That is, it is possible to obtain a light emitting device 10A suitable for inspection, evaluation, and the like of an irradiated object, of which the near-infrared light absorption wavelength is different or is liable to fluctuate depending on the surrounding environment.

In such a configuration, the light in which the first light component 5, the second light component 6, and the third light component 7 are mixed preferably includes a blue light component, a blue-green to green to yellow light component, and a red light component. As the blue light component, a blue light component in the wavelength range of 435 nm or more and less than 480 nm is preferred. As the blue-green to green to yellow light component, a blue-green to green to yellow light component in the wavelength range of 500 nm or more and less than 580 nm is preferred. As the red light component, a red light component in the wavelength range of 600 nm or more and less than 700 nm is preferred.

The blue light component is preferably a blue light component having a maximum intensity in the above wavelength range. The blue-green to green to yellow light component is preferably a blue-green to green to yellow light component having a maximum intensity in the above wavelength range. The red light component is preferably a red light component having a maximum intensity in the above wavelength range.

With such a configuration, the output light 4 includes blue, green, and red light components that are the three primary colors of light, and it is possible to obtain a light emitting device 10A that can output visible light with high color rendering properties. That is, a light emitting device 10A is obtained that is suitable for making an irradiated object appear as it is. In addition, with such a configuration, a light emitting device 10A with good compatibility with an imaging technique that is referred to as RGB-NIR imaging is obtained because the device emits many light components of the three primary colors of light (blue, green, and red) and near-infrared light components.

In such a configuration, the first light component 5 can be a blue light component that is derived from the primary light 3B emitted by the solid-state light emitting element 3 and has a maximum intensity in a wavelength range of normally 435 nm or more and less than 480 nm, and preferably 440 nm or more and less than 470 nm.

The output light 4 with such a configuration can be easily obtained by using an orthodox solid-state light emitting element such as a light emitting diode (LED) or laser diode (LD) emitting blue light. Therefore, with such a configuration, it is possible to obtain a light emitting device 10A suitable for speedy commercial development and industrial production.

The second light component 6 is preferably light derived from the first wavelength-converted light 1B produced by the first phosphor 1, of the first light component 5.

With such a configuration, it is possible to obtain a light emitting device 10A that reduces the energy difference (Stokes shift) between light absorption and fluorescence emission by the first phosphor 1. That is, such a configuration suppresses a phenomenon (referred to as thermal quenching) in which quenching is caused by the generation of heat and temperature rise of the first phosphor 1 due to energy loss caused by a wavelength conversion from visible light of a certain wavelength to visible light of a longer wavelength. Therefore, with such a configuration, it is possible to obtain a light emitting device 10A suitable for the output of the second light component 6 at a high photon conversion efficiency.

The third light component 7 is preferably the second wavelength-converted light 2B produced by the second phosphor 2 of the second light component 6.

With such a configuration, it is possible to obtain a light emitting device 10A that reduces the energy difference between light absorption and fluorescence emission by the second phosphor 2. That is, such a configuration suppresses quenching caused by the generation of heat and temperature rise of the second phosphor 2 due to the energy loss caused by a wavelength conversion from visible light of a certain wavelength to near-infrared light of a longer wavelength. Therefore, with such a configuration, it is possible to obtain a light emitting device suitable for the output of the third light component 7 at a high photon conversion efficiency.

In the output light 4, the integral value of the energy intensity of the light component with a wavelength of less than 700 nm can be larger than the integral value of the energy intensity of the light component with a wavelength of 700 nm or more. With such a configuration, it is possible to obtain a light emitting device 10A in which the integral value of the energy intensity of the light component with the wavelength of less than 700 nm exceeds two times or preferably three times the integral value of the energy intensity of the light component with the wavelength of 700 nm or more.

Therefore, with such a configuration, it is possible to obtain a light emitting device 10A in which the energy intensity of light components of visible light with a high visual sensitivity is greater than the energy intensity of light components in the long-wavelength region including near-infrared light with a low visual sensitivity. In other words, it is possible to obtain a light emitting device 10A that emits output light with which the irradiated object is bright and easy to see for the human eye and, if necessary, non-destructive inspection or the like of the irradiated object can be performed.

Conversely, output light 4 may be emitted by a light emitting device 10A in which the integral value of the energy intensity of the light component with a wavelength of less than 700 nm is smaller than the integral value of the energy intensity of the light component with a wavelength of 700 nm or more. With such a configuration, it is possible to obtain a light emitting device 10A in which the integral value of the energy intensity of the light component with a wavelength of less than 700 nm is less than half or preferably ⅓ of the integral value of the energy intensity of the light component with a wavelength of 700 nm or more.

Therefore, with such a configuration, it is possible to obtain a light emitting device 10A in which the energy intensity of light components including a near-infrared light component usable for non-destructive inspection or the like is greater than the energy intensity of the light components visible to the human eye. That is, with such a configuration, it is possible to obtain a light emitting device 10A that emits output light 4 suitable for high-precision non-destructive inspection, non-destructive inspection of a minute object, wide-area non-destructive inspection, and non-destructive inspection of a large or thick irradiated object. In addition, with such a configuration, it is possible to obtain a light emitting device 10A that emits output light 4 in which the surface condition or the like of the irradiated object can be easily confirmed with the human eye if necessary. Furthermore, with such a configuration, since it is possible to obtain a light emitting device 10A that emits output light with a small output ratio of visible light components visible to the human eye, a light emitting device 10A suitable for mitigating glare of the output light 4 can be obtained.

The light emitting device 10A can emit white output light 4. If the first light component 5, the second light component 6, and the third light component 7, that are appropriate light components forming white light by means of additive color mixing, are selected and combined, a light emitting device 10A that emits the white output light 4 can be obtained, for example.

With such a configuration, a light emitting device 10A is obtained that simultaneously emits light with a color tone close to natural light and high output near-infrared light and serves as both general and industrial lighting. Therefore, a light emitting device 10A is obtained that is suitable for applications such as a detection device that detects the condition or the like of an irradiated object of which the appearance is close to the natural state, and an inspection device that inspects the internal structure, defects, and the like of the irradiated object.

The output light 4 is light of a light color with a correlated color temperature of preferably 2600 K or more and less than 12000 K, and more preferably 3000 K or more and less than 8000 K.

With such a configuration, it is possible to obtain a light emitting device 10A that simultaneously emits visible light with a color tone close to natural light and near-infrared light, and that can serve as general lighting for which visibility according to the human eye is emphasized, and industrial lighting for which visibility according to the electronic eye (sensor) is emphasized. That is, it is possible to obtain a light emitting device 10A which is suitable for applications such as a detection device that detects the condition or the like of an irradiated object of which the appearance is close to the natural state and, an inspection device that may inspect the internal structure, defects, and the like of an irradiated object. Light with a low correlated color temperature becomes light with a light color close to light emitted by a light bulb, and light with a high correlated color temperature becomes light with a light color close to daytime sunlight.

The average color rendering index (Ra) of the preferred output light 4 in the present embodiment is 80 or more and less than 100.

According to this kind of light emitting device 10A, the appearance of irradiated objects such as fruits and vegetables, meat, and fresh fish is made good with rich sense of freshness by the light with high color rendering properties, and the degree of damage and freshness of the inside of the irradiated object can be evaluated by the detection of the light components of reflected or transmitted light of the near-infrared light.

In addition, according to the light emitting device 10A described above, it is possible to use the device for store lighting which allows the degree of damage or the like of products such as fruits and vegetables displayed on a sales floor to be grasped without being noticed by a third party, and the early removal of products or the like which are found to be damaged from a fixed price sales floor or the like, for example.

In addition, the above light emitting device 10A is suitable for healthcare or medical applications in which irradiated objects such as a person's face, skin, and internal organs are made to look beautiful by light with high color rendering properties, and the evaluation of human health conditions, diseases, and the like is made possible by detection of light components of reflected or transmitted light of the near-infrared light. The reflected or transmitted light of the near-infrared light is near-infrared-based light with which the irradiated object is irradiated. Light with a low average color rendering index becomes light suitable for high luminous flux, and light with a high average color rendering index becomes light close to natural light.

According to the light emitting device 10A described above, it is possible to monitor and measure the condition of irradiated objects by means of near-infrared light without being perceived by a person, while giving an appearance to a space which is not inferior to when irradiated with natural light.

The output light 4, which is white in color, can have a spectral intensity over the entire wavelength range of at least 440 nm or more and less than 660 nm, and preferably at least 430 nm or more and less than 900 nm. That is, the output light 4 can be light with a spectral distribution which has no wavelength component of which the intensity becomes zero within the above wavelength range.

When this kind of output light 4 is used, the object can be irradiated with many kinds of light of different wavelengths. Moreover, when output light 4 ranging from short-wavelength visible (violet-blue) to near-infrared is used, it is possible to obtain a light emitting device 10A suitable for hyperspectral imaging in which the reflected light, which varies depending on the wavelength of illumination, is captured and aggregated and the features of the irradiated object are visualized.

In the form of the spectral distribution of the output light 4 emitted by the light emitting device, it is preferable that the intensity of the long-wavelength light component with a wavelength of 700 nm or more exhibit the maximum value (maximum intensity). Further, in the spectral distribution of the output light 4, it is preferable that the maximum intensity of the light component with a wavelength of 700 nm or more be more than 1.5 times, preferably 2 times, and more preferably 3 times the maximum intensity of the light component with a wavelength of 380 nm or more and less than 700 nm.

The maximum intensity of the light component in the wavelength range of 380 nm or more and less than 700 nm is preferably less than 50%, more preferably less than 30%, and even more preferably less than 10% of the maximum intensity of the light component with a wavelength of 700 nm or more. This results in a light emitting device 10A that has a large percentage of near-infrared light components and high conversion efficiency into near-infrared light components.

In the form of the spectral distribution of the output light 4 emitted by the light emitting device, it is preferable that the intensity of the light component with a wavelength of 380 nm or more and less than 700 nm exhibit the maximum value (maximum intensity). Further, in the spectral distribution of the output light 4, it is preferable that the maximum intensity of the light component with a wavelength of less than 700 nm be more than 1.5 times, preferably 2 times, more preferably 3 times the maximum intensity of the light component with a wavelength of 700 nm or more. With such a configuration, it is possible to obtain a light emitting device 10A with a large percentage of visible light components and high conversion efficiency to visible light components.

It is preferable that the spectral distribution of the output light 4 be substantially free of light components in an ultraviolet range of a wavelength of less than 380 nm. With such a configuration, the input power can be converted only to visible light and infrared light including near-infrared light, and it is possible to obtain a light emitting device 10A with high energy conversion efficiency to visible light and infrared light.

In the spectral distribution of the output light, it is preferable that the device emits a broad fluorescent component derived from the electron energy transition of $^4T_2$ to $^4A_2$ of $Cr^{3+}$ ions, as shown in FIG. 4 as the third light component 7. Further, the fluorescent component preferably has a fluorescence peak in the wavelength region of 700 nm or more. As a result, the device emits a near-infrared component across a wide wavelength range, and a light emitting device 10A suitable for hyperspectral imaging can be obtained.

The spectral distribution of the output light 4 preferably has a light component across the entire visible wavelength region of at least 410 nm or more and less than 700 nm, and preferably 380 nm or more and less than 780 nm. With such a configuration, it is possible to obtain a light emitting device 10A that emits output light which not only makes the irradiated object visible to the human eye but also has a light component usable for spectral imaging across the entire wavelength range of the visible range.

(Operation of Light Emitting Device)

The operation of the light emitting device 10A will be described below with reference to FIG. 1.

When the solid-state light emitting element 3 is powered and driven, the solid-state light emitting element 3 emits the primary light 3B. When the primary light 3B radiated from the solid-state light emitting element 3 enters the first wavelength converter 1A, the first wavelength converter 1A absorbs part of the primary light 3B and converts the light to the first wavelength-converted light 1B with a lower light energy. The primary light 3B that has passed through the first wavelength converter 1A becomes the first transmitted primary light $3BT_1$. The first wavelength converter 1A radiates the first mixed light 14, which is mixed light of the first transmitted primary light $3BT_1$ and the first wavelength-converted light 1B.

When the first mixed light 14 enters the second wavelength converter 2A, the second wavelength converter 2A absorbs part of the mixed light and converts the light to the second wavelength-converted light 2B, which has a lower light energy. The first transmitted primary light $3BT_1$ that has passed through the second wavelength converter 2A becomes the second transmitted primary light $3BT_2$. The first wavelength-converted light 1B that has passed through the second wavelength converter 2A becomes the transmitted first wavelength-converted light $1BT_2$. The second wavelength converter 2A radiates the second mixed light 24, which is mixed light of the second transmitted primary light $3BT_2$, the transmitted first wavelength-converted light $1BT_2$ and the second wavelength-converted light 2B. The second mixed light 24 becomes the output light 4.

The primary light 3B, the first wavelength-converted light 1B, and the second wavelength-converted light 2B become sources that respectively form the first light component 5 (the second transmitted primary light $3BT_2$), the second light component 6 (the transmitted first wavelength-converted light $1BT_2$), and the third light component 7 (the second wavelength-converted light 2B), and form the spectral distribution and are output as the output light 4.

Second Embodiment

A light emitting device 10B according to a second embodiment shown in FIG. 2 includes solid-state light emitting elements 3, first wavelength converters 1A, and a second wavelength converter 2A. Specifically, the light emitting device 10B according to the second embodiment has a plurality of light emission-wavelength conversion units that are combined structures of the solid-state light emitting elements 3 and the first wavelength converters 1A.

The light emitting device 10B according to the second embodiment is the same as the light emitting device 10A according to the first embodiment except that a plurality of light emission-wavelength conversion units are provided. Therefore, the members that are the same between the light emitting device 10B according to the second embodiment and the light emitting device 10A according to the first embodiment are denoted by the same reference numerals, and descriptions of these members are omitted.
(Operation of Light Emitting Device)

In the operation of the light emitting device 10A according to the first embodiment, the plurality of first wavelength converters 1A forming a single light emission-wavelength conversion unit radiate the first mixed light 14. Meanwhile, in the operation of the light emitting device 10B according to the second embodiment, each of the plurality of first wavelength converters 1A forming the plurality of light emission-wavelength conversion units radiates the first mixed light 14.

The operation of the light emitting device 10B according to the second embodiment is the same as that of the light emitting device 10A according to the first embodiment except that the plurality of light emission-wavelength conversion units radiate the first mixed light 14 instead of a single light emission-wavelength conversion unit radiating the first mixed light 14. Therefore, an explanation of the operation of the light emitting device 10B according to the second embodiment is omitted.

Third Embodiment

A light emitting device 10C according to a third embodiment shown in FIG. 3 includes solid-state light emitting elements 3, a first wavelength converter 1A, and a second wavelength converter 2A. Specifically, the light emitting device 10C according to the third embodiment is an example of a light emitting device having a configuration in which only the solid-state light emitting element 3 is provided in plurality. In the light emitting device 10C, the plurality of solid-state light emitting elements 3 are arranged in alignment such that the distance between each solid-state light emitting element 3 and the first wavelength converter 1A is constant. In the light emitting device 10C, the plurality of solid-state light emitting elements 3 and the first wavelength converter 1A are separated from each other but they can be formed in a structure in which they are in close contact.

The light emitting device 10C according to the third embodiment is the same as the light emitting device 10A according to the first embodiment except that a plurality of solid-state light emitting elements 3 are used and they are arranged in alignment such that the distance between each solid-state light emitting element 3 and the first wavelength converter 1A is constant. For this reason, the members that are the same between the light emitting device 10C according to the third embodiment and the light emitting device 10A according to the first embodiment are denoted by the same reference numerals, and descriptions thereof are omitted.
(Operation of Light Emitting Device)

In the operation of the light emitting device 10A according to the first embodiment, the primary light 3B emitted by one solid-state light emitting element 3 is received by one first wavelength converter 1A. Meanwhile, in the operation of the light emitting device 10C according to the third embodiment, the primary light 3B emitted by the plurality of solid-state light emitting elements 3 is received by one first wavelength converter 1A.

The operation of the light emitting device 10C according to the third embodiment is the same as that of the light emitting device 10A according to the first embodiment except that the primary light 3B received by one first wavelength converter 1A is the plurality of instances of primary light 3B emitted by the plurality of solid-state light emitting elements 3. Therefore, an explanation of the operation of the light emitting device 10C according to the third embodiment is omitted.

Example of Basic Configuration of Light Emitting Device

In the light emitting devices 10A to 10C shown in FIGS. 1 to 3, blue light emitted by a solid-state light emitting element (light emitting diode, laser diode, or the like) can be used as the primary light 3B. Hereinafter, the light emitting devices 10A to 10C shown in FIGS. 1 to 3 are also simply referred to as a "light emitting device 10".

In the light emitting device 10, as the first wavelength-converted light 1B, it is possible to use visible light by means of the first phosphor 1 which absorbs blue light and converts the light to visible light with a longer wavelength than the blue light, for example.

In the light emitting device 10, as the second wavelength-converted light 2B, it is possible to use near-infrared light by means of the second phosphor 2 which absorbs blue light and converts the light to near-infrared light, for example.

In the light emitting device 10, it is possible to use, as the solid-state light emitting element 3, a solid-state light emitting element that emits, as the primary light 3B, blue light having a fluorescence peak in a wavelength range of 430 nm or more and less than 480 nm, and preferably 440 nm or more and less than 470 nm, for example.

In the light emitting device 10, as the first phosphor 1, it is possible to use a phosphor that absorbs blue light and converts the light to green or red light that becomes the first wavelength-converted light 1B, for example. As this kind of phosphor, a phosphor activated by $Ce^{3+}$ or $Eu^{2+}$, preferably a $Ce^{3+}$ activated garnet phosphor and/or an $Eu^{2+}$ activated nitride-based phosphor are used, for example.

In the light emitting device 10, as the second phosphor 2, it is possible to use a phosphor that absorbs blue and/or red light and converts the light to near-infrared light that becomes the second wavelength-converted light 2B, for example. As such a phosphor, a phosphor activated by transition metal ions and preferably a $Cr^{3+}$ activated garnet phosphor can be used, for example.

With such a configuration, the output light 4 including the first light component 5, the second light component 6, and the third light component 7 becomes light having both visible and near-infrared light components as shown in FIG. 4. In addition, the output light 4 becomes light having a spectral distribution in which the fluorescence intensity close to the boundary of both visible and near-infrared light components is small and they are separated with more than a certain degree of clarity.

In the light emitting device 10, it is easy to change the color tone of the primary light 3B which is the origin of the first light component 5 by changing the types of the solid-state light emitting element 3, the first wavelength converter 1A, and the second wavelength converter 2A.

In the light emitting device 10, it is easy to change the color tone of the first wavelength-converted light 1B which is the origin of the second light component 6 by changing the types of the solid-state light emitting element 3, the first wavelength converter 1A, and the second wavelength converter 2A.

In the light emitting device 10, it is easy to change the color tone of the second wavelength-converted light 2B, which is the origin of the third light component 7, by changing the types of the solid-state light emitting element 3, the first wavelength converter 1A, and the second wavelength converter 2A.

In the light emitting device 10, if the thickness of the first wavelength converter 1A and the second wavelength converter 2A and the concentration of the phosphor are changed, it is easy to change the output ratios thereof. Therefore, with such a configuration, it is easy to control the spectral distribution of the output light 4.

The light emitting devices 10A to 10C shown in FIGS. 1 to 3 are an example of a transmissive configuration. In the transmissive configuration, the first wavelength converter 1A receives the primary light 3B at a front surface 1Aa and radiates the fluorescence from a back surface 1Ab, and the second wavelength converter 2A receives the primary light 3B and first wavelength-converted light 1B at a front surface 2Aa and radiates the fluorescence from a back surface 2Ab.

In such a transmissive configuration, it is easy for the second mixed light 24, which is constituted by mixed light components of the first light component 5, the second light component 6, and the third light component 7, to be output from the same output surface of the second wavelength converter 2A as the output light 4. Therefore, according to this transmissive configuration, a light emitting device 10 suitable for the miniaturization of the light output surface can be obtained.

In the light emitting device 10, the primary light 3B emitted by the solid-state light emitting element 3 is used to irradiate the first wavelength converter 1A, and the first transmitted primary light $3BT_1$ that has passed through the first wavelength converter 1A is used to irradiate the wavelength converter of the second wavelength converter 2A.

In the light emitting device 10 with the transmissive configuration, both the first wavelength converter 1A and the second wavelength converter 2A have light transparency. That is, in the light emitting device 10, the primary light 3B and the first wavelength-converted light 1B pass through the first wavelength converter 1A, and the first transmitted primary light $3BT_1$ and the transmitted first wavelength-converted light $1BT_2$ pass through the second wavelength converter 2A. Then, in the light emitting device 10, the second wavelength converter 2A radiates, as the output light 4, the second mixed light 24, which is mixed light of the second transmitted primary light $3BT_2$, the transmitted first wavelength-converted light $1BT_2$, and the second wavelength-converted light 2B.

With such a configuration, a light emitting device 10 suitable for miniaturization can be obtained because it is easy to design the device such that a light output surface emitting the output light 4 is included in the range of the horizontal projection with the larger area from between horizontal projections of the first wavelength converter 1A and the second wavelength converter 2A.

In the light emitting device 10, it is preferable that the gap between the first wavelength converter 1A and the second wavelength converter 2A be large. The gap between the first wavelength converter 1A and the second wavelength converter 2A is more than 1 mm, preferably more than 3 mm, and more preferably more than 10 mm, for example. However, from the viewpoint of miniaturization of the light emitting device 10, the gap between the first wavelength converter 1A and the second wavelength converter 2A is less than 10 cm, and preferably less than 3 cm, for example.

With such a configuration, the primary light 3B with directivity is scattered by the first wavelength converter 1A, and light diffused by a further distance is radiated on the second wavelength converter 2A. Therefore, it is possible to obtain a light emitting device 10 suitable for achieving both the homogeneous high output of a near-infrared light component and a large area of the light output surface.

In the light emitting device 10, it is preferable that the first wavelength converter 1A be thick. The thickness of the first wavelength converter 1A is more than 100 μm, and preferably more than 300 μm, for example. The first wavelength converter 1A can be thicker than the second wavelength converter 2A. However, from the viewpoint of miniaturization of the light emitting device 10, the thickness of the first wavelength converter 1A is less than 3 mm, and preferably less than 1 mm, for example.

With such a configuration, the primary light 3B with directivity is easily scattered by the first wavelength converter 1A, and the scattered light is used to irradiate the second wavelength converter 2A. Therefore, it is possible to obtain a light emitting device 10 suitable for achieving both the homogeneous high output of a near-infrared light component and a large area of the light output surface.

Improved Example of Light Emitting Device

An improved example for an improvement in performance and the like of the present embodiment will be described below.

The light emitting device 10 can easily increase the absolute number of photons constituting the output light 4 by means such as using a high output type of the solid-state light emitting element 3 or increasing the number of light emitting elements.

An example of this kind of light emitting device 10 is a light emitting device 10 in which the light energy of light components of the output light 4 with a wavelength of 700 nm or more is usually more than 3 W, preferably more than 10 W, and more preferably more than 30 W.

With such a configuration, since it is possible to irradiate an object with relatively intense near-infrared light, it is possible to obtain a light emitting device 10 that can irradiate an object with relatively intense near-infrared light even if the distance from the irradiated object is large. With such a configuration, it is possible to obtain a light emitting device 10 that can easily obtain information on an object to be irradiated even if the object to be irradiated is small or a thick.

The light emitting device 10 can increase the photon density supplied to a phosphor included in a wavelength converter by means such as using, as the solid-state light emitting element 3, a light emitting element that emits primary light having a high light density, such as a laser diode, or by using an optical lens to condense the light emitted by the light emitting element, for example.

With such a configuration, it is possible to obtain a light emitting device 10 in which the light energy density of the primary light 3B with which the first wavelength converter 1A is irradiated is usually more than 0.3 W/mm², preferably more than 1.0 W/mm², and more preferably more than 3.0 W/mm².

With such a configuration, since it is possible to obtain a light emitting device 10 that can emit output light 4 with a high light energy density, it is possible to obtain a light emitting device 10 that is capable of point output of near-infrared light with a high light energy density, for example.

If a light emitting element such as a laser diode that emits high light density primary light is used, it is possible to increase the light energy density of the primary light emitted by the solid-state light emitting element 3. With such a configuration, it is possible to obtain a light emitting device 10 in which the light energy density is more than 0.3 W/mm², preferably more than 1.0 W/mm², and more preferably more than 3.0 W/mm², for example.

Therefore, with such a configuration, a light emitting device 10 that emits a relatively intense near-infrared light component can be obtained even if a configuration is adopted in which the first wavelength converter 1A is irradiated with optically diffused primary light. If a configuration is adopted in which the first wavelength converter 1A is directly irradiated with primary light that is not optically diffused, a light emitting device 10 that emits the output light 4 with a relatively high light energy density can be obtained. With such a configuration, it is possible to obtain a light emitting device 10 that can irradiate a large area with near-infrared light using a light emitting element with a small light output surface. Moreover, with the above configuration, it is possible to obtain a light emitting device 10 suitable for irradiating an object with near-infrared light with a high light energy density.

In the light emitting device 10, the output light 4 can be adjusted by selecting an appropriate solid-state light emitting element. By selecting an appropriate solid-state light emitting element, it is possible to obtain a light emitting device 10 in which the intensity of a light component in a ultraviolet to blue wavelength range with a wavelength shorter than 440 nm is less than 3%, and preferably less than 1%, of the maximum fluorescence intensity, for example.

This kind of configuration results in output light 4 in which the intensity of the light component in the ultraviolet to blue wavelength range is close to 0, to which a photoresist is easily sensitive. Therefore, it is possible to obtain a light emitting device 10 that emits near-infrared light which is suitable for semiconductor-related inspection work and suitable for use in a yellow room, for example.

The light emitting device 10 may include a light distribution control mechanism that controls light distribution characteristics, for example. If this kind of configuration is adopted, it is possible to obtain a light emitting device 10 that is suitable for obtaining output light having desired light distribution characteristics such as a variable light distribution type of lighting system for in-vehicle use, for example.

The light emitting device 10 may have a variable output intensity mechanism that changes the intensity of near-infrared light such as an input power control device, for example. If this kind of configuration is adopted, it is possible to obtain a light emitting device 10 suitable for inspecting food products, drugs, and the like, which are easily damaged by near-infrared irradiation.

Further, the light emitting device 10 may also have a control mechanism for controlling the output ratio of the light component of the second wavelength-converted light 2B and especially for performing ON-OFF control. If this kind of configuration is adopted, it is possible to control the output ratio of the near-infrared light, and therefore it is possible to obtain a light emitting device 10 suitable for adjusting the intensity of the near-infrared light output to that desired by the customer.

Further, the light emitting device 10 may alternately output the output light 4 that includes a light component of the second wavelength-converted light 2B and output light 4 that does not include the light component. If this kind of configuration is adopted, it is possible to obtain a light emitting device 10 that allows the visibility according to the human eye and the visibility according to an electronic eye (sensor) to be confirmed while alternately switching therebetween. This eliminates interference between the visibility according to the human eye and the visibility according to the electronic eye, and it is possible to obtain a light emitting device 10 suitable for clarifying the visibility regardless of which eye is used.

The light emitting device 10 may have a variable mechanism that changes the fluorescence peak wavelength of a light component having a maximum fluorescence intensity in a wavelength range of 700 nm or more and less than 2500 nm, for example.

If this kind of configuration is adopted, it is possible to obtain a light emitting device 10 that has high versatility and can be easily adapted to miscellaneous uses. In addition, since the penetration depth of light into the inside of the irradiated object varies depending on the wavelength, it is possible to obtain a light emitting device 10 suitable for inspections in the depth direction of the irradiated object.

Such a control mechanism for near-infrared light and a variable mechanism for the fluorescence peak wavelength can be realized by the light emitting device 10 having an optical filter such as a bandpass filter and a low-cut filter, for example. In this case, the following can be used: a structure in which the output light 4 passes through an optical filter selected according to the application and is output, or a structure in which the light is interrupted by the selected optical filter.

The light emitting device 10 may have a light control mechanism that controls the output of not only the near-infrared light component but also at least part of the wavelength component of the output light 4, and the control includes ON-OFF control. Even with such a configuration, it is possible to obtain a light emitting device 10 that has high versatility and can be easily adapted to miscellaneous uses The light emitting device 10 can use the output light 4 as pulsed light.

One example of the half width of an irradiation time of the pulsed light is less than 300 ms, and the larger the magnitude of the output intensity of the output light 4 or the third light component 7 (near-infrared light component), the shorter it can be. As the half width, for example, an appropriate half width selected from less than 100 ms, less than 30 ms, less than 10 ms, less than 3 ms, and less than 1 ms can be selected according to the output intensity.

In addition, one example of a non-irradiation time of the pulsed light is 1 ms or longer and shorter than 10 seconds.

In this regard, it is reported that the human eye perceives light at 50 to 100 Hz (period of 20 to 10 ms) as flicker. Furthermore, it is reported that birds such as pigeons perceive light at 150 Hz (period of 6.7 ms) as flicker, and insects such as flies perceive light at approximately 300 Hz (period of 3.3 ms) as flicker. Therefore, if the non-irradiation time of the pulsed light is 1 ms or longer and shorter than 10 seconds, one preferred light emitting device 10 with a non-irradiation time of less than 30 ms is obtained with which these creatures, including humans, do not perceive the flicker.

Meanwhile, intense light irradiation has the risk of damaging the irradiated object. For this reason, for uses where it is not necessary to be concerned about flicker, it is preferable to use a light emitting device 10 in which the non-irradiation time of the pulsed light is 100 ms or more, and preferably 300 ms or more.

The light energy of the output light 4, which is preferable for the cosmetic purpose of adjusting the growth of human hair and body hair, is 0.01 J/cm$^2$ or more and less than 1 J/cm$^2$. If a portion near the hair root is irradiated with such light energy, the melanin or the like present inside the skin can absorb the light, and the growth of hair or the like can be adjusted. At a lower energy, it becomes difficult to confirm the effect of the growth adjustment of hair or the like by means of light irradiation, and at a higher energy, there are concerns about other effects on the human body.

To eliminate such concerns, the preferred $1/10$ afterglow time of the output light 4 (the time until the light intensity immediately before the light turns off decreases in intensity to $1/10$) is less than 100 µs, preferably less than 10 µs, and particularly less than 1 µs. Accordingly, it is possible to obtain a light emitting device 10 that can be turned on and off instantaneously.

The light emitting device 10 may further include an ultraviolet light source that emits ultraviolet light with a maximum intensity in a wavelength range of 120 nm or more and less than 380 nm, and preferably 250 nm or more and less than 370 nm. With such a configuration, a light emitting device 10 that also has a sterilizing effect by means of ultraviolet light and the like can be obtained.

The light emitting device 10 may further include a conventionally known general lighting device. With such a configuration, the device becomes an orthodox lighting device with a function of outputting near-infrared light, and it is possible to obtain a light emitting device 10 of which the main function is general lighting. A typical example of a conventionally known general lighting device is a lighting device formed by combining a solid-state light emitting element with a phosphor. Specific examples thereof include a lighting device formed by combining a blue LED with a Ce$^{3+}$ activated garnet phosphor as a green or yellow phosphor, and a lighting device that uses a Eu$^{2+}$ activated nitride phosphor or a Eu$^{2+}$ activated oxynitride phosphor as a red phosphor.

The light emitting device 10 emitting a near-infrared light component can be a medical or biotechnological light source or lighting device. The light emitting device 10 emitting a near-infrared light component can be a medical light emitting device, preferably used in either a fluorescence imaging method or photodynamic therapy. The light emitting device 10 emitting a near-infrared light component can be a biotechnological light emitting device, preferably used for inspection, analysis, and the like of cells, genes, specimens, and the like.

According to the light emitting device 10 emitting a near-infrared light component, it is possible to obtain a light emitting device 10 which can be used for observation or treatment of a diseased part from inside or outside the body, or biotechnology by using a near-infrared light component having the property of passing through living organisms, cells, and the like.

The light emitting device 10 emitting a near-infrared light component can be used as a light source for a sensing system or a lighting system for a sensing system.

With such a configuration, it is possible to obtain a light emitting device 10 which can be used for performing inspections in an unopened state, or for monitoring animals and plants including humans, and irradiated objects by using, for example, a near-infrared light component having the property of passing through organic substances and the like, or a near-infrared invisible light component that is reflected by objects. Here, inspection in an unopened state means inspection in an unopened state for irradiated objects, foreign substances, and the like in bags, containers, and the like made of organic materials that do not have translucency.

<Electronic Apparatus>

Forth to Tenth Embodiments

Figure 5:
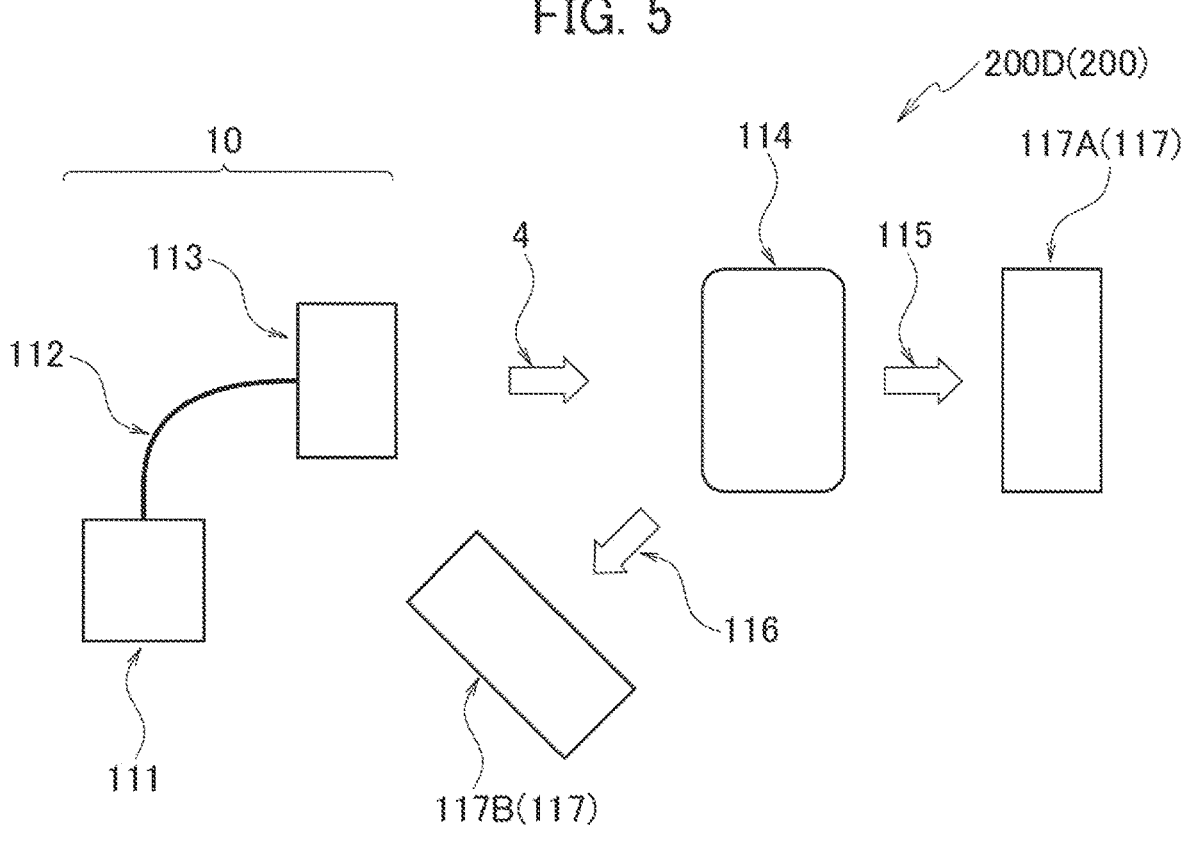
FIG. 5 is a diagram showing an example of an electronic apparatus according to a fourth embodiment.

FIG. 5 is a conceptual diagram showing an electronic apparatus according to a fourth embodiment. An electronic apparatus 200D (200) according to the first embodiment shown in FIG. 5 has the light emitting device 10.

In FIG. 5, the light emitting device 10 has at least a power source circuit 111, a conductor 112, and a light emitting part 113. The light emitting part 113 corresponds to the light emitting devices 10A to 10C shown in FIGS. 1 to 3. FIGS. 1 to 3 do not show members corresponding to the power source circuit 111, conductor 112, and the like in FIG. 5. The light emitting device 10 shown in FIG. 5 includes the power source circuit 111 and conductor 112 in addition to the light emitting part 113 corresponding to the light emitting devices 10A to 10C shown in FIGS. 1 to 3.

The power source circuit 111 is a member that supplies power to the light emitting part 113, and supplies electrical energy to the light emitting part 113 through the conductor 112.

The light emitting part 113 is a member that converts electrical energy to light energy, converts at least part of the electrical energy supplied from the power source circuit to light energy including near-infrared light, and outputs it as output light 4. As described above, the light emitting part 113 corresponds to the light emitting devices 10A to 10C shown in FIGS. 1 to 3.

A first detector 117A (117) is a member that detects at least a transmitted light component 115 of near-infrared light in the output light 4 that is radiated from the light emitting part 113 of the light emitting device 10 and is used to irradiate the irradiated object 114.

A second detector 117B (117) is a member that detects a light component including at least a reflected light component 116 of near-infrared light in the output light 4 that is radiated from the light emitting part 113 of the light emitting device 10 and is used to irradiate the irradiated object 114.

In the electronic apparatus 200D having the above configuration, first, the irradiated object 114 is irradiated with the output light 4 including at least a near-infrared light component. Next, in the electronic apparatus 200D, either the transmitted light component 115 that has passed through the irradiated object 114 or the reflected light component 116 reflected by the irradiated object 114 is detected by either the first detector 117A or the second detector 117B. For this reason, according to the electronic apparatus 200D, it is possible to sense or detect characteristic information on the irradiated object 114 in which the near-infrared light component is involved.

The electronic apparatus 200D includes the light emitting device 10 as described above.

As described above, the light emitting device 10 achieves both high output of the near-infrared light component and a large area of the light output surface, and emits output light 4 having visible and near-infrared light components suitable for both the human eye and a detector. Therefore, if the light emitting device 10 is used, it is possible to obtain an electronic apparatus 200D suitable for industrial applications and the like, which is used in combination with a detector of near-infrared light.

The light emitting device 10 may have a configuration in which energy of the output light 4 is large and a wide range is irradiated with the light. In the electronic apparatus 200D with such a configuration, it is possible to detect a signal with a good S/N even if the irradiated object 114 is irradiated from a distance. With such a configuration, it is possible to obtain an electronic apparatus 200D suitable for inspection of a large irradiated object 114, the batch inspection of irradiated objects distributed over a wide area, the detection of irradiated objects present in part of an inspection area covering a wide area, detection of people and irradiated objects from a distance, and the like.

The area of a main light extraction surface of the light emitting part 113 constituting the light emitting device 10 is 1 cm$^2$ or more and less than 1 m$^2$, and preferably 10 cm$^2$ or more and less than 1000 cm$^2$, for example.

The shortest distance from the surface of the light emitting part 113 to the surface of the irradiated object 114 is 1 mm or more and less than 10 m, for example. In addition, in applications where it is necessary to irradiate the irradiated object 114 with intense near-infrared light (for example, medical, cosmetic, and delicate foreign substance inspections), the above shortest distance is 1 mm or more and less than 30 cm, and particularly 3 mm or more and less than 10 cm, for example. Furthermore, in applications where it is necessary to inspect the irradiated object 114 over a wide range, the above shortest distance is 30 cm or more and less than 10 m, and preferably 1 m or more and less than 5 m.

In applications where it is necessary to irradiate over a wide range with intense near-infrared light (for example, delicate inspection or the like of a large irradiated object or irradiated objects over a wide range), it is preferable that at least the light emitting part 113 be a movable structure. With such a configuration, it is possible to obtain an electronic apparatus 200D with a preferred structure that is freely movable according to the form of the irradiated object. A more specific aspect of the electronic apparatus 200D is an electronic apparatus 200J (200) of the form shown in FIG. 11 and the like.

Figure 11:
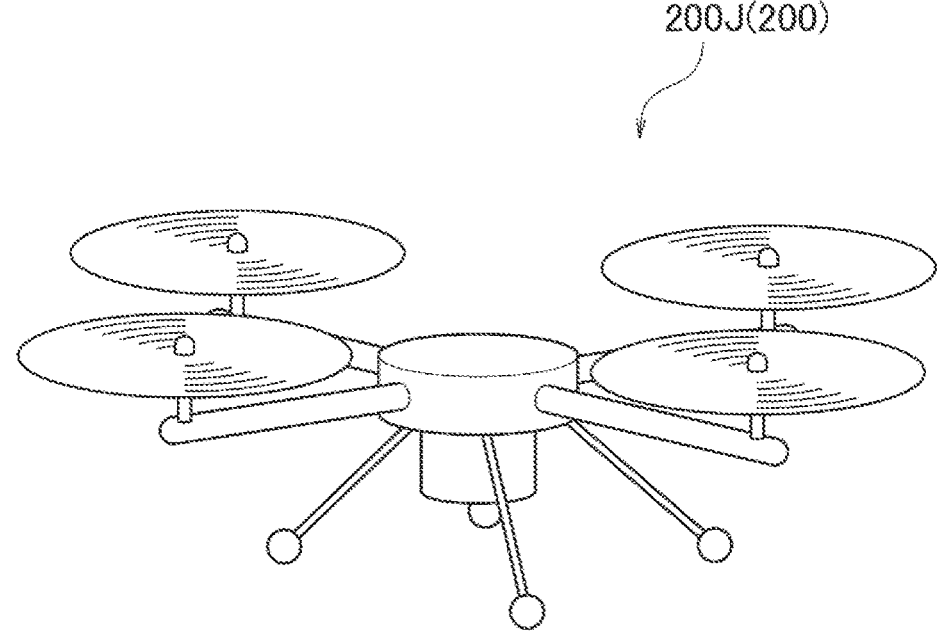
FIG. 11 is a diagram showing an example of an electronic apparatus according to a tenth embodiment.

Examples of an electronic apparatus 200D with a movable structure include an electronic apparatus 200D with a structure in which the light emitting part 113 can come and go on a straight or a curved line, and an electronic apparatus 200D with a structure in which the light emitting part 113 can scan in the XY axial directions or the XYZ directions, for example. Another example of an electronic apparatus 200D with a movable structure is an electronic apparatus 200D with a structure attached to a mobile body (automobile, bicycle, or flying body such as a drone) or the like. FIG. 11 shows the electronic apparatus 200J when the electronic apparatus 200D is in the form of a drone.

Various kinds of photodetectors can be used as the first detector 117A and the second detector 117B. As the first detector 117A and the second detector 117B, an appropriate selection is made from a quantum-type photodetector (photodiode, phototransistor, photo IC, CCD image sensor, CMOS image sensor, or the like) that detects the charge generated when light enters a PN junction of a semiconductor, a thermal-type photodetector (thermopile using the thermoelectric effect, pyroelectric element using the pyroelectric effect, or the like) that detects change in an electrical property caused by a temperature increase due to heat generated when light is received, an infrared film that is sensitive to light, and the like, for example.

In addition, as the first detector 117A and the second detector 117B, a single element using a single photoelectric conversion element may be used, or an imaging element having an integrated photoelectric conversion element may be used. The imaging element may have a linear form disposed in one dimension, or may have a planar form disposed in two dimensions. An imaging camera (including a hyperspectral camera) may be used as the first detector 117A and the second detector 117B, for example. The electronic apparatus 200D can be used as any one of an inspection device, detection device, monitoring device, and sorting device for the irradiated object 114 using the output light 4 having a near-infrared light component.

Figure 6:
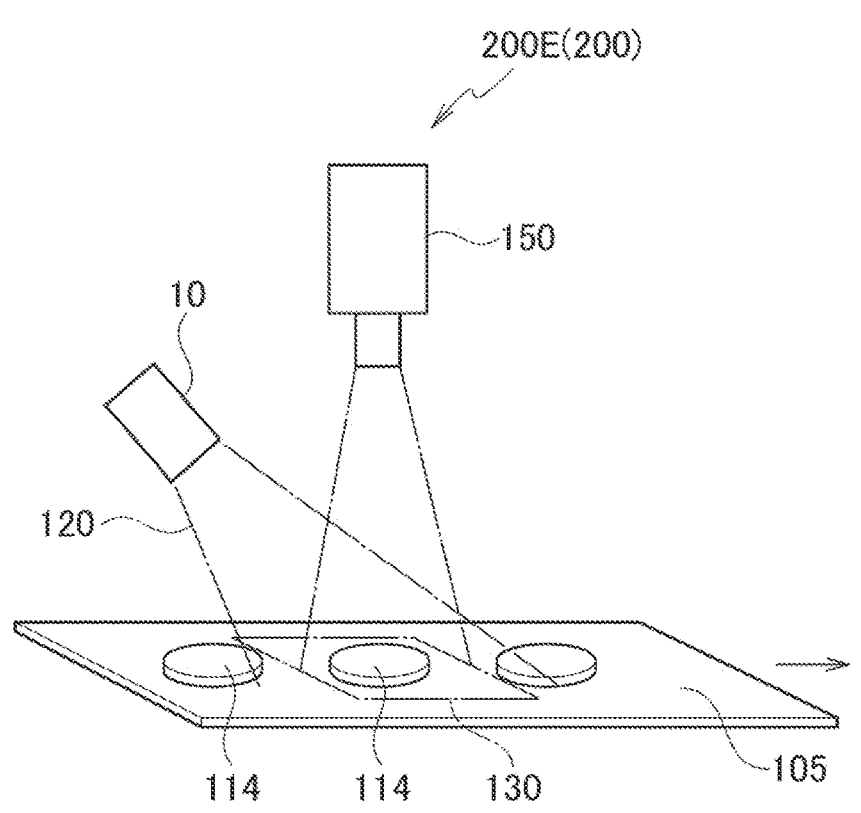
FIG. 6 is a diagram showing an example of an electronic apparatus according to a fifth embodiment.

Since the near-infrared light component of the output light 4 has the property of passing through most substances, the device can be configured to irradiate an object with near-infrared light from outside the substance and detect the transmitted or reflected light. This provides an electronic apparatus 200D that can inspect or detect the internal state, the presence or absence of foreign substances, and the like without destroying the substance. A specific example of the electronic apparatus 200D suitable for such applications is shown in FIG. 6 as an electronic apparatus 200E. That is, FIG. 6 is a diagram showing an example of an electronic apparatus according to the fifth embodiment.

The electronic apparatus 200E shown in FIG. 6 includes a belt conveyor 105 on which irradiated objects 114 are placed and moved, a light emitting device 10 for irradiating the irradiated object 114 with irradiation light 120, and a hyperspectral camera 150 for capturing an image of an area 130 on the belt conveyor 105. The irradiation light 120 is the output light 4 radiated by the light emitting device 10.

The action of the electronic apparatus 200E will be briefly described. First, the irradiation light 120 is radiated from the light emitting device 10 to the irradiated object 114. Next, the hyperspectral camera 150 acquires image data by capturing an image of the area 130 on the belt conveyor 105 where the irradiation light 120 is radiated. The obtained image data is used for various applications such as observation and analysis, either as it is or by being processed by a computer (not shown) or the like.

In addition, the near-infrared light component is invisible to the human eye, and reflection characteristics thereof depend on the substance. Therefore, by having a device configuration in which the irradiated object is irradiated with near-infrared light and reflected light thereof is detected, it is possible to obtain an electronic apparatus 200D that can detect or monitor people, animals and plants, the irradiated object, and the like in the dark without being noticed by a human.

Further, if the near-infrared light component is used, it is possible to inspect or detect the internal state of a substance and the presence or absence of foreign substances without destroying the substance and to determine the quality of the substance. For this reason, if the irradiated object is irradiated with the near-infrared light component, an electronic apparatus 200D can be obtained that can select good-quality products and defective products. Moreover, if an electronic apparatus 200D is used which further has a mechanism of removing an object for which either a normal state or an abnormal state is detected from among the irradiated objects 114 (inspection targets), an electronic apparatus 200D suitable for selecting and sorting irradiated objects can be obtained.

In the electronic apparatus 200D, it is also possible for the light emitting device 10 to be fixed without being made movable.

With such a configuration, an electronic apparatus 200D can be obtained which is less likely to cause a malfunction because the apparatus does not have a complicated mechanism for mechanically moving the light emitting device.

In addition, if the electronic apparatus 200D is fixed indoors or outdoors, for example, it becomes possible to observe the state of people and irradiated objects (flying objects, mobile bodies, and the like) in a predetermined location from a fixed point and to count the number of people or irradiated objects. Therefore, with such a configuration, it is possible to obtain an electronic apparatus 200D suitable for collecting big data that is useful for discovering problems, for business applications, and the like.

Figure 7:
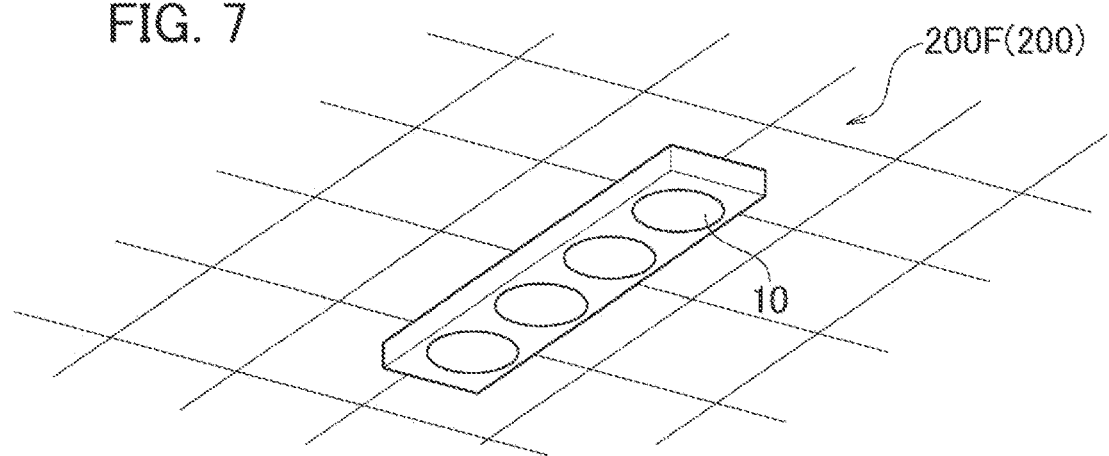
FIG. 7 is a diagram showing an example of an electronic apparatus according to a sixth embodiment.
Figure 8:
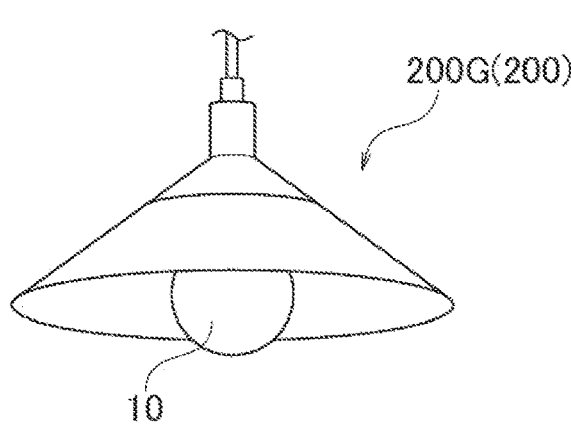
FIG. 8 is a diagram showing an example of an electronic apparatus according to a seventh embodiment.
Figure 9:
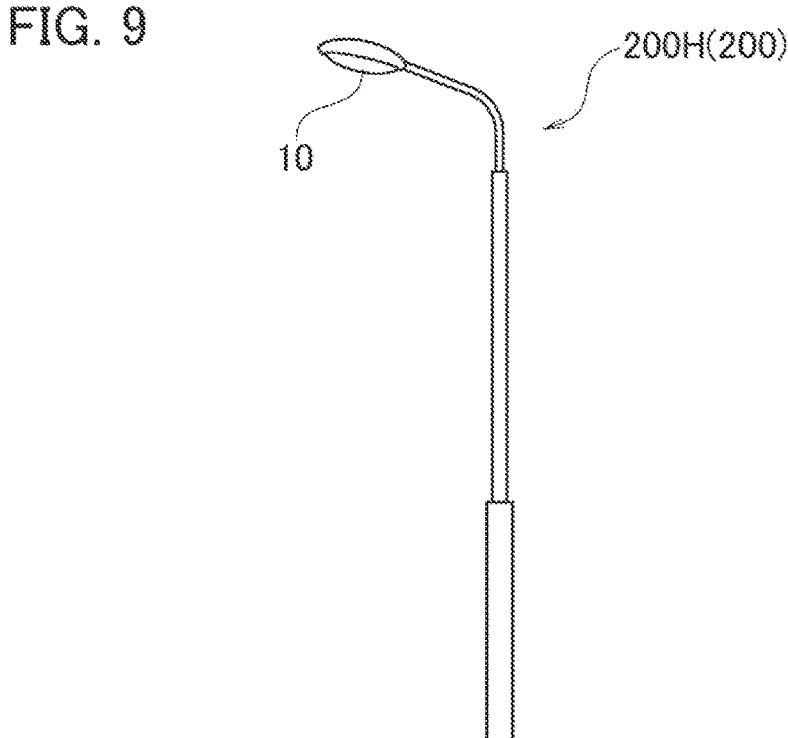
FIG. 9 is a diagram showing an example of an electronic apparatus according to an eighth embodiment.
Figure 10:
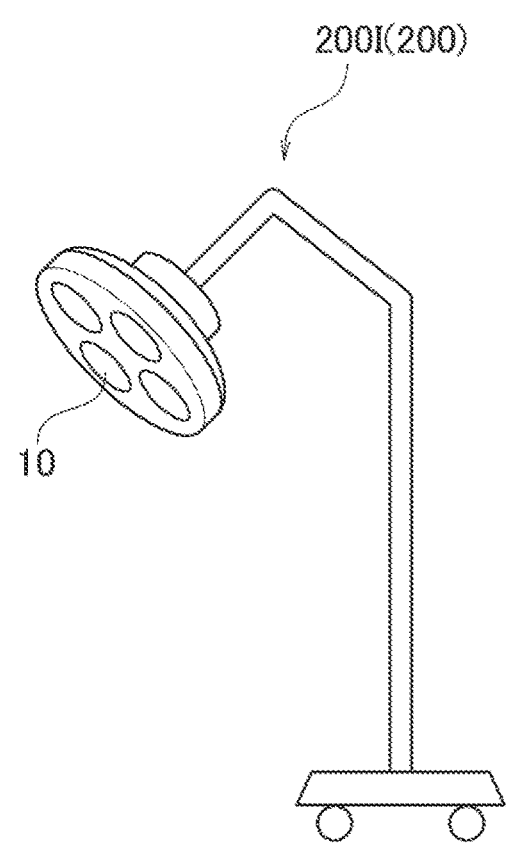
FIG. 10 is a diagram showing an example of an electronic apparatus according to a ninth embodiment.

Specific examples of the electronic apparatus 200D suitable for such applications are shown as an electronic apparatus 200E in FIG. 7, an electronic apparatus 200F in FIG. 8, an electronic apparatus 200G in FIG. 9, an electronic apparatus 200I in FIG. 10, and an electronic apparatus 200J in FIG. 11. FIG. 7 shows an example of an electronic apparatus according to the sixth embodiment. FIG. 8 shows an example of an electronic apparatus according to the seventh embodiment. FIG. 9 shows an example of an electronic apparatus according to the eighth embodiment. FIG. 10 shows an example of an electronic apparatus according to the ninth embodiment. FIG. 11 shows an example of an electronic apparatus according to the tenth embodiment.

The electronic apparatus 200D can be movable. The electronic apparatus 200D can be movable as a structure attached to a mobile stage or a mobile body (vehicle, flying body, or the like), for example. A specific example of the electronic apparatus 200D suitable for such applications is shown in FIG. 11 as the electronic apparatus 200J.

With such a configuration, since the light emitting device 10 constituting the electronic apparatus 200D can irradiate a desired place or a wide area, it is possible to obtain an electronic apparatus 200D suitable for inspection of a large irradiated object or inspection of the state of an irradiated object outdoors.

The electronic apparatus 200D can further have a hyperspectral camera. With such a configuration, an electronic apparatus 200D that can perform hyperspectral imaging can be obtained. This kind of electronic apparatus 200D can distinguish differences that may not be distinguished by the naked eye or a normal camera as an image, and becomes a useful inspection device in a wide range of fields related to product inspection, selection, and the like.

The electronic apparatus 200D preferably has a data processing system that performs machine learning. If this kind of configuration is adopted, it becomes possible to iteratively learn data imported into a computer and to discover patterns hidden therein. Furthermore, it also becomes possible to adapt newly captured data to those patterns. Therefore, it is possible to obtain an electronic apparatus 200D suitable for implementing automation and achieving higher accuracy in inspection, detection, monitoring, and the like, and also for future prediction using big data.

The electronic apparatus 200D can be used as any one of medical uses, veterinary uses, biotechnology uses, agriculture, forestry, and fishery industry uses, livestock industry uses (meat, meat products, dairy products, and the like), and manufacturing industry uses (foreign substance inspection, content quantity inspection, shape inspection, packaging state inspection, and the like). In addition, the electronic apparatus 200D can be used for inspection of any one of pharmaceutical products, animal testing, food products, beverages, agriculture, forestry, and fishery products, livestock products, and industrial products.

The electronic apparatus 200D can also be used on any of the human body, animals and plants, and objects, and in addition can also be used on any of gases, liquids, and solids.

A preferred form of the electronic apparatus 200D is any one of a medical device, a treatment device, a beauty device, a health device, a care-related device, an assay device, a measurement device, and an evaluation device.

The electronic apparatus 200D used for medical and biotechnology development purposes will be used, for example, for the inspection, detection, measurement, evaluation, assay, analysis, observation, monitoring, separation, diagnosis, treatment, purification, and the like of the irradiated objects listed below. Specifically, these include the inspection of blood, body fluids, and their components, the inspection of excretions (urine and feces); the inspection of proteins and amino acids; the inspection of cells (including cancer cells); the inspection of genes, chromosomes, and nucleic acids; the inspection of biological samples, bacteria, specimens, and antibodies; the inspection of biological tissue, organs, and blood vessels; and the inspection of skin diseases and alopecia.

For beauty and health care purposes, the electronic apparatus 200D will be used, for example, for inspection, detection, measurement, evaluation, assay, analysis, observation, monitoring, beautification, sanitation, growth promotion, health promotion, diagnosis, and the like of the irradiated objects listed below. Specific examples include the observation of skin; the observation of hair and body hair; the observation of oral, endodontic, and periodontal conditions: the inspection of ears and nose; and the measurement of vital signs.

For purposes of the agriculture, forestry, and fishery industry, the livestock industry, or the manufacturing industry, the electronic apparatus 200D will be used for inspection, detection, measurement, quantification, evaluation, assay, analysis, observation, monitoring, recognition, selection, sorting, and the like of the irradiated objects listed below. Specific examples includes the inspection of industrial products (including electronic members and electronic devices); the inspection of agricultural products (such as fruits and vegetables); the detection of enzymes and bacteria; the inspection of marine products (fish, shellfish, crustaceans, and mollusks); the inspection of pharmaceutical products and biological samples; the inspection of food products and beverages; the observation of the presence and state of people, animals, and irradiated objects; the observation of the state of gases (including water vapor); the inspection of liquids, fluids, water, moisture, and humidity; the observation of the shape, color, internal structure, and physical state of irradiated objects; the measurement of space, position, and distance; the observation of the contamination state of irradiated objects; the observation of the state of molecules and particles; and the observation of industrial waste.

For caregiving purposes, the electronic apparatus 200D is used to confirm excretion and for the identification, management, monitoring, and the like of health conditions, for example.

In this way, the electronic apparatus 200D can be used for all kinds of uses such as inspection, detection, measurement, quantification, evaluation, assay, analysis, observation, monitoring, recognition, selection, and sorting.

The present embodiment can be applied to a simple method of any one of an inspection method, a detection method, a monitoring method, a sorting method, an analysis method, a measurement method, and an evaluation method using the light emitting device 10.

Although the contents according to the present embodiment have been described above, it is obvious to those skilled in the art that the present embodiment is not limited to these descriptions and that various modifications and improvements are possible.

EXAMPLES

A more detailed description will be given below of the light emitting device of the present embodiments by means of examples; however, the present embodiments are not limited thereto.

Example 1

First, the first wavelength converter 1A was fabricated. As the first wavelength converter 1A, a phosphor sheet was used which is formed of a resin phosphor film having a phosphor emitting yellow-green light with a fluorescence peak near 540 nm and a phosphor emitting red light with a fluorescence peak near 625 nm. As the phosphor emitting yellow-green light with a fluorescence peak near 540 nm, a $Y_3Al_2(AlO_4)_3$:$Ce^{3+}$ (YAG) phosphor (manufactured by TOKYO KAGAKU KENKYUSHO CO., LTD., central particle size $D_{50}$~24 μm) was used. As the phosphor emitting red light with a fluorescence peak near 625 nm, a (Sr, Ca)$AlSiN_3$:$Eu^{2+}$ (SCASN) phosphor (manufactured by Mitsubishi Chemical Corporation, central particle size $D_{50}$~ 14 μm) was used.

The fabrication procedure of the first wavelength converter 1A will be described below. The above-described YAG phosphor and SCASN phosphor were prepared as phosphor powders. A two-liquid mixing type thermosetting silicone resin (product name: KER-2500 A/B, Shin-Etsu Chemical Co., Ltd.) was also prepared as a sealant for the phosphor powder.

Next, the YAG phosphor (0.493 g) and SCASN phosphor (0.013 g), and a silicone resin (0.75 g of agent A and 0.75 g of agent B) were mixed and defoamed (about 2000 rpm, three minutes) to fabricate a phosphor paste made of the phosphor and silicone resin. The mixing and defoaming treatment was performed using a product having the name AWATORI RENTARO (model: ARE-310, manufactured by Shinki Corporation).

The resulting phosphor paste was dropped into a mold provided on a glass substrate (200 mm×200 mm×t1 mm) using a dispenser (model: ML-5000XII, manufactured by Musashi Engineering Inc.). The surface of the dropped phosphor paste was then smoothed and flattened using a squeegee. The first wavelength converter 1A was obtained by removing the mold, performing heating and curing in air at 150° C. for 2 hours to form a phosphor sheet, and peeling the phosphor sheet from the glass substrate using tweezers. The first wavelength converter 1A had a size of 5 mm×6 mm and a thickness of 130 μm.

Just to be sure, the fluorescence characteristics of the first wavelength converter 1A were evaluated using an absolute PL quantum yield spectrometer under photoexcitation at 450 nm, and as a result, the internal quantum efficiency (IQE) was 93%, the light absorption rate (Abs.) was 28%, and the fluorescence peak wavelength was 598 nm.

Next, the second wavelength converter 2A was fabricated. The second wavelength converter 2A was a phosphor sheet serving as a resin phosphor film containing a phosphor that has a fluorescence peak near 750 nm, is activated by $Cr^{3+}$, and is mainly composed of a composite metal oxide (own product). The phosphor is a $(Gd,La)_3Ga_2(GaO_4)_3$:$Cr^{3+}$ (GLGG) phosphor expressed by the composition formula of $(Gd_{0.95}La_{0.05})_3(Ga_{0.97}Cr_{0.03})_2(GaO_4)_3$ and has a garnet-type crystal structure.

The fabrication procedure of the GLGG phosphor will be described below.

The GLGG phosphor was prepared by means of an orthodox solid phase reaction using the following compound powders as the main raw materials.

Gadolinium oxide ($Gd_2O_3$): purity 3N, NIPPON YTTRIUM CO., LTD.

Lanthanum hydroxide (La (OH)$_3$): purity 3N, Shin-Etsu Chemical Co., Ltd.

Gallium oxide ($Ga_2O_3$): purity 4N, Nippon Rare Metal, Inc.

Chromium oxide ($Cr_2O_3$): purity 3N, Kojundo Chemical Lab. Co., Ltd.

Specifically, the above raw materials were first weighed to produce a compound of a stoichiometric composition $(Gd_{0.95}La_{0.05})_3(Ga_{0.97}Cr_{0.03})_2(GaO_4)$: by means of a chemical reaction. The weighed values are shown in Table 1.

TABLE 1

| General formula | Blending amount of raw material (g) | | | |
| --- | --- | --- | --- | --- |
| | $Gd_2O_3$ | La(OH)$_3$ | $Ga_2O_3$ | $Cr_2O_3$ |
| $(Gd_{0.95}La_{0.05})_3$ $(Ga_{0.97}Cr_{0.03})_2Ga_3O_{12}$ | 10.213 | 0.563 | 9.154 | 0.090 |

Next, 20 g of the weighed raw materials were fed into an alumina pot mill (250 ml capacity) together with alumina balls (diameter ¢ 3 mm, total 200 g) and 60 ml of ethanol. The raw materials were then wet-mixed by rotating the pot mill at a rotation speed of 150 rpm for 30 minutes using a planetary-type ball mill (manufactured by FRITSCH GmbH, product number P-5).

The alumina balls were then removed using a sieve and a slurry-like mixed raw material containing raw materials and ethanol was obtained. Then, the slurry-like mixed raw materials were fully dried at 125° C. using a dryer. The dried mixed raw materials were then lightly mixed using a mortar and pestle to make phosphor raw materials.

Next, the phosphor raw materials were put in an alumina calcining vessel (material SSA-H, size B3, with lid) and calcined for 2 hours in air at 1500° C. using a box-shaped electric furnace. The heating/cooling rate during calcining was set at 300° C./h.

The resulting fired product was crushed by hand using an alumina mortar and pestle, and then passed through a nylon mesh (95 μm of mesh opening) to remove coarse particles, and accordingly a powdery GLGG phosphor was obtained.

Although data is omitted, a crystal composition of the obtained GLGG phosphor was evaluated using an X-ray diffractometer (desktop X-ray diffractometer, MiniFlex (registered trademark), manufactured by Rigaku Corporation), and it was mostly a garnet compound of a single crystal phase. The particle shape and particle size were also evaluated using an electron microscope (desktop microscope Miniscope™4000, manufactured by Hitachi High-Tech Corporation). As a result, the particle form was a monodisperse particle shape, the particle shape was a shape that could be regarded as derived from gamet crystals, and the main particle size was around 15 μm. Then, the fluorescence characteristics of the GLGG phosphor were evaluated under irradiation with blue light at a wavelength of 450 nm using an absolute PL quantum yield spectrometer (C9920-02, manufactured by Hamamatsu Photonics K.K.). As a result, the fluorescence peak wavelength was 747 nm, the internal quantum efficiency (IQE) was 92%, and the light absorption rate (Abs.) of blue light was 57%. The fluorescence peak wavelength was 746 nm, the internal quantum efficiency (IQE) was 93%, and the light absorption rate (Abs.) of red light was 45% when evaluated under the irradiation condition of red light with a wavelength of 628 nm.

Using the GLGG phosphor (4.57 g) fabricated in this way and a mold with a different thickness, the second wavelength converter 2A (size: 10 mm×10 mm, thickness: 265 μm) was fabricated in the same manner as the first wavelength converter 1A.

Just to be sure, the fluorescence characteristics of the second wavelength converter 2A were evaluated using the absolute PL quantum yield spectrometer described above under the photoexcitation condition of 450 nm, and as a result, the internal quantum efficiency (IQE) was 90%, the light absorption rate (Abs.) was 57%, and the fluorescence peak wavelength was 733 nm.

Next, the first wavelength converter 1A and the second wavelength converter 2A fabricated in this way were used to fabricate the light emitting device.

Specifically, the first wavelength converter 1A was disposed on the light output surface of a blue LED chip (product number: LE B P2MQ, manufactured by OSRAM Opto Semiconductors GmbH) as the solid-state light emitting element 3 that emits the primary light 3B, which is blue light (fluorescence peak wavelength: 450 nm). The second wavelength converter 2A was disposed on the first wavelength converter 1A to form the light emitting device as shown in FIG. 1, and this is the light emitting device according to Example 1.

When power (10.3 V, 20 mA) was applied to the blue LED chip, blue light as the primary light 3B was radiated from the blue LED chip. Then, part of the light was converted to visible light (yellow light by additive color mixing of green and red light components) as the first wavelength-converted light 1B by means of the first wavelength converter 1A. Further, part of the mixed light of the primary light 3B and the first wavelength-converted light 1B was converted to dark red to near-infrared light components as the second wavelength-converted light 2B by means of the second wavelength converter 2A. Then, the mixed light of blue light as the primary light 3B, visible light as the first wavelength-converted light 1B, and light having a near-infrared light component as the second wavelength-converted light 2B was emitted as the output light 4.

Figure 12:
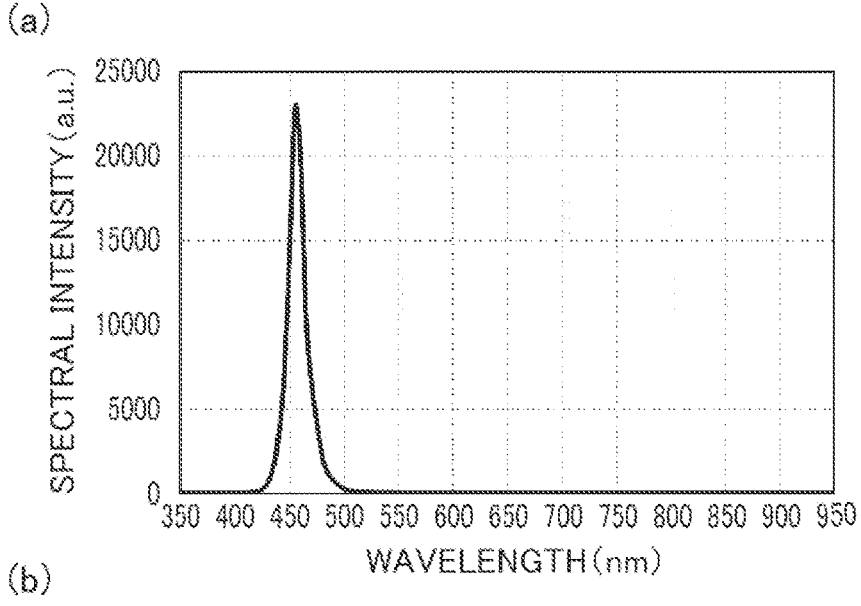
FIG. 12 is an example of a spectral distribution of output light and the like emitted by a light emitting device according to an example.
Figure 12:
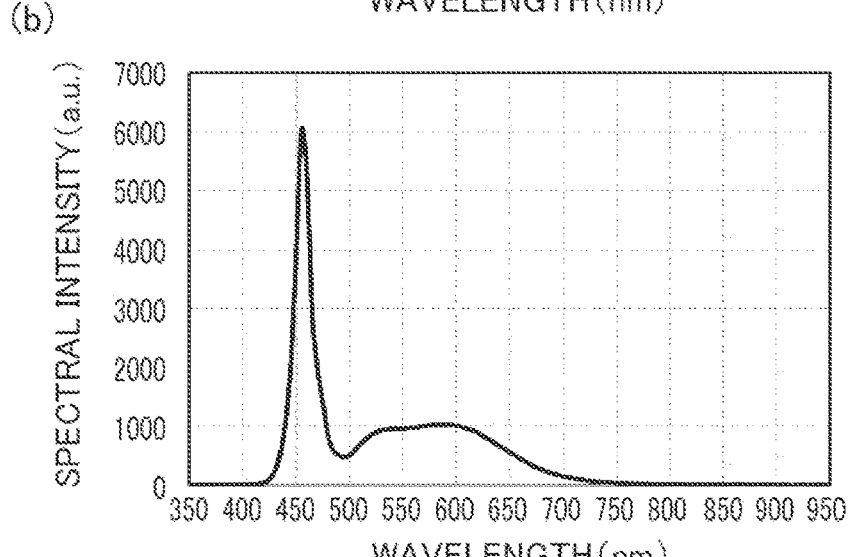
Figure 12:
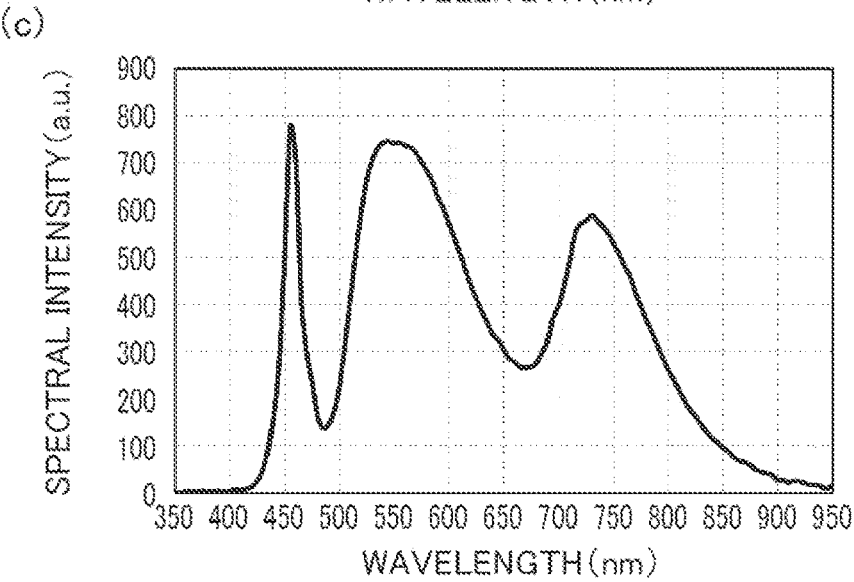

FIGS. 12(a), (b), and (c) each show the spectral distributions of the primary light 3B emitted by the blue LED chip, the first mixed light 14, and the output light 4. The first mixed light 14 is constituted by mixed light components including the first transmitted primary light $3BT_1$, which is the primary light 3B that has passed through the first wavelength converter 1A, and the first wavelength-converted light 1B. The output light 4 is constituted by mixed light components including the second transmitted primary light $3BT_2$, the transmitted first wavelength-converted light $1BT_2$, and the second wavelength-converted light 2B. The second transmitted primary light $3BT_2$ is the first transmitted primary light $3BT_1$ that has passed through the second wavelength converter 2A. The transmitted first wavelength-converted light $1BT_2$ is the first wavelength-converted light 1B that has passed through the second wavelength converter 2A.

As can be seen from FIGS. 12(a), (b), and (c), the primary light 3B is unimodal blue light with a fluorescence peak at 455 nm, and the half width was about 17 nm (15 nm or more and less than 20 nm).

The first mixed light 14 including the first transmitted primary light $3BT_1$, which is the primary light 3B that has passed through the first wavelength converter 1A, and the first wavelength-converted light 1B includes light components of the primary light 3B and the first wavelength-converted light 1B. The first mixed light 14 was light in which the correlated color temperature was 30243 K, duv=−26.4, (x, y)=(0.271, 0.230), and Ra=81. The light component of the first wavelength-converted light 1B was a multimodal broad light component with peaks at 540 nm and 590 nm and light components across a wide wavelength range of at least 495 nm to 800 nm.

The output light 4 includes light components of the second transmitted primary light $3BT_2$ derived from the primary light 3B, the transmitted first wavelength-converted light $1BT_2$ derived from the first wavelength-converted light 1B, and the second wavelength-converted light 2B. The output light 4 was light in which the correlated color temperature was 4646 K, duv=24.1, (x, y)=(0.365, 0.421), and Ra=69. The light component of the output light 4 was a multimodal broad light component with peaks at 455 nm, 545 nm and 730 nm, and light components across a wide wavelength range of at least 410 nm to 950 nm.

When this output light 4 was used to irradiate a blank surface, it was confirmed that the light within a range of roughly φ 30 cm was homogeneous.

Example 2

A light emitting device according to Example 2 has a design specification that suppresses the output of the primary light 3B compared to that in Example 1, and is intended for use in an environment where ultraviolet to blue light is not desired, such as a semiconductor manufacturing line.

The first wavelength converter 1A (thickness: 200 μm) was fabricated in the same manner as in Example 1, except that the use amounts of the YAG phosphor and SCASN phosphor described in Example 1 were 2.852 g and 0.076 g, respectively, and a mold with a different thickness was used. Just to be sure, the fluorescence characteristics of the first wavelength converter 1A were evaluated using the absolute PL quantum yield spectrometer described above under photoexcitation at 450 nm, and as a result, the internal quantum efficiency (IQE) was 94%, the light absorption rate (Abs.) was 30%, and the fluorescence peak wavelength was 607 nm. Further, the second wavelength converter 2A and the solid-state light emitting element 3 used in Example 1 were reused. Then, as in Example 1, the solid-state light emitting element 3, the first wavelength converter 1A, and the second wavelength converter 2A were arranged to form the light emitting device as shown in FIG. 1, and this was used as the light emitting device according to Example 2.

As in Example 1, power (10.3 V, 20 mA) was applied to the blue LED chip to turn on the light emitting device according to Example 2.

Figure 13:
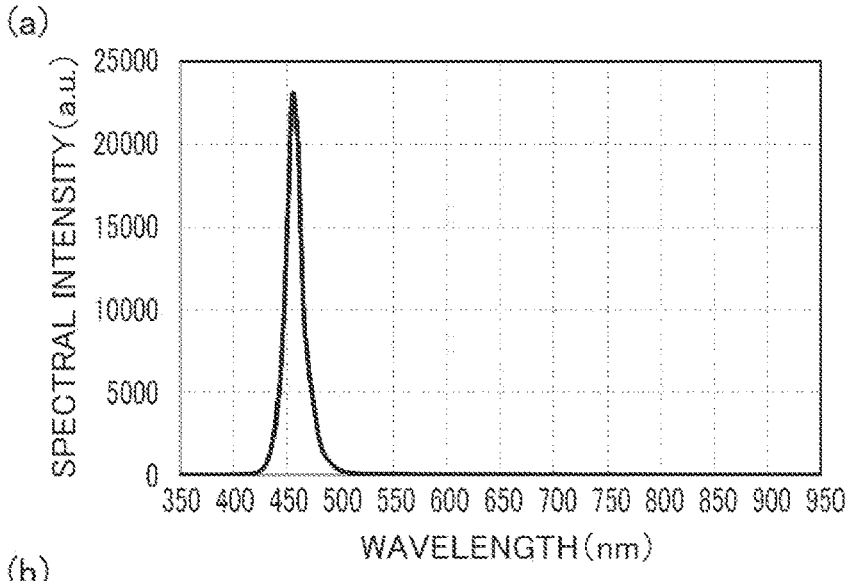
FIG. 13 is an example of a spectral distribution of output light and the like emitted by a light emitting device according to an example.
Figure 13:
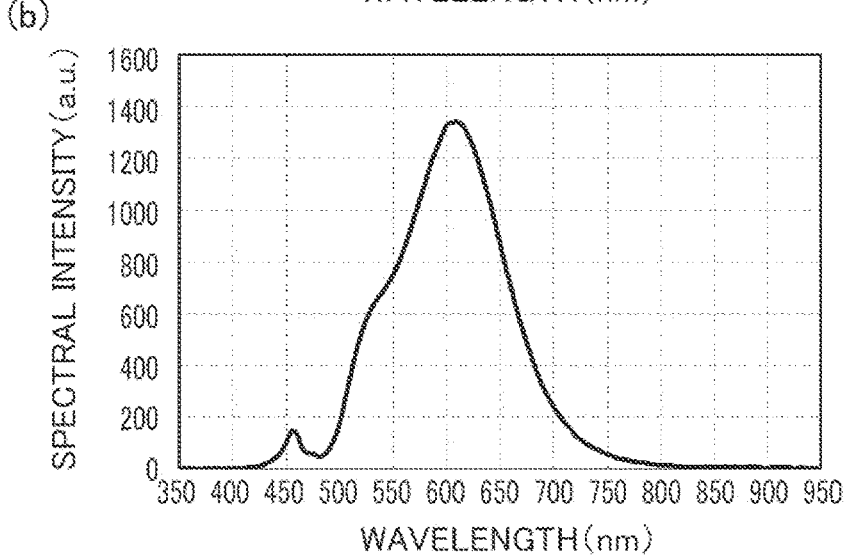
Figure 13:
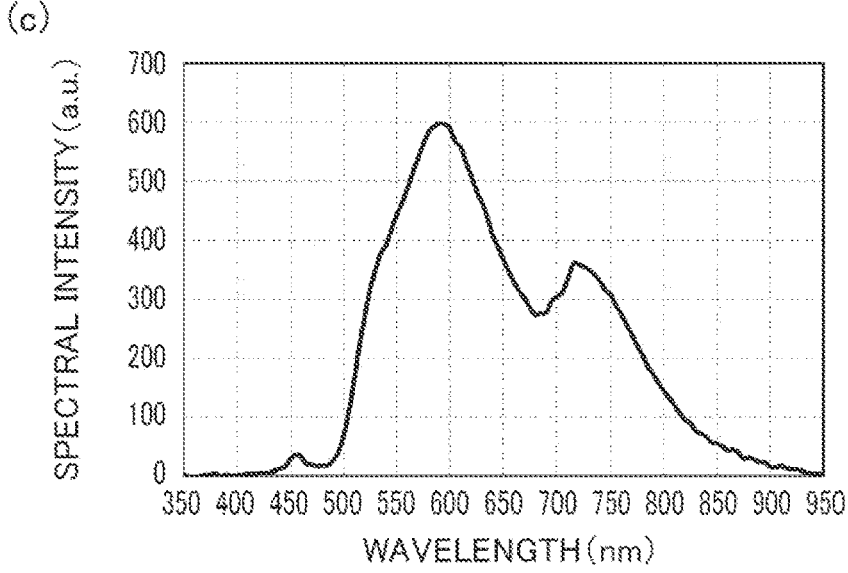

FIGS. 13(a), (b), and (c) each show the spectral distributions of the primary light 3B emitted by the blue LED chip, the first mixed light 14, and the output light 4. The first mixed light 14 is constituted by mixed light components including the first transmitted primary light $3BT_1$, which is the primary light 3B that has passed through the first wavelength converter 1A, and the first wavelength-converted light 1B. The output light 4 is constituted by mixed light components including the second transmitted primary light $3BT_2$, the transmitted first wavelength-converted light $1BT_2$, and the second wavelength-converted light 2B. The second transmitted primary light $3BT_2$ is the first transmitted primary light $3BT_1$ that has passed through the second wavelength converter 2A. The transmitted first wavelength-converted light $1BT_2$ is the first wavelength-converted light 1B that has passed through the second wavelength converter 2A.

As can be seen from FIGS. 13(a), (b), and (c), the primary light 3B is unimodal blue light with a fluorescence peak at 455 nm, and the half width was about 17 nm.

The first mixed light 14 including the first transmitted primary light $3BT_1$, which is the primary light 3B that has passed through the first wavelength converter, 1A and the first wavelength-converted light 1B includes light components of the primary light 3B and the first wavelength-converted light 1B. The first mixed light 14 was light in which the correlated color temperature was 2510 K, duv=12.5, (x, y)=(0.501, 0.455), and Ra=77. The light component of the first wavelength-converted light 1B was a unimodal broad light component with a peak at 610 nm and light components across a wide wavelength range of at least 495 nm to 800 nm.

The output light 4 includes light components of the primary light 3B, the first wavelength-converted light 1B, and the second wavelength-converted light 2B and was light in which the correlated color temperature was 2828 K, duv=21.6, (x, y)=(0.489, 0.482), and Ra=68. The light component of the output light 4 was a multimodal broad light component with peaks at 455 nm, 590 nm, and 715 nm and light components across a wide wavelength range of at least 410 nm to 950 nm. However, the spectral intensity in the wavelength region less than 500 nm was less than 7% of the maximum spectral intensity of the output light 4 (the spectral intensity of the light component at a wavelength of 590 nm), and the intensity of the light component in the ultraviolet to blue wavelength region was largely suppressed in the output light 4.

When this output light 4 was used to irradiate a blank surface, it was confirmed that the light within a range of roughly φ 30 cm was homogeneous.

Example 3

A light emitting device according to Example 3 has a design specification in which the minimum value relative to the maximum value of the spectral intensity in the wavelength range of 520 nm or more and less than 750 nm is 70% or more compared to Example 1. More specifically, it is intended to be a light source or the like for applications requiring characteristics having little variation in spectral intensity in the green to deep red wavelength range.

As the first wavelength converter 1A, a phosphor sheet composed of a resin phosphor film having a phosphor emitting green light with a fluorescence peak near 525 nm and a phosphor emitting red light with a fluorescence peak near 655 nm was used. An $Lu_3Al_2(AlO_4)_3:Ce^{3+}$ (LuAG) phosphor (manufactured by TOKYO KAGAKU KENKY- USHO CO., LTD., central particle size $D_{50}$~55 μm) was used as the phosphor emitting green light with a fluorescence peak near 525 nm. A $CaAlSiN_3:Eu^{2+}$ (CASN) phosphor (manufactured by Mitsubishi Chemical Corporation, central particle size $D_{50}$~18 μm) was used as the phosphor emitting red light with a fluorescence peak near 655 nm.

The first wavelength converter 1A (thickness: 260 μm) was fabricated in the same manner as in Example 1, except that the use amounts of the LuAG phosphor and CASN phosphor were 0.849 g and 0.157 g, respectively, and a mold with a different thickness was used. Just to be sure, the fluorescence characteristics of the first wavelength converter 1A were evaluated using the absolute PL quantum yield spectrometer described above under photoexcitation at 450 nm, and as a result, the internal quantum efficiency (IQE) was 93%, the light absorption rate (Abs.) was 32%, and the fluorescence peak wavelength was 630 nm. Further, the second wavelength converter 2A and the solid-state light emitting element 3 used in Example 1 were reused. Then, as in Example 1, the solid-state light emitting element 3, the first wavelength converter 1A, and the second wavelength converter 2A were arranged to form the light emitting device as shown in FIG. 1, and this was used as the light emitting device according to Example 3.

As in Example 1, power (10.3 V, 20 mA) was applied to the blue LED chip to turn on the light emitting device according to Example 3.

Figure 14:
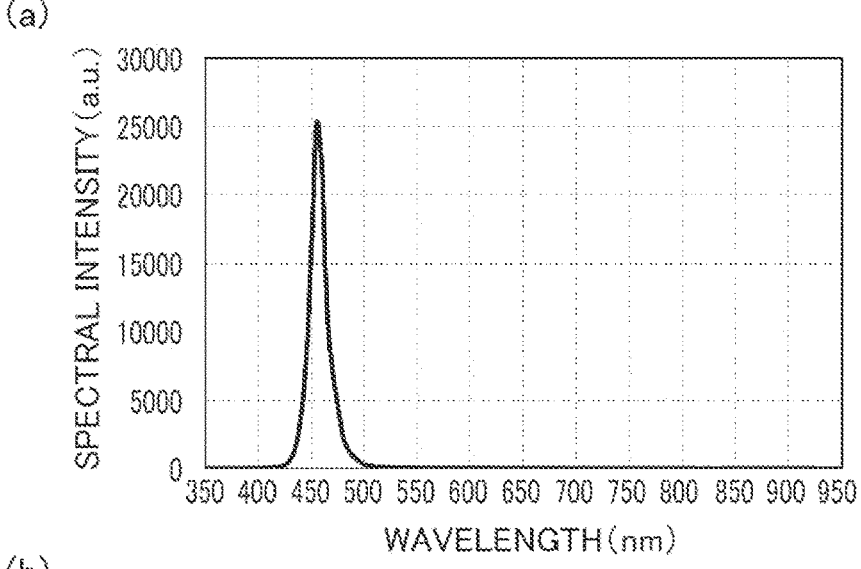
FIG. 14 is an example of a spectral distribution of output light and the like emitted by a light emitting device according to an example.
Figure 14:
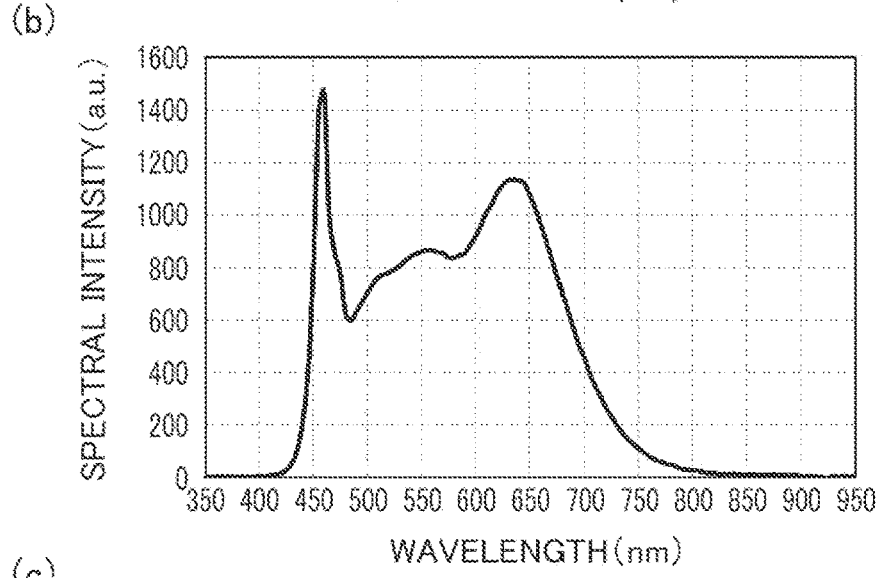
Figure 14:
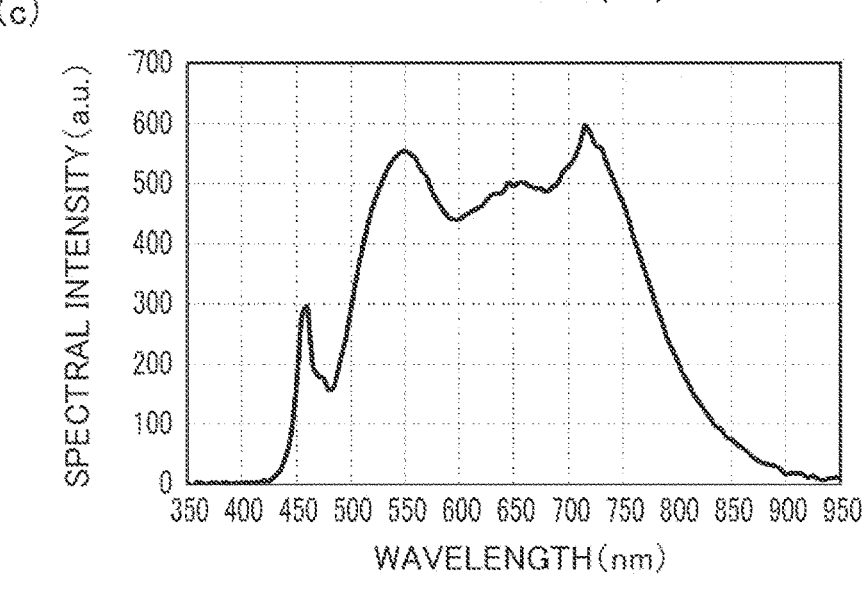

FIGS. 14(a), (b), and (c) each show the spectral distribution of the primary light 3B emitted by the blue LED chip, the first mixed light 14, and the output light 4. The first mixed light 14 is constituted by mixed light components including the first transmitted primary light $3BT_1$, which is the primary light 3B that has passed through the first wavelength converter 1A, and the first wavelength-converted light 1B. The output light 4 is constituted by mixed light components including the second transmitted primary light $3BT_2$, the transmitted first wavelength-converted light $1BT_2$, and the second wavelength-converted light 2B. The second transmitted primary light $3BT_2$ is the first transmitted primary light $3BT_1$ that has passed through the second wavelength converter 2A. The transmitted first wavelength-converted light $1BT_2$ is the first wavelength-converted light 1B that has passed through the second wavelength converter 2A.

As can be seen from FIGS. 14(a), (b), and (c), the primary light 3B is unimodal blue light with a fluorescence peak at 455 nm, and the half width was about 17 nm.

The first mixed light 14 having the primary light 3B that has passed through the first wavelength converter 1A and the first wavelength-converted light 1B includes light components of the primary light 3B and the first wavelength-converted light 1B. The first mixed light 14 was light in which the correlated color temperature was 4146 K, duv=−3.0, (x, y)=(0.372, 0.365), and Ra=93. The light component of the first wavelength-converted light 1B was a multimodal broad light component with peaks at 555 nm and 635 nm and light components across a wide wavelength range of at least 495 nm to 800 nm.

The output light 4 includes light components of the second transmitted primary light $3BT_2$ derived from the primary light 3B, the transmitted first wavelength-converted light $1BT_2$ derived from the first wavelength-converted light 1B, and the second wavelength-converted light 2B. The output light 4 was light with high color rendering properties in which the correlated color temperature was 3893 K, duv=25.1, (x, y)=(0.407, 0.453), and Ra=83. The light component of the output light 4 is a multimodal broad light component with peaks at 460 nm, 550 nm, 655 nm and 715 nm and light components across a wide wavelength range of at least 410 nm to 950 nm. A maximum value of the spectral intensity in the wavelength range of 520 nm or more and less than 750 nm is 715 nm, and the spectral intensity at 595 nm, which is a minimum value, is 73.8% of the maximum value.

When this output light 4 was used to irradiate a blank surface, it was confirmed that the light within a range of roughly φ 30 cm was homogeneous.

Here, we will turn our attention to duv of the first mixed light 14 and the output light 4. The duv is an index indicating the deviation from black-body radiation and an index indicating the color tone of white light. If the numerical value of duv is positive, white light with a greenish color tone is indicated, and if the numerical value is negative, white light with a purplish color tone is indicated.

As can be seen from the description of Examples 1 to 3, the numerical value of duv swings greatly to the positive side when the first mixed light 14 is converted to the output light 4 by means of the second wavelength converter 2A. Further, the range of that swing is 5 or more and less than 55. This is due to the fact that the $Cr^{3+}$ included in the second wavelength converter 2A absorbs the blue and red light components of the first mixed light 14 well, but does not absorb the green light component so much.

That is, the blue and red light components of the first mixed light 14 are easily absorbed by the second wavelength converter 2A and converted to near-infrared light components. In contrast, the green light component in the first mixed light 14 is not absorbed by the second wavelength converter 2A and easily passes through the second wavelength converter 2A. Therefore, the output light 4 becomes greenish white light relative to the white light of the first mixed light 14.

Therefore, it is preferable that the numerical value of duv of the first mixed light 14 be negative, and the preferable numerical value range thereof is −55 or more and less than −5, and particularly-50 or more and less than −10. This facilitates the output of white light (duv=0±2) with a color tone close to natural light.

Examples 4 to 6

As light emitting devices of Examples 4 to 6, a light emitting device was fabricated by combining the second wavelength converter 2A with a white LED for LED lighting, the white LED being a combination of a blue LED (fluorescence peak wavelength: 455 nm), a red LED (fluorescence peak wavelength: 633 nm), and a phosphor. The second wavelength converter 2A was simply placed on the light output surface of the obtained white LED (2700 K, manufactured by Lumileds LLC), and the white LED was turned on by energizing the LED with a rated current (136 m.A). Then, the output light was integrated with an integrating sphere (φ 20 inches, product number: LMS-200, manufactured by Labsphere), and the spectral distribution and radiant flux of the output light 4 were measured using a total luminous flux measurement system (SLMS-CDS-2021, manufactured by Labsphere).

As the second wavelength converter 2A, a wavelength converter was used in which the thickness of the second wavelength converter used in Example 1 (a resin phosphor film using the GLGG phosphor) was changed to three different thicknesses (155 μm, 240 μm, and 340 μm). Wavelength converters of three different thicknesses were fabricated using molds with different thicknesses.

Figure 15:
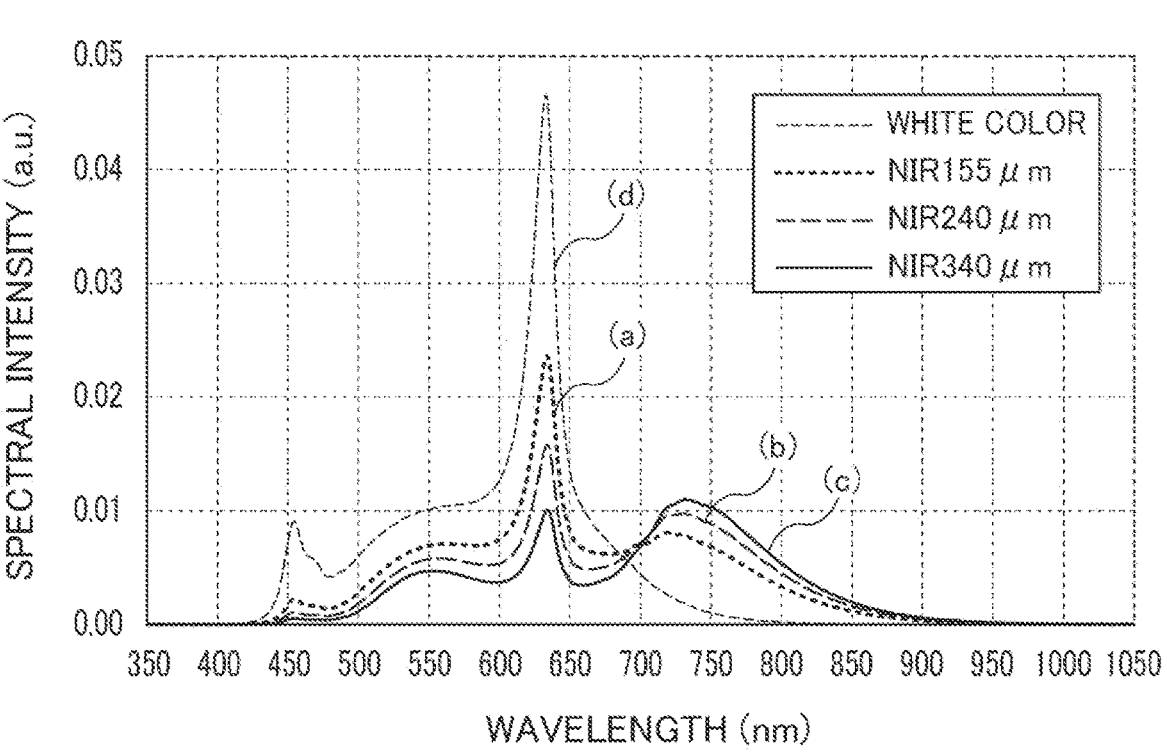
FIG. 15 is an example of a spectral distribution of output light and the like emitted by a light emitting device according to an example.

FIG. 15 collectively shows the spectral distributions of the output light 4 of the light emitting devices of Examples 4 to 6. Note that (a), (b), and (c) in FIG. 15 correspond to the output light 4 of Example 4, Example 5, and Example 6, respectively, and correspond to a device configuration using the second wavelength converter 2A with thicknesses of 155 μm, 240 μm, and 340 μm, respectively. Also, (d) in FIG. 15 is the spectral distribution of the output light of the white LED (without the second wavelength converter 2A) shown for reference (Reference Example 1).

As can be seen from FIGS. 15(a), (b), and (c), the spectral distribution of the output light 4 includes light components in the entire wavelength range of at least 420 nm or more and less than 950 nm. The spectral distribution of the output light 4 is composed mainly of a fluorescent component derived from a blue LED, a fluorescent component derived from a green phosphor (a $Ce^{3+}$ activated garnet phosphor), a fluorescent component derived from a red LED, and a fluorescent component derived from a near-infrared phosphor (a $Cr^{3+}$ activated garnet phosphor). The fluorescent component derived from the blue LED had a peak near 450 nm. The fluorescent component derived from the green phosphor (the $Ce^{3+}$ activated garnet phosphor) had a peak or a shoulder-like bulge near 550 nm. The fluorescent component derived from the red LED had a peak near 635 nm. The fluorescent component derived from the near-infrared phosphor (the $Cr^{3+}$ activated garnet phosphor) had a peak near 730 nm.

Attention was given to the spectral intensities of the light components at wavelengths of 450 nm, 550 nm, 635 nm, and 730 nm. In the white LED without the second wavelength converter 2A, the fluorescent component with the largest spectral intensity (height) was the spectral intensity at 635 nm derived from the red LED. The spectral intensity at 550 nm derived from the green phosphor and the spectral intensity at 450 nm derived from the blue LED showed spectral intensities (heights) that followed thereafter.

In Examples 4 to 6 ((a) to (c) in FIG. 15) combined with the second wavelength converter 2A of different thicknesses, the spectral intensities at 450 nm, 550 nm and 635 nm decreased as the thickness of the second wavelength converter 2A increased. In particular, the spectral intensities at 450 nm and 635 nm decreased significantly. Under this influence, the spectral distributions of Examples 4 to 6 had a minimum value in the wavelength range of 560 nm or more and less than 610 nm. Meanwhile, the spectral intensity at 730 nm increased as the thickness of the second wavelength converter 2A increased.

In Examples 4 to 6, the spectral intensity at 730 nm was smaller than the spectral intensity at 635 nm, but larger than the spectral intensity at 550 nm. In Example 6 ((c) in FIG. 15), the spectral intensity at 730 nm was larger than the spectral intensity at 635 nm, and became the largest spectral intensity among the spectral intensities. In Examples 4 to 6, the spectral intensity at 450 nm was smaller than the spectral intensity at 730 nm, was less than 25% of the spectral intensity at 730 nm, and in Example 6, in particular, was less than 5% of the spectral intensity at 730 nm.

From the above, the present examples can be said to be a suitable for a light emitting device for applications requiring output light 4 that includes a strong red light component, a strong near-infrared component, and a green light component that is weaker than the light components described above, and includes a blue light component with suppressed intensity.

Table 2 summarizes the characteristics of the output light 4 of Examples 4 to 6 as illumination light. For comparison, Table 2 also shows the characteristics of Reference Example 1 (a white LED without the second wavelength converter 2A).

TABLE 2

|  | Example 4 | Example 5 | Example 6 | Reference Example 1 |
|---|---|---|---|---|
| Radiant flux (W) | 2.53 | 2.29 | 2.08 | 3.16 |
| Luminous flux (lm) | 516.5 | 391.0 | 291.6 | 855.4 |
| Chromaticity coordinate x | 0.49 | 0.49 | 0.48 | 0.47 |
| Chromaticity coordinate y | 0.43 | 0.45 | 0.47 | 0.39 |
| Correlated color temperature (K) | 2482 | 2652 | 2890 | 2377 |
| Ra | 91 | 89 | 83 | 82 |

As can be seen from Table 2, as the thickness of the second wavelength converter 2A increases, that is, from Example 4 to Example 5, and further to Example 6, the radiant flux and luminous flux showed a tendency to decrease. Meanwhile, the correlated color temperature tends to be slightly higher, and the average color rendering index (Ra) increases greatly in the numerical value range of 80 or more, which shows high color rendering properties, and after exceeding 90, gradually decreased.

From these pieces of data, it can be said that the present examples provide a light emitting device suitable for obtaining output light 4 that achieves both high output near-infrared light and high color rendering properties.

When this output light 4 was used to irradiate a blank surface for confirmation, it was confirmed that the light within a range of roughly φ 30 cm was homogeneous.

Examples 7 to 9

As light emitting devices of Examples 7 to 9, a light emitting device was fabricated by combining the second wavelength converter 2A with a white LED for LED lighting, the white LED being a combination of a blue LED, a red LED, and a phosphor. In the same manner as Examples 4 to 6, the second wavelength converter 2A was placed on the light output surface of the obtained white LED (3500 K, manufactured by Lumileds LLC), and the spectral distribution, radiant flux, and the like of the output light 4 output by energizing the white LED with a rated current (136 mA) were measured.

Figure 16:
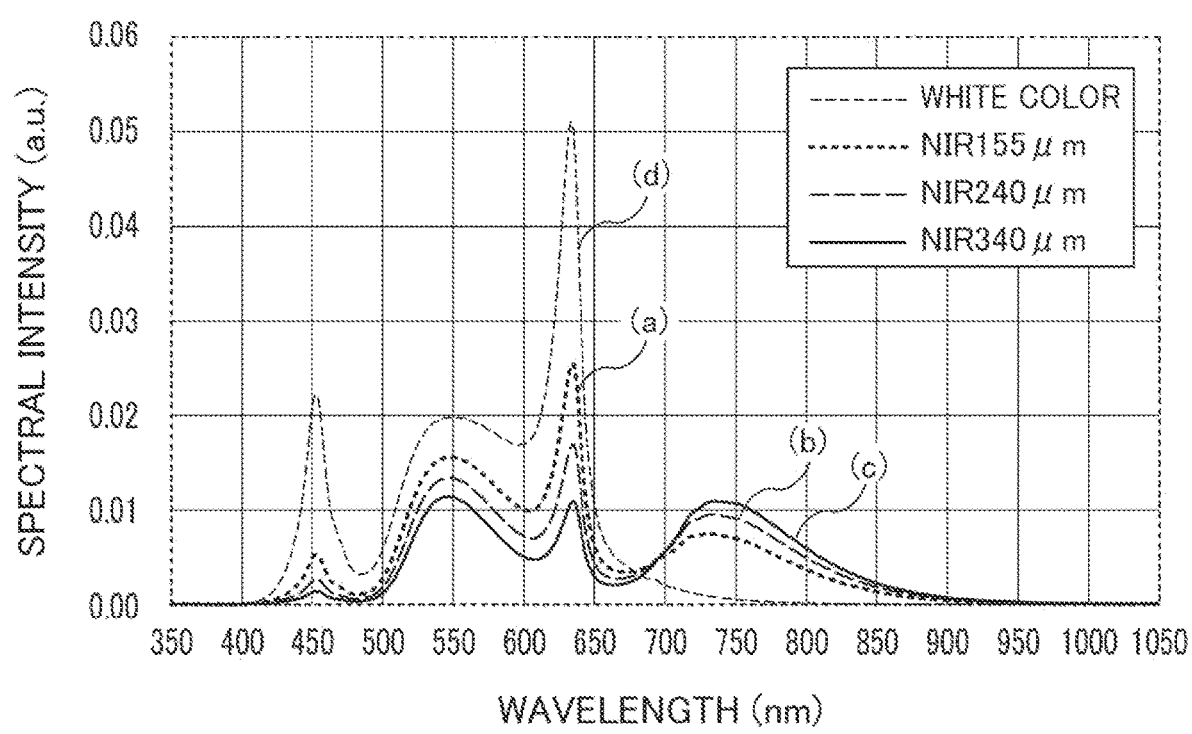
FIG. 16 is an example of a spectral distribution of output light and the like emitted by a light emitting device according to an example.

FIG. 16 collectively shows the spectral distributions of the output light 4 of the light emitting devices of Examples 7 to 9. Note that (a), (b), and (c) in FIG. 16 correspond to the output light 4 of Example 7, Example 8, and Example 9, respectively, and correspond to device configurations using the second wavelength converter 2A with thicknesses of 155 μm, 240 μm, and 340 μm, respectively. Also, (d) in FIG. 16 is the spectral distribution of the output light of the white LED (without the second wavelength converter 2A) shown for reference (Reference Example 2).

As can be seen from FIGS. 16(*a*), (*b*), and (*c*), the spectral distributions of the output light 4 in FIGS. 16(*a*), (*b*), and (*c*) have the same configuration as those of Examples 4 to 6 described above with reference to FIG. 15. Therefore, as in FIG. 15, attention was given to the spectral intensities of the light components at wavelengths of 450 nm, 550 nm, 635 nm, and 730 nm. In the white LED without the second wavelength converter 2A, the fluorescent component with the largest spectral intensity (height) was the spectral intensity of 635 nm derived from the red LED. The spectral intensity of 450 nm derived from the blue LED and the spectral intensity of 550 nm derived from the green phosphor showed the spectral intensity (height) that followed thereafter.

Even in Examples 7 to 9 ((a) to (c) in FIG. 16) combined with the second wavelength converter 2A of different thicknesses, the fundamental behavior of the spectral spectrum observed as the thickness of the second wavelength converter 2A increased was similar to that in Examples 4 to 6 described above.

In Examples 7 to 9, the spectral intensity at 730 nm was smaller than the spectral intensities at 550 nm and 635 nm in Example 7 and Example 8, where the thickness of the second wavelength converter 2A was at least 240 nm or less. However, in Example 9, where the same thickness was at least 340 nm or more, the spectral intensity became similar to the spectral intensities at 550 nm and 635 nm, and the difference among the spectral intensities at 550 nm, 635 nm, and 730 nm was +10%. Further, the spectral intensity at 730 nm became larger than the spectral intensity at at least 635 nm. In Examples 7 to 9 also, the spectral intensity at 450 nm was smaller than the spectral intensity at 730 nm and was less than 65% of the spectral intensity at 730 nm. Especially in Example 9, the spectral intensity was less than 15% of the spectral intensity at 730 nm.

From the above, the present examples can be said to provide a light emitting device suitable for applications requiring output light 4 having a strong green light component, a strong red light component, a strong near-infrared component, and a blue light component with suppressed intensity.

Table 3 summarizes the characteristics of the output light 4 of Examples 7 to 9 as illumination light. For comparison, Table 3 also shows the characteristics of Reference Example 2 (a white LED without the second wavelength converter 2A).

TABLE 3

|  | Example 7 | Example 8 | Example 9 | Reference Example 2 |
|---|---|---|---|---|
| Radiant flux (W) | 3.12 | 2.78 | 2.51 | 4.04 |
| Luminous flux (lm) | 880.5 | 697.1 | 545.7 | 1316.0 |
| Chromaticity coordinate x | 0.43 | 0.43 | 0.42 | 0.41 |
| Chromaticity coordinate y | 0.47 | 0.50 | 0.52 | 0.39 |
| Correlated color temperature (K) | 3501 | 3719 | 3964 | 3279 |
| Ra | 78 | 71 | 63 | 91 |

As can be seen from Table 3, as the thickness of the second wavelength converter 2A increased, that is, from Example 7 to Example 8 and then to Example 9, the radiant flux, luminous flux, and average color rendering index (Ra) showed a tendency to decrease. Meanwhile, the correlated color temperature showed a tendency to be slightly higher. However, in the comparison where the second wavelength converter 2A of the same thickness was used, the radiant flux and luminous flux thereof were larger than that in Examples 4 to 6 by 20% or more. In particular, the luminous flux was larger than that in Examples 4 to 6 by 70% or more.

From these pieces of data, the present examples can be said to provide a light emitting device suitable for obtaining output light 4 that achieves both high output near-infrared light and high luminous flux.

When this output light 4 was used to irradiate a blank surface for confirmation, it was confirmed that the light within a range of roughly φ 30 cm was homogeneous.

Examples 10 to 12

As light emitting devices of Examples 10 to 12, a light emitting device was fabricated by combining the second wavelength converter 2A with a white LED for LED lighting, the white LED being a combination of a blue LED and a phosphor. As in Examples 4 to 6, the second wavelength converter 2A was placed on the light output surface of the obtained white LED (5000 K, manufactured by CITIZEN ELECTRONICS CO., LTD.), and the spectral distribution, radiant flux, and the like of the output light 4 output by energizing the white LED with a rated current (269 mA) were measured.

Figure 17:
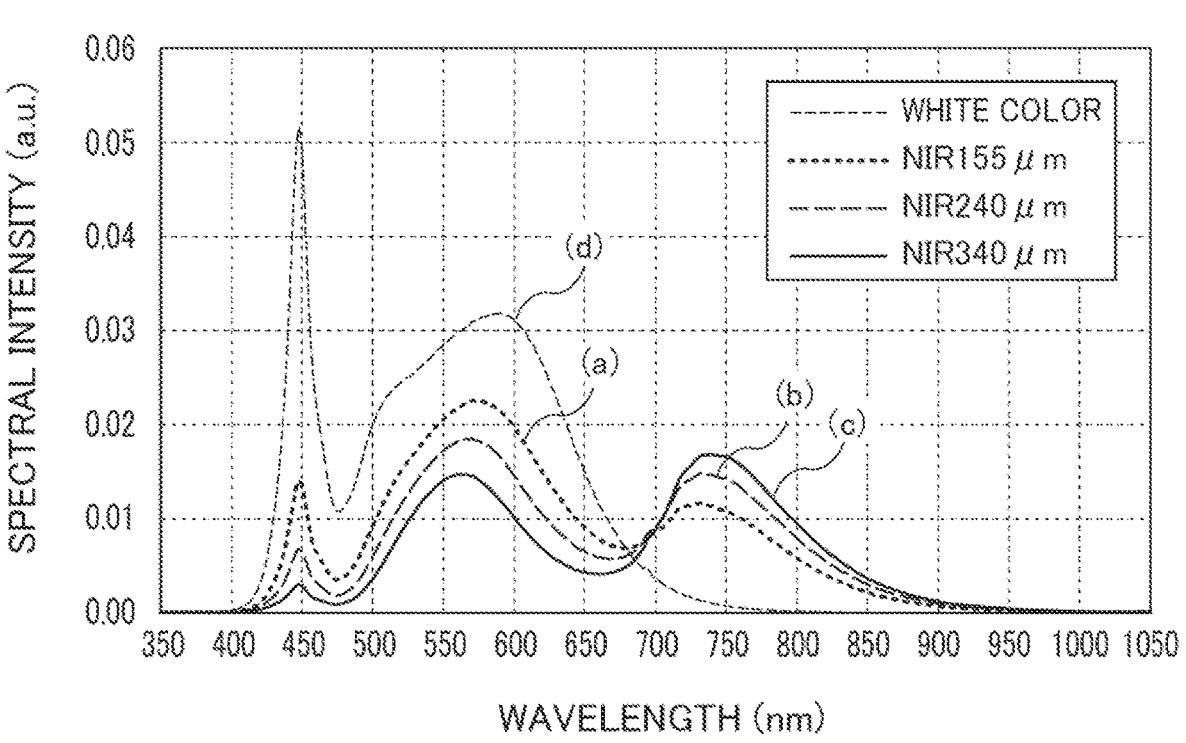
FIG. 17 is an example of a spectral distribution of output light and the like emitted by a light emitting device according to an example.

FIG. 17 collectively shows the spectral distributions of the output light 4 of the light emitting devices of Examples 10 to 12. Note that (a), (b), and (c) in FIG. 17 correspond to the output light 4 of Example 10, Example 11, and Example 12, respectively, and correspond to device configurations using the second wavelength converter 2A with thicknesses of 155 μm, 240 μm, and 340 μm, respectively. Further, (d) in FIG. 17 is the spectral distribution of the output light of the white LED (without the second wavelength converter 2A) shown for reference (Reference Example 3).

As can be seen from (a), (b), and (c) in FIG. 17, the spectral distribution of the output light 4 includes light components in the entire wavelength range of at least 420 nm or more and less than 950 nm. The spectral distribution of the output light 4 is composed mainly of a fluorescent component derived from a blue LED, a fluorescent component derived from a mixture of green and red phosphors, and a fluorescent component derived from a near-infrared phosphor ($Cr^{3+}$ activated garnet phosphor). The fluorescent component derived from a mixture of green and red phosphors is a fluorescent component derived from a mixture of a green phosphor ($Ce^{3+}$ activated gamet phosphor) and a red phosphor ($Eu^{2+}$ activated nitride-based phosphor). The fluorescent component derived from the blue LED had a peak near 450 nm. The fluorescent component derived from the mixture of a green phosphor ($Ce^{3+}$ activated garnet phosphor) and the red phosphor ($Eu^{2+}$ activated nitride phosphors) had a peak near 560 nm. The fluorescent component derived from the near-infrared phosphor ($Cr^{3+}$ activated garnet phosphor) had a peak near 730 nm.

Therefore, attention was given to the spectral intensities of the light components at wavelengths of 450 nm, 560 nm, and 730 nm. In the white LED without the second wavelength converter 2A, the fluorescent component with the largest spectral intensity (height) was the spectral intensity at 450 nm derived from the blue LED. The spectral intensity at 560 nm derived from both the green and red phosphors showed spectral intensities (heights) that followed thereafter.

In Examples 10 to 12 ((a) to (c) in FIG. 17) combined with the second wavelength converter 2A of different thicknesses, the spectral intensities at 450 nm and 560 nm, especially at 450 nm, decreased significantly as the thickness of the second wavelength converter 2A increased. This affected the spectral distribution of Examples 10 to 12 so as to have a maximum value in the wavelength range of 550 nm or more and less than 580 nm. Meanwhile, as the thickness of the second wavelength converter 2A increased, the spectral intensity at 730 nm increased to have a minimum value in the wavelength range of 600 nm or more and less than 700 nm.

In Examples 10 to 12, the spectral intensity at 730 nm had a different magnitude relationship with the spectral intensities at 450 nm and 560 nm as the thickness of the second wavelength converter 2A increased. Specifically, in Example 10, the spectral intensity at 730 nm became smaller than the spectral intensities at 450 nm and 560 nm. In Example 11, the spectral intensity at 730 nm became larger than the spectral intensity at 450 nm and smaller than the spectral intensity at 560 nm. In Example 12, the spectral intensity at 730 nm became larger than the spectral intensities at 450 nm and 560 nm and became the largest spectral intensity among the spectral intensities. In Examples 10 to 12, the spectral intensity at 450 nm was similar to or smaller than the spectral intensity at 730 nm. For example, in Example 11, the spectral intensity at 450 nm was less than 50% of the spectral intensity at 730 nm. In Example 12, the spectral intensity at 450 nm was less than 20% of the spectral intensity at 730 nm.

From the above, the present examples can be said to provide a light emitting device suitable for applications requiring output light 4 having a strong yellow-green to yellow light component and a strong near-infrared component. When the white light emitted by the white LED is made to pass through the second wavelength converter 2A, the blue light component and the red light component among the light components emitted by the white LED greatly decrease in intensity. This is because the $Cr^{3+}$ activated phosphor included in the second wavelength converter 2A has the property of absorbing the blue and red light components. Due to this, the output light 4 tends to take on a yellowish color, and therefore, for the purpose of obtaining output light 4 that is close to white light, it is preferable to have a structure that allows part of the light of the white LED (the wavelength-conversion light emitting element) to pass through as it is.

Table 4 summarizes the characteristics of the output light 4 of Examples 10 to 12. For comparison, Table 4 also shows the characteristics of Reference Example 3 (the white LED without the second wavelength converter 2A).

TABLE 4

| | Example 10 | Example 11 | Example 12 | Reference Example 3 |
|---|---|---|---|---|
| Radiant flux (W) | 4.73 | 4.22 | 3.76 | 6.17 |
| Luminous flux (lm) | 1295.0 | 1016.0 | 770.3 | 1970.0 |
| Chromaticity coordinate x | 0.40 | 0.41 | 0.41 | 0.35 |
| Chromaticity coordinate y | 0.44 | 0.47 | 0,50 | 0.36 |
| Correlated color temperature (K) | 4001 | 3943 | 3995 | 4774 |
| Ra | 69 | 63 | 56 | 83 |

As can be seen from Table 4, as the thickness of the second wavelength converter 2A increased, that is, from Example 10 to Example 11 and further to Example 12, the radiant flux, luminous flux, and average color rendering index (Ra) showed a tendency to decrease. Meanwhile, the correlated color temperature showed a tendency to maintain a constant value around 4000 K. In the comparison where the second wavelength converter 2A of the same thickness was used, the radiant flux and luminous flux were larger than that in Examples 7 to 9 by 40% or more. In particular, the radiant flux was larger than that in Examples 7 to 9 by 50% or more.

From these pieces of data, the present examples can be said to provide a light emitting device suitable for obtaining output light 4 that combines high output near-infrared light, high radiant flux, and high luminous flux.

When this output light 4 was used to irradiate a blank surface for confirmation, it was confirmed that the light within a range of roughly φ 30 cm was homogeneous.

Examples 13 to 15

As light emitting devices of Examples 13 to 15, a light emitting device was fabricated by combining the second wavelength converter 2A with a white LED for LED lighting, the white LED being a combination of a blue LED and a phosphor. As in Examples 4 to 6, the second wavelength converter 2A was placed on the light output surface of the obtained white LED (3000 K, manufactured by Lumileds LLC), and the spectral distribution, radiant flux, and the like of the output light 4 output by energizing the white LED with a rated current (400 mA) were measured.

Figure 18:
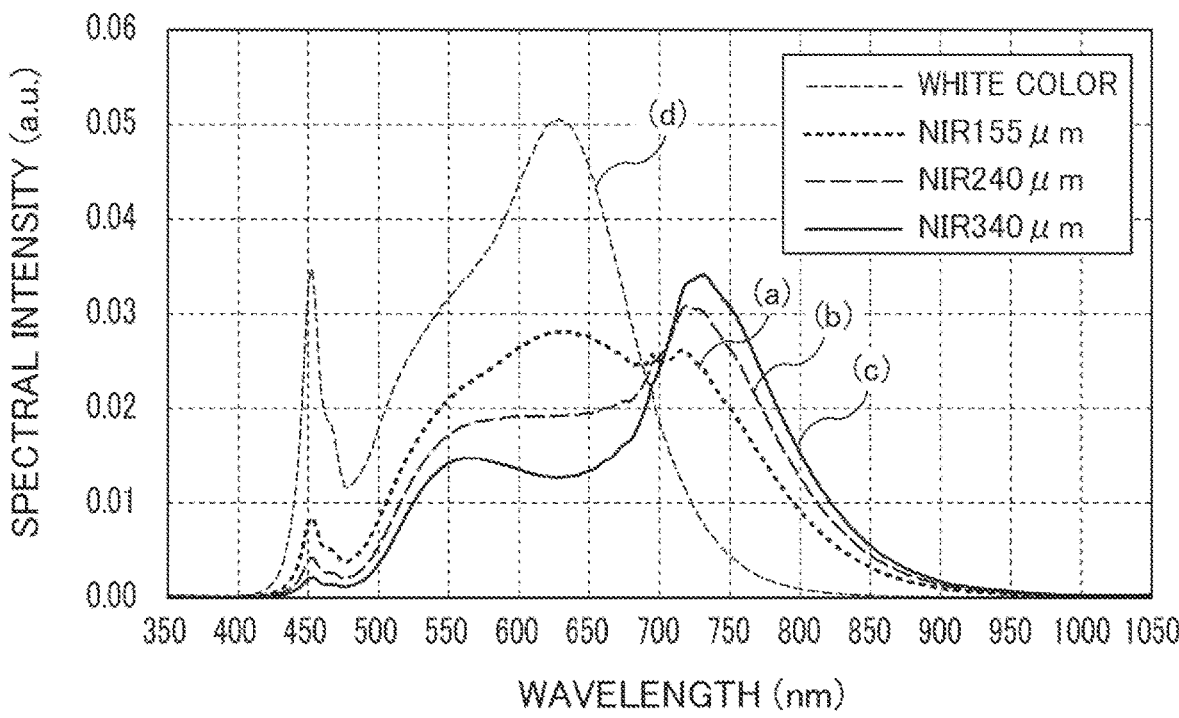
FIG. 18 is an example of a spectral distribution of output light and the like emitted by a light emitting device according to an example.

FIG. 18 collectively shows the spectral distributions of the output light 4 of the light emitting devices of Examples 13 to 15. Note that (a), (b), and (c) in FIG. 18 correspond to the output light 4 of Example 13, Example 14, and Example 15, respectively, and correspond to device configurations using the second wavelength converter 2A with thicknesses of 155 μm, 240 μm, and 340 μm, respectively. Further, (d) in FIG. 18 is the spectral distribution of the output light of the white LED (without the second wavelength converter 2A) shown for reference (Reference Example 4).

As can be seen from (a), (b), and (c) in FIG. 18, the spectral distribution of the output light 4 includes light components in the entire wavelength range of at least 420 nm or more and less than 950 nm. The spectral distribution of the output light 4 was composed mainly of a fluorescent component derived from a blue LED, a fluorescent component derived from a mixture of green and red phosphors, and a fluorescent component derived from a near-infrared phosphor ($Cr^{3+}$ activated garnet phosphor). The fluorescent component derived from the mixture of green and red phosphors is a fluorescent component derived from a mixture of a green phosphor ($Ce^{3+}$ activated garnet phosphor) and a red phosphor ($Eu^{2+}$ activated nitride-based phosphor). The fluorescent component derived from the blue LED had a peak near 450 nm. The fluorescent component derived from the mixture of the green phosphor ($Ce^{3+}$ activated garnet phosphor) and red phosphor ($Eu^{2+}$ activated nitride-based phosphor) had a peak or a shoulder-like bulge in the wavelength range of 570 nm or more and less than 635 nm. The fluorescent component derived from the near-infrared phosphor ($Cr^{3+}$ activated garnet phosphor) had a peak near 730 nm.

Therefore, attention was given to the spectral intensities of the light components at wavelengths of 450 nm, 570 nm, 635 nm, and 730 nm. In the white LED without the second wavelength converter 2A, the fluorescent component with the largest spectral intensity (height) was the spectral intensity at 635 nm derived from the mixed fluorescent component. The spectral intensity at 450 nm derived from the blue LED and the spectral intensity at 570 nm derived from the mixed fluorescent component showed the spectral intensities (heights) that followed thereafter.

In Examples 13 to 15 ((a) to (c) in FIG. 18) combined with the second wavelength converter 2A of different thicknesses, the spectral intensities at 450 nm, 570 nm, and 635 nm, especially at 450 nm and 635 nm, decreased significantly as the thickness of the second wavelength converter 2A increased. Meanwhile, as the thickness of the second wavelength converter 2A increased, the spectral intensity at 730 nm increased, and this affected the spectral distributions of Examples 13 to 15 to have a minimum value or a dent in the wavelength range of 600 nm or more and less than 700 nm.

In Examples 13 to 15, the spectral intensity at 730 nm became larger than the spectral intensity at 570 nm regardless of the thickness of the second wavelength converter 2A. In particular, in Example 14 and Example 15, the spectral intensity at 730 nm was larger than the spectral intensities at 450 nm and 635 nm, and became the strongest spectral intensity among the spectral intensities. In Examples 13 to 15, the spectral intensity at 450 nm was smaller than the spectral intensity at 730 nm, and was less than 35% of the spectral intensity at 730 nm. In particular, in Example 15, the spectral intensity was less than 10% of the spectral intensity at 730 nm.

From the above, the present examples can be said to provide a light emitting device suitable for applications requiring output light 4 having a strong light component across a wide wavelength range from green to yellow to red and a strong near-infrared component.

Table 5 summarizes the characteristics of the output light 4 of Examples 13 to 15. For comparison, Table 5 also shows the characteristics of Reference Example 4 (the white LED without the second wavelength converter 2A).

TABLE 5

|  | Example 13 | Example 14 | Example 15 | Reference Example 4 |
|---|---|---|---|---|
| Radiant flux (W) | 7.34 | 6.77 | 6.26 | 8.98 |
| Luminous flux (lm) | 1502.0 | 1150.0 | 874.4 | 2444.0 |
| Chromaticity coordinate x | 0.46 | 0.47 | 0.46 | 0.43 |
| Chromaticity coordinate y | 0.44 | 0.46 | 0.48 | 0.39 |
| Correlated color temperature (K) | 2868 | 2972 | 3142 | 3022 |
| Ra | 87 | 81 | 75 | 96 |

As can be seen from Table 5, as the thickness of the second wavelength converter 2A increased, that is, from Example 13 to Example 14 and further to Example 15, radiant flux, luminous flux, and average color rendering index (Ra) showed a tendency to decrease. Meanwhile, the correlated color temperature showed a tendency to gradually increase. Notable are the radiant flux and luminous flux, and in the comparison where the second wavelength converter 2A of the same thickness was used, while the average color rendering index (Ra) exhibited high color rendering properties of 75% or more, the radiant flux and luminous flux were larger than those in Examples 10 to 12 by 10% or more. In particular, the radiant flux was larger than that in Examples 10 to 12 by 50% or more.

From these pieces of data, the present examples can be said to provide a light emitting device suitable for obtaining output light 4 that combines high output near-infrared light, high radiant flux, high luminous flux, and high color rendering properties.

When this output light 4 was used to irradiate a blank surface for confirmation, it was confirmed that the light within a range of roughly φ 30 cm was homogeneous.

Examples 16 to 18

As light emitting devices of Examples 16 to 18, a light emitting device was fabricated by combining the second wavelength converter 2A with a white LED for LED lighting, the white LED being a combination of a blue LED and a phosphor. As in Examples 4 to 6, the second wavelength converter 2A was placed on the light output surface of the obtained white LED (5000 K, manufactured by Lumileds LLC), and the spectral distribution, radiant flux, and the like of the output light 4 output by energizing the white LED with a rated current (400 mA) were measured.

Figure 19:
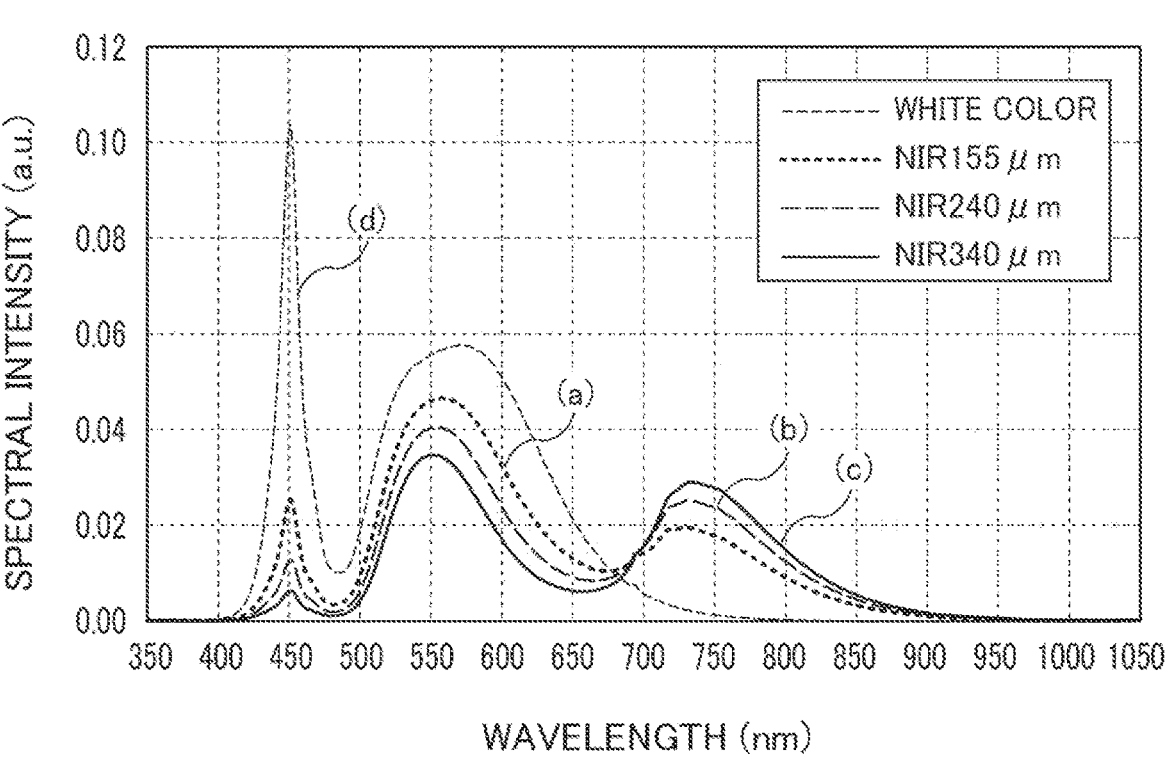
FIG. 19 is an example of a spectral distribution of output light and the like emitted by a light emitting device according to an example.

FIG. 19 collectively shows the spectral distributions of the output light 4 of the light emitting devices of Examples 16 to 18. Note that (a), (b), and (c) in FIG. 19 correspond to the output light 4 of Example 16, Example 17, and Example 18, respectively, and correspond to device configurations using the second wavelength converter 2A with thicknesses of 155 μm, 240 μm, and 340 μm, respectively. Further, (d) in FIG. 19 is the spectral distribution of the output light of the white LED (without the second wavelength converter 2A) shown for reference (Reference Example 5).

As can be seen from (a), (b), and (c) in FIG. 19, the spectral distribution of the output light 4 includes light components in the entire wavelength range of at least 420 nm or more and less than 950 nm. The spectral distribution of the output light 4 is mainly composed of a fluorescent component derived from a blue LED, a fluorescent component derived from a green phosphor ($Ce^{3+}$ activated garnet phosphor), and a fluorescent component derived from a near-infrared phosphor ($Cr^{3+}$ activated garnet phosphor). The fluorescent component derived from the blue LED had a peak near 450 nm. The fluorescent component derived from the green phosphor ($Ce^{3+}$ activated garnet phosphor) had a peak near 555 nm. The fluorescent component derived from the near-infrared phosphor ($Cr^{3+}$ activated garnet phosphor) had a peak near 730 nm.

Therefore, attention was given to the spectral intensities of the light components at wavelengths of 450 nm, 555 nm, and 730 nm. In the white LED without the second wavelength converter 2A, the fluorescent component with the largest spectral intensity (height) was the spectral intensity at 450 nm derived from the blue LED. The spectral intensity at 555 nm derived from the green phosphor showed spectral intensities (heights) that followed thereafter.

In Examples 16 to 18 ((a) to (c) in FIG. 19) combined with the second wavelength converter 2A of different thickness, the spectral intensities at 450 nm and 555 nm, especially at 450 nm, greatly decreased as the thickness of the second wavelength converter 2A increased. Meanwhile, as the thickness of the second wavelength converter 2A increased, the spectral intensity at 730 nm increased and had a minimum value in the wavelength range of 600 nm or more and less than 700 nm. The minimum value was less than 60% of the spectral intensity at 730 nm. In particular, the minimum value was less than 25% of the spectral intensity in Example 18.

In Examples 16 to 18, the spectral intensities at 450 nm and 730 nm were smaller than the spectral intensity at 555 nm, regardless of the thickness of the second wavelength converter 2A. In Example 16, the spectral intensity at 730 nm was smaller than the spectral intensity at 450 nm, but in Example 17 and Example 18, in which the thickness is increased, the spectral intensity at 730 nm was larger than the spectral intensity at 450 nm. In Example 16, the spectral intensity at 450 nm was 120% or more of the spectral intensity at 730 nm, but in Example 17, the spectral intensity was less than 50% of the spectral intensity at 730 nm, for example. In Example 18, the spectral intensity was less than 25% of the spectral intensity at 730 nm.

From the above, the present examples can be said to provide a light emitting device suitable for applications requiring the output light 4 which includes a strong yellow-green light component and a strong near-infrared component, and in which light components are well-separated with a boundary around 650 nm.

Table 6 summarizes the characteristics of the output light 4 of Examples 16 to 18. For comparison, Table 6 also shows the characteristics of Reference Example 5 (the white LED without the second wavelength converter 2A).

TABLE 6

| | Example 16 | Example 17 | Example 18 | Reference Example 5 |
|---|---|---|---|---|
| Radiant flux (W) | 8.13 | 7.38 | 6.73 | 10.26 |
| Luminous flux (lm) | 2507.0 | 2046.0 | 1647.0 | 3459.0 |
| Chromaticity coordinate x | 0.39 | 0.39 | 0.39 | 0.35 |
| Chromaticity coordinate y | 0.46 | 0.50 | 0.53 | 0.36 |
| Correlated color temperature (K) | 4301 | 4342 | 4437 | 4991 |
| Ra | 57 | 52 | 47 | 72 |

As can be seen from Table 6, as the thickness of the second wavelength converter 2A increased, that is, from Example 16 to Example 17 and further to Example 18, the radiant flux, luminous flux, and average color rendering index (Ra) showed a tendency to decrease. Meanwhile, the correlated color temperature showed a tendency to gradually increase. Notable are the radiant flux and luminous flux, and in the comparison where the second wavelength converter 2A of the same thickness was used, the radiant flux and luminous flux were larger than those in Examples 13 to 15 by 7% or more. In particular, the luminous flux was larger than that in Examples 13 to 15 by 60% or more. From these pieces of data, the present examples can be said to provide a light emitting device suitable for obtaining output light 4 that combines high output near-infrared light and high luminous flux.

When this output light 4 was used to irradiate a blank surface for confirmation, it was confirmed that the light within a range of roughly φ 30 cm was homogeneous.

Examples 19 to 21

As light emitting devices of Examples 19 to 21, a light emitting device was fabricated by combining a white LED for LED lighting with a second wavelength converter 2A. In the same manner as Examples 4 to 6, the second wavelength converter 2A was placed on the light output surface of the obtained white LED (3000 K, manufactured by CITIZEN ELECTRONICS CO., LTD.), and the spectral distribution, radiant flux, and the like of the output light 4 output by energizing the white LED with a rated current (180 mA) were measured.

Figure 20:
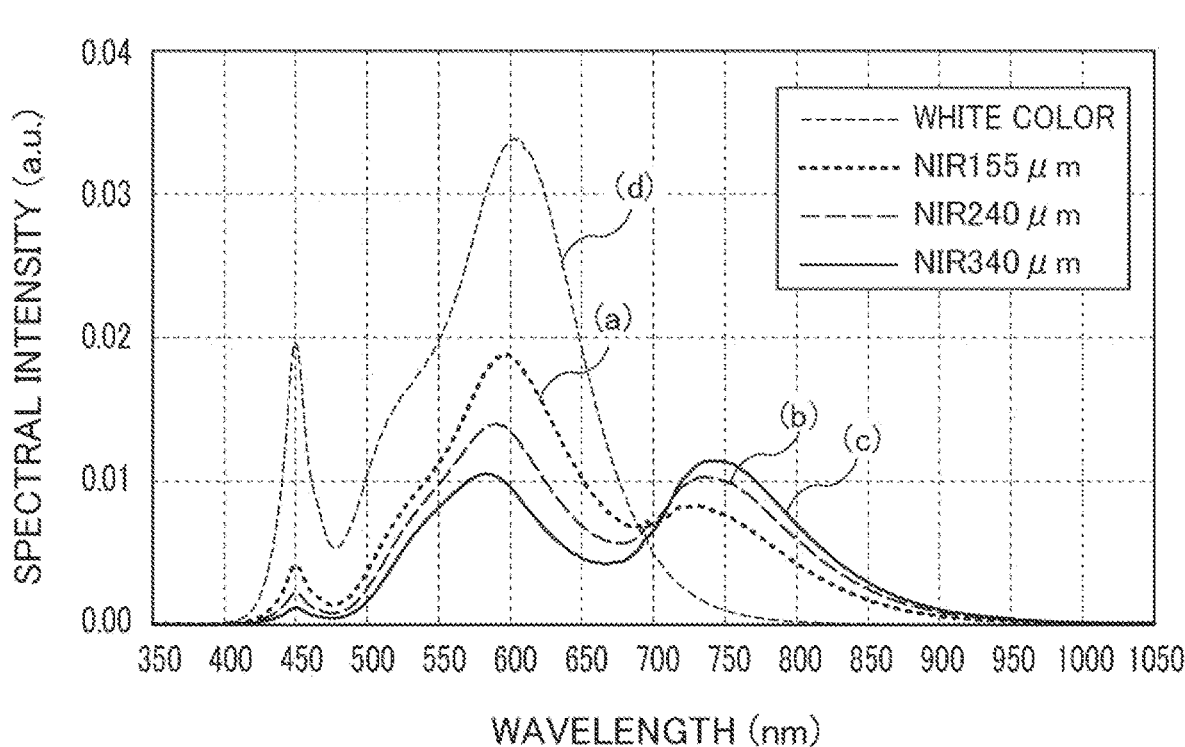
FIG. 20 is an example of a spectral distribution of output light and the like emitted by a light emitting device according to an example.

FIG. 20 collectively shows the spectral distributions of the output light 4 of the light emitting devices of Examples 19 to 21. Note that (a), (b), and (c) in FIG. 20 correspond to the output light 4 of Example 19, Example 20, and Example 21, respectively, and correspond to device configurations using the second wavelength converter 2A with thicknesses of 155 μm, 240 μm, and 340 μm, respectively. Further, (d) in FIG. 20 is the spectral distribution of the output light of the white LED (without the second wavelength converter 2A) shown for reference (Reference Example 6).

As can be seen from (a), (b), and (c) in FIG. 20, the spectral distribution of the output light 4 includes light components in the entire wavelength range of at least 420 nm or more and less than 950 nm. The spectral distribution of the output light 4 is composed mainly of a fluorescent component derived from a blue LED, a fluorescent component derived from a mixture of green and red phosphors, and a fluorescent component derived from a near-infrared phosphor ($Cr^{3+}$ activated garnet phosphor). The fluorescent component derived from a mixture of green and red phosphors is a fluorescent component derived from a mixture of a green phosphor ($Ce^{3+}$ activated garnet phosphor) and a red phosphor ($Eu^{2+}$ activated nitride-based phosphor). The fluorescent component derived from the blue LED had a peak near 450 nm. The fluorescent component derived from the mixture of a green phosphor ($Ce^{3+}$ activated garnet phosphor) and a red phosphor ($Eu^{2+}$ activated nitride-based phosphor) had a peak in the wavelength range of 590 nm±10 nm. The fluorescent component derived from a near-infrared phosphor ($Cr^{3+}$ activated garnet phosphor) had a peak near 730 nm.

Therefore, attention was given to the spectral intensities of the light components at wavelengths of 450 nm, 590 nm, and 730 nm. In the white LED without the second wavelength converter 2A, the fluorescent component with the largest spectral intensity (height) was the spectral intensity at 590 nm derived from both green and red phosphors. The spectral intensity at 450 nm derived from the blue LED showed spectral intensities (heights) that followed thereafter.

In Examples 19 to 21 ((a) to (c) in FIG. 20) combined with the second wavelength converter 2A of different thicknesses, the spectral intensities at 450 nm and 590 nm, especially at 450 nm, decreased significantly as the thickness of the second wavelength converter 2A increased. Meanwhile, as the thickness of the second wavelength converter 2A increased, the spectral intensity at 730 nm increased and had a minimum value in the wavelength range of 600 nm or more and less than 700 nm.

In Examples 19 to 21, the spectral intensity at 730 nm is larger than the spectral intensity at 450 nm, regardless of the thickness. Further, the spectral intensity at 730 nm is smaller than the spectral intensity at 590 nm in Example 19 and Example 20, but larger than the spectral intensity in Example 21, and became the strongest spectral intensity among the spectral intensities.

The spectral intensity at 450 nm relative to the spectral intensity at 730 nm was less than 55% in Example 19, less than 25% in Example 20, and less than 15% in Example 21, for example.

From the above, the present examples can be said to provide a light emitting device suitable for applications requiring output light 4 having a strong yellow-orange light component and a strong near-infrared component.

Table 7 summarizes the characteristics of the output light 4 of Examples 19 to 21. For comparison, Table 7 also shows the characteristics of Reference Example 6 (the white LED without the second wavelength converter 2A).

TABLE 7

| | Example 19 | Example 20 | Example 21 | Reference Example 6 |
|---|---|---|---|---|
| Radiant flux (W) | 3.40 | 3.06 | 2.74 | 4.98 |
| Luminous flux (lm) | 881.4 | 689.1 | 530.1 | 1622.0 |

TABLE 7-continued

| | Example 19 | Example 20 | Example 21 | Reference Example 6 |
|---|---|---|---|---|
| Chromaticity coordinate x | 0.47 | 0.47 | 0.47 | 0.44 |
| Chromaticity coordinate y | 0.44 | 0.46 | 0.48 | 0.40 |
| Correlated color temperature (K) | 2745 | 2946 | 3117 | 2966 |
| Ra | 73 | 67 | 63 | 82 |

As can be seen from Table 7, as the thickness of the second wavelength converter 2A increased, that is, from Example 19 to Example 20 and further to Example 21, the radiant flux, luminous flux, and average color rendering index (Ra) showed a tendency to decrease. Meanwhile, the correlated color temperature showed a tendency to increase gradually.

When this output light 4 was used to irradiate a blank surface for confirmation, it was confirmed that the light within a range of roughly ⌀ 30 cm was homogeneous.

The spectral distribution of the white LED changes depending on the color tone (the fluorescence peak wavelength) of the fluorescence emitted by the LED or phosphor used, or the light absorption rate of the first wavelength converter 1A having the phosphor. The light absorption rate of the first wavelength converter 1A also changes depending on the volume fraction of the phosphor in the first wavelength converter 1A and the thickness of the first wavelength converter 1A. Further, the light absorption rate of the first wavelength converter 1A also changes depending on the activation amount of fluorescent ions (light emission centers) of the phosphor used, the composition of the compound serving as a matrix, or the particle size (central particle size $D_{50}$).

For this reason, in addition to the white LED used in the present examples, products that emit white light of a wide variety of color tones are commercially available, and therefore those skilled in the art can easily obtain them. That is, it is easy to design the desired illumination light, and it is easy to provide illumination light according to the application. For this reason, the correlated color temperature and color rendering properties of the output light are not limited to the present examples, and a light emitting device of the present embodiment that emits illumination light other than that in the present examples can be implemented.

Further, in the present examples, a description has been given regarding the case where a resin phosphor film having the GLGG phosphor is used as the second wavelength converter 2A, but those skilled in the art can readily conceive using an inorganic sealed phosphor film or a fluorescent ceramic instead of the resin phosphor film to increase the output.

To manufacture a fluorescent ceramic, it is sufficient to apply manufacturing technologies for translucent YAG fluorescent ceramics or translucent alumina light-emitting tubes, for example. Therefore, even if there is no manufacturing technology therefor, a product can be obtained although with a difference in quality by requesting a manufacturer with manufacturing technology for translucent YAG fluorescent ceramics or the like to make a prototype.

Although the contents of this embodiment have been described above in accordance with the examples, it is obvious to those skilled in the art that this embodiment is not limited to the descriptions thereof and that various modifications and improvements are possible.

The entire contents of Japanese Patent Application No. 2021-027328 (filed on: Feb. 24, 2021) are incorporated herein by reference.

The present embodiment has been described above, but the present embodiment is not limited to the above description, and various variations are possible within the scope of the gist of the present embodiment.

INDUSTRIAL APPLICABILITY

According to the present disclosure, it is possible to provide a light emitting device that emits both near-infrared and visible light components, is suitable for industrial applications where consideration can be given to visibility according to the human eye, and achieves both the high output of near-infrared light components and a large area of a light output surface, and to also provide an electronic apparatus using the light emitting device.

REFERENCE SIGNS LIST

1 First phosphor
1A First wavelength converter
1B First wavelength-converted light
$1BT_2$ Transmitted first wavelength-converted light
2 Second phosphor
2A Second wavelength converter
2B Second wavelength-converted light
3 Solid-state light emitting element
3B Primary light
3BT; First transmitted primary light
$3BT_2$ Second transmitted primary light
4 Output light
5 First light component
6 Second light component
7 Third light component
10, 10A. 10B, 10C Light emitting device
14 First mixed light
24 Second mixed light
117A First detector
117B Second detector
200, 200D, 200E, 200F, 200G, 200H, 200I Electronic apparatus

The invention claimed is:

1. A light emitting device comprising: a solid-state light emitting element; a first wavelength converter including a first phosphor; and a second wavelength converter including a second phosphor, and emitting output light, wherein the first wavelength converter is interposed between the solid-state light emitting element and the second wavelength converter, wherein the solid-state light emitting element emits primary light having a maximum intensity within a wavelength range of 440 nm or more and less than 480 nm, wherein the first wavelength converter absorbs at least part of the primary light and converts this part of the primary light to first wavelength-converted light having a fluorescence peak in a visible wavelength range of 380 nm or more and less than 780 nm, wherein the second wavelength converter absorbs at least part of first mixed light including first transmitted primary light, which is the primary light that has passed through the first wavelength converter, and the first wavelength-converted light, and converts the first mixed light to second wavelength-converted light having a fluorescence peak in a wavelength region exceeding 750 nm and having a near-infrared component in a wavelength range of 780 nm or more and less than 2500 nm, wherein the first mixed light is light of a light color with a correlated color temperature of 2500 K or more and less than 40,000 K, and wherein the output light includes at least transmitted first wavelength-converted light, which is a light component obtained by the first wavelength-converted light having passed through the second wavelength converter, and a light component of the second wavelength-converted light.

2. The light emitting device according to claim 1, wherein the solid-state light emitting element and the first wavelength converter are combined to form a wavelength-conversion light emitting element.

3. The light emitting device according to claim 1, wherein the output light is light of a light color with a correlated color temperature of 2600 K or more and less than 12000 K.

4. The light emitting device according to claim 1, further comprising:

a control mechanism for controlling an output ratio of the light component of the second wavelength-converted light.

5. The light emitting device according to claim 1, which alternately outputs output light including the light component of the second wavelength-converted light and output light not including the light component of the second wavelength-converted light.

6. The light emitting device according to claim 1, wherein the first wavelength converter includes a red phosphor that emits light having a fluorescence peak in a red wavelength region of 600 nm or more and less than 660 nm.

7. The light emitting device according to claim 1, wherein the first phosphor included in the first wavelength converter is only a phosphor activated with $Ce^{3+}$.

8. The light emitting device according to claim 1, wherein at least the second wavelength converter has a characteristic of allowing at least the second wavelength-converted light to pass therethrough.

9. The light emitting device according to claim 1, wherein the second phosphor contains $Cr^{3+}$ as a fluorescent ion.

10. The light emitting device according to claim 1, which is a light source for a sensing system or a lighting system for a sensing system.

11. An electronic apparatus comprising the light emitting device according to claim 1.

12. The light emitting device according to claim 1, wherein the primary light does not irradiate the second wavelength converter without passing through the first wavelength converter.

13. The light emitting device according to claim 1, wherein the first transmitted primary light has a special distribution derived from the primary light and a lower light intensity than the primary light.

14. The light emitting device according to claim 1, wherein the second wavelength converter is not directly irradiated with the primary light.

15. The light emitting device according to claim 1, wherein the first mixed light has a larger irradiation area than the primary light.

16. The light emitting device according to claim 1, wherein the second phosphor is not directly excited by the primary light.

17. The light emitting device according to claim 1, wherein an intensity of the second wavelength-converted light starts at a wavelength of 850 nm and decreases as the wavelength becomes longer, and wherein a fluorescence intensity at a wavelength of 1000 nm is less than 10% of the fluorescence intensity at a wavelength of 850 nm.

* * * * *